United States Patent
Maekawa et al.

(10) Patent No.: US 9,984,934 B2
(45) Date of Patent: *May 29, 2018

(54) METHOD OF MANUFACTURING A SEMICONDUCTOR DEVICE WITH WIDER SIDEWALL SPACER FOR A HIGH VOLTAGE MISFET

(71) Applicant: Renesas Electronics Corporation, Tokyo (JP)

(72) Inventors: Koji Maekawa, Tokyo (JP); Tatsuyoshi Mihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/473,699

(22) Filed: Mar. 30, 2017

(65) Prior Publication Data

US 2017/0207128 A1 Jul. 20, 2017

Related U.S. Application Data

(63) Continuation of application No. 15/089,932, filed on Apr. 4, 2016, now Pat. No. 9,640,440, which is a (Continued)

(30) Foreign Application Priority Data

Oct. 5, 2012 (JP) ................................ 2012-223643

(51) Int. Cl.
*H01L 21/8234* (2006.01)
*H01L 21/311* (2006.01)
(Continued)

(52) U.S. Cl.
CPC .... *H01L 21/823468* (2013.01); *H01L 21/266* (2013.01); *H01L 21/31116* (2013.01);
(Continued)

(58) Field of Classification Search
CPC ....... H01L 21/823468; H01L 21/31116; H01L 21/823462; H01L 21/266; H01L 29/36; H01L 29/0615; H01L 29/66553

See application file for complete search history.

(56) References Cited

U.S. PATENT DOCUMENTS 5,882,973 A * 3/1999 Gardner .......... H01L 21/823468
257/E21.626
6,316,304 B1 * 11/2001 Pradeep .......... H01L 21/823468
257/371

(Continued)

FOREIGN PATENT DOCUMENTS

| JP | 06-181293 | 6/1994 |
|---|---|---|
| JP | 2001-093984 | 4/2001 |
| JP | 2006-203225 | 8/2006 |

*Primary Examiner* — Benjamin Sandvik
*Assistant Examiner* — Farid Khan
(74) *Attorney, Agent, or Firm* — Young & Thompson

(57) ABSTRACT

An insulating film and another insulating film are formed over a semiconductor substrate in that order to cover first, second, and third gate electrodes. The another insulating film is etched back to form sidewall spacers over side surfaces of the insulating film. Then, the sidewall spacers over the side surfaces of the insulating films corresponding to the sidewalls of the first and second gate electrodes are removed to leave the sidewall spacers over the side surfaces of the insulating film corresponding to the sidewalls of the third gate electrode. Then, the sidewall spacers and the insulating films are etched back, so that the sidewall spacers are formed of the insulating film over the sidewalls of the first, second, and third gate electrodes.

11 Claims, 40 Drawing Sheets

Related U.S. Application Data continuation of application No. 14/560,437, filed on Dec. 4, 2014, now Pat. No. 9,368,598, which is a continuation of application No. 14/011,109, filed on Aug. 27, 2013, now Pat. No. 8,906,769.

(51) Int. Cl.
    *H01L 29/66*     (2006.01)
    *H01L 21/266*     (2006.01)
    *H01L 29/06*     (2006.01)
    *H01L 29/36*     (2006.01)

(52) U.S. Cl.
CPC .. *H01L 21/823462* (2013.01); *H01L 29/0615* (2013.01); *H01L 29/36* (2013.01); *H01L 29/66553* (2013.01)

(56) References Cited

U.S. PATENT DOCUMENTS

| | | | |
|---|---|---|---|
| 6,569,742 B1 * | 5/2003 | Taniguchi | H01L 21/823418 |
| | | | 257/E21.619 |
| 7,754,573 B2 * | 7/2010 | Kim | H01L 29/6653 |
| | | | 257/E21.626 |
| 2012/0202326 A1 * | 8/2012 | Kronholz | H01L 21/31111 |
| | | | 438/231 |
| 2013/0037866 A1 * | 2/2013 | Thees | H01L 21/823468 |
| | | | 257/288 |
| 2013/0037899 A1 | 2/2013 | Popp et al. | |

* cited by examiner

METHOD OF MANUFACTURING A SEMICONDUCTOR DEVICE WITH WIDER SIDEWALL SPACER FOR A HIGH VOLTAGE MISFET

BACKGROUND

The present invention relates to manufacturing methods of semiconductor devices, and more specifically, to a technique that can be suitably applied to a manufacturing method of a semiconductor device including a metal-insulator-semiconductor field-effect transistor (MISFET).

A MISFET can be formed by depositing a gate insulating film over a semiconductor substrate, forming a gate electrode over the gate insulating film, forming low-concentration regions for source and drain by ion implantation, and forming high-concentration regions for the source and drain by ion implantation after forming sidewall spacers on sidewalls of the gate electrode.

Japanese Unexamined Patent Publication No. Hei 06 (1994)-181293 (Patent Document 1) discloses a technique for making an offset length of a source/drain of a transistor for high voltage longer than that of a source/drain of a normal transistor by increasing the width of a sidewall insulating film of the high-voltage transistor as compared to that of a sidewall insulating film of the normal transistor.

Japanese Unexamined Patent Publication No. 2006-203225 (Patent Document 2) discloses a technique for forming a metal silicide layer in a high-concentration region self-aligned with a gate sidewall layer in a MISFET for the high-speed operation, and also for forming another metal silicide layer in another high-concentration region in contact with a LDD portion having a larger width than that of the gate sidewall layer in another MISFET for the high-voltage drive.

Japanese Unexamined Patent Publication No. 2001-93984 (Patent Document 3) discloses a technique for forming a sidewall 123 and another thicker sidewall 113.

RELATED ART DOCUMENTS

Patent Documents

[Patent Document 1]
Japanese Unexamined Patent Publication No. Hei 06 (1994)-181293
[Patent Document 2]
Japanese Unexamined Patent Publication No. 2006-203225
[Patent Document 3]
Japanese Unexamined Patent Publication No. 2001-93984

SUMMARY

A technique is proposed which forms a MISFET by forming a sidewall spacer as a sidewall insulating film over each sidewall of a gate electrode. Such a semiconductor device, however, is still required to improve its performance as much as possible, or to improve the reliability. Alternatively, the semiconductor device is required to achieve both features.

Other problems and new features of the present invention will be better understood after a reading of the following detailed description in connection with the accompanying drawings.

According to one embodiment of the invention, a first insulating film and a second insulating film made of a different material from that of the first insulating film are formed over a semiconductor substrate in that order to cover first and second gate electrodes. The second insulating film is etched back to form a first sidewall insulating film over a first side surface of the first insulating film corresponding to the sidewall of the first gate electrode, and to form a second sidewall insulating film over a second side surface of the second insulating film corresponding to the sidewall of the second gate electrode. Then, the first sidewall insulating film is removed to leave the second sidewall insulating film. The second sidewall insulating film and the first insulating film are etched back to form a third sidewall insulating film made of the first insulating film over the sidewall of the first gate electrode, and to form a fourth sidewall insulating film made of the first insulating film over the sidewall of the second gate electrode. The width of the third sidewall insulating film is smaller than that of the fourth sidewall insulating film.

According to one embodiment of the invention, the semiconductor device can improve its performance, or reliability. Alternatively, the semiconductor device can achieve both features.

DETAILED DESCRIPTION

Figure 1:
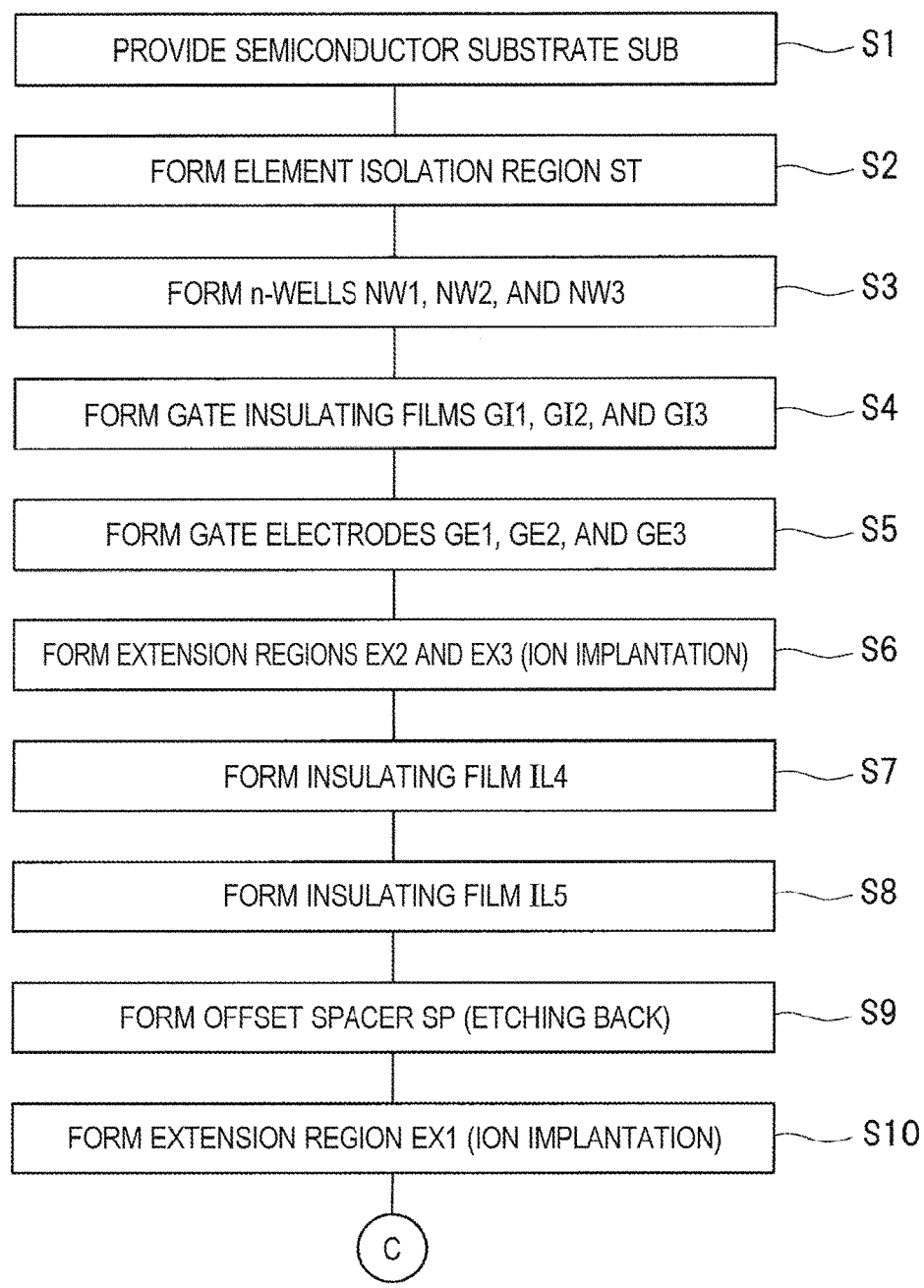
FIG. 1 is a flowchart showing manufacturing steps of a semiconductor device according to one embodiment of the invention.

The following preferred embodiments of the invention may be described below by being divided into a plurality of sections or embodiments for convenience, if necessary, which are not independent from each other unless otherwise specified. One of the sections or embodiments may be a modified example, a detailed description, or supplementary explanation of a part or all of the other. Even when referring to a specific number regarding an element and the like (including the number of elements, a numerical value, an amount, a range, and the like) in the following embodiments, the invention is not limited to the specific number, and may take the number greater than, or less than the specific number, unless otherwise specified, and except when limited to the specific number in principle. The components (including elements or steps) in the following embodiments are not necessarily essential unless otherwise specified, and except when clearly considered to be essential in principle. Likewise, when referring to the shape of one component, or the positional relationship between the components in the following embodiments, any shape or positional relationship substantially similar or approximate to that described herein may be included in the invention unless otherwise specified and except when clearly considered not to be so in principle. The same goes for the above numerical value, and the range.

Now, the preferred embodiments of the invention will be described in detail below with reference to the accompanying drawings. In each drawing for explaining the embodiments, the same or like parts having the same function are indicated by the same or similar reference characters, and its description will not be repeated in principle. In the embodiments below, the description of the same or like parts will not be repeated in principle if not necessary.

In the accompanying drawings used in the embodiments, even some cross-sectional views may omit hatching for easy understanding. On the other hand, even some plan views may be designated by hatching for easy understanding.

First Embodiment

Manufacturing Procedure of Semiconductor Device

Figure 2:
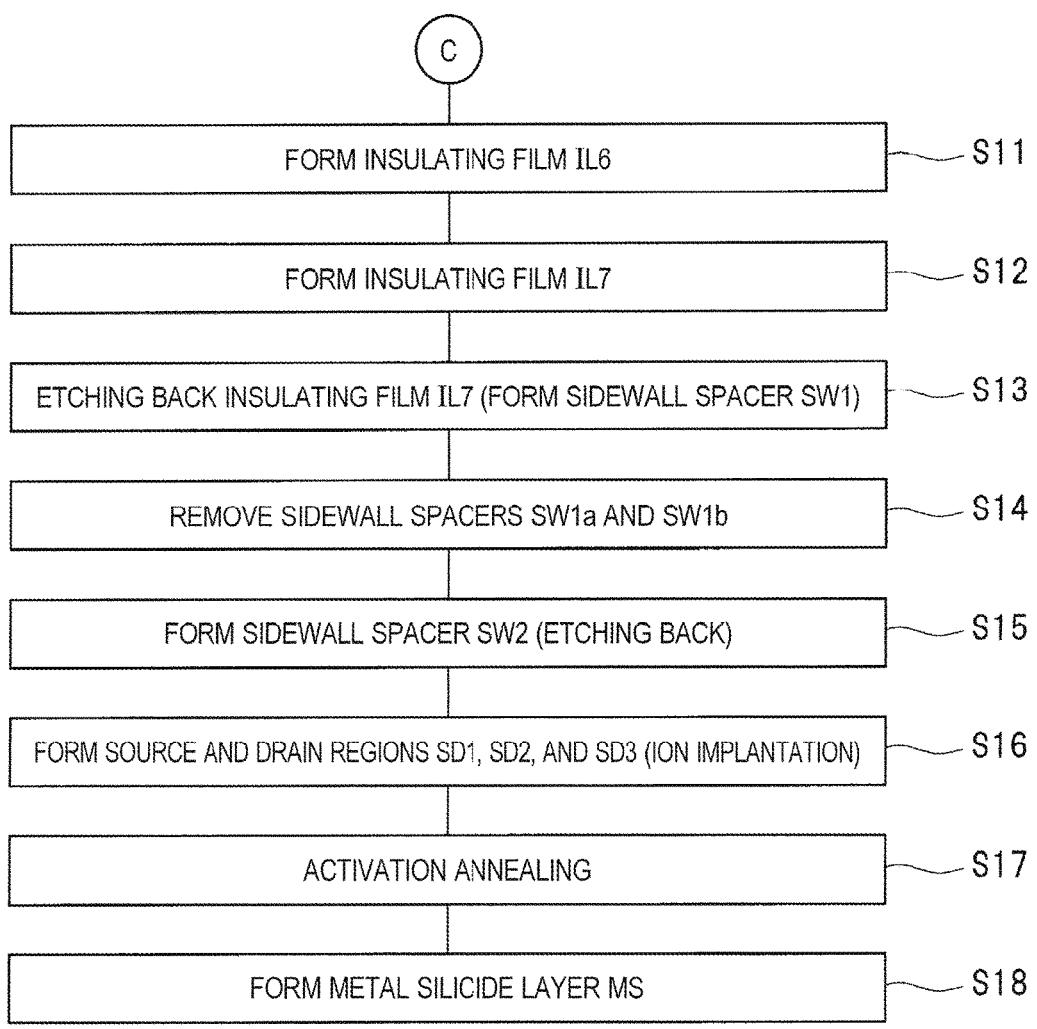
FIG. 2 is another flowchart showing other manufacturing steps of the semiconductor device in the one embodiment.

A manufacturing procedure of a semiconductor device in this embodiment of the invention will be described below with reference to the accompanying drawings. FIGS. 1 and 2 are flowcharts showing manufacturing steps of the semiconductor device in the one embodiment; and FIGS. 3 to 27 are cross-sectional views of main parts of the manufacturing steps of the semiconductor device in this embodiment.

Figure 3:
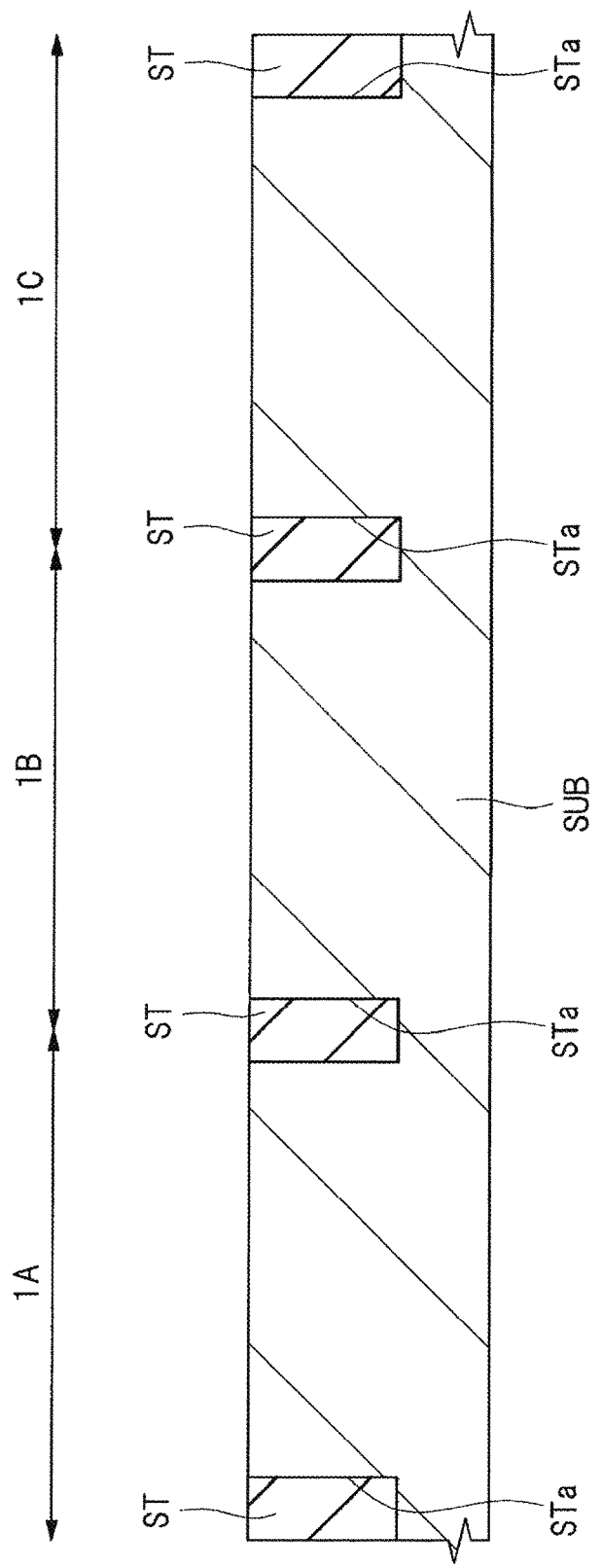
FIG. 3 is a cross-sectional view of a main part of one manufacturing step of the semiconductor device in the one embodiment.

As shown in FIG. 3, first, a semiconductor substrate (semiconductor wafer) SUB is provided which is made of p-type monocrystal silicon and has a specific resistance of about 1 to 10 Ωcm (in step S1 shown in FIG. 1).

The semiconductor substrate SUB includes a low breakdown voltage MISFET formation region 1A in which a MISFETQ1 having a low breakdown voltage is formed, an intermediate breakdown voltage MISFET formation region 1B in which a MISFETQ2 having an intermediate breakdown voltage is formed, and a high breakdown voltage MISFET formation region 1C in which a MISFETQ3 having a high breakdown voltage is formed. For easy understanding, as shown in FIG. 3, the low breakdown voltage MISFET formation region 1A, the intermediate breakdown voltage MISFET formation region 1B, and the high intermediate breakdown voltage MISFET formation region 1C are adjacent to each other. The positional relationship among the low breakdown voltage MISFET formation region 1A, the intermediate breakdown voltage MISFET formation region 1B, and the high breakdown voltage MISFET formation region 1C (actual positional relationship) in the semiconductor substrate SUB can be changed if necessary.

The operation voltage of the high breakdown voltage MISFETQ3 is higher than that of the intermediate breakdown voltage MISFETQ2. The operation voltage of the intermediate breakdown voltage MISFETQ2 is higher than that of the low breakdown voltage MISFETQ1. In other words, the high breakdown voltage MISFETQ3 is a MISFET that operates at a first power supply voltage. The intermediate breakdown voltage MISFETQ2 is a MISFET that operates at a second power supply voltage lower than the first power supply voltage. The low breakdown voltage MISFETQ1 is a MISFET that operates at a third power supply voltage lower than the second power supply voltage. The first power supply voltage at which the high breakdown voltage MISFETQ3 is operated is, for example, about 5V. The second power supply voltage at which the intermediate breakdown voltage MISFETQ2 is operated is, for example, about 3V. The third power supply voltage at which the low breakdown voltage MISFETQ3 is operated is, for example, about 1V. As will be described later, the thickness of a gate insulating film of the high breakdown voltage MISFETQ3 is more than that of a gate insulating film of the intermediate breakdown voltage MISFETQ2, and the thickness of the gate insulating film of the intermediate breakdown voltage MISFETQ2 is more than that of a gate insulating film of the low breakdown voltage MISFETQ1.

Then, element isolation regions ST are formed of an insulator (specifically, an insulator embedded in a trench) in the main surface of the semiconductor substrate SUB, for example, by shallow trench isolation (STI) method (in step S2 shown in FIG. 1).

Specifically, element isolation trenches (trench) STa are formed in the main surface of the semiconductor substrate SUB by etching or the like. Then, an insulating film is formed of silicon oxide (for example, ozone tetraethoxysilane (TEOS) oxide film) or the like over the semiconductor substrate SUB to fill the element isolation trench STa. The insulating film is polished by chemical mechanical polishing (CMP) or the like to remove unnecessary parts of the insulating film located outside the element isolation trenches STa, while maintaining the other part of the insulating film located inside each trench STa. In this way, each element isolation region ST can be formed of the insulating film (insulator) filling the element isolation trench STa.

An active region of the semiconductor substrate SUB is defined by the element isolation regions ST. A metal insulator semiconductor field effect transistor (MISFET) Q1 is formed in the active region defined by the element isolation regions ST in the low breakdown voltage MISFET formation region 1A as will be described later. The MISFET (metal insulator semiconductor field effect transistor) Q2 is formed in the active region defined by the element isolation regions ST in the intermediate breakdown voltage MISFET formation region 1B as will be described later. The MISFET (metal insulator semiconductor field effect transistor) Q3 is formed in the active region defined by the element isolation regions ST in the high breakdown voltage MISFET formation region 1C as will be described later.

Figure 4:
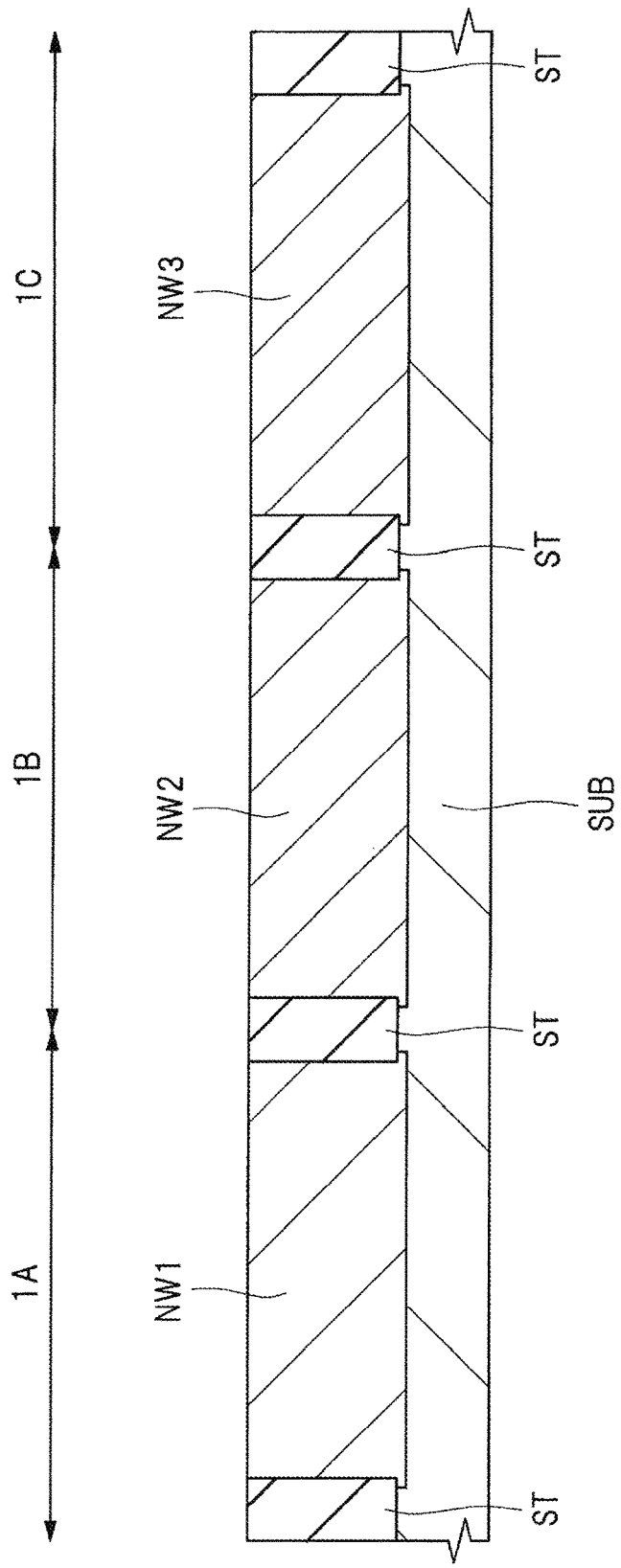
FIG. 4 is a cross-sectional view of a main part of another manufacturing step of the semiconductor device, following the step shown in FIG. 3.

Then, as shown in FIG. 4, n-type wells (n-type semiconductor regions) NW1, NW2, and NW3 are formed in a predetermined depth from the main surface of the semiconductor substrate SUB (in step S3 shown in FIG. 1).

The n-type wells NW1, NW2, and NW3 can be formed by ion-implanting n-type impurities, such as phosphorus (P) or arsenic (As), in the semiconductor substrate SUB. The n-type well NW1 is formed in the low breakdown voltage MISFET formation region 1A, the n-type well NW2 is formed in the intermediate breakdown voltage MISFET formation region 1B, and the n-type well NW3 is formed in the high breakdown voltage MISFET formation region 1C.

The ion implantation for forming the n-type well NW1, the ion implantation for forming the n-type well NW2, and the ion implantation for forming the n-type well NW3 can be performed in the same ion implantation step, which leads to a decrease in number of steps in manufacturing. Alternatively, these ion implantation processes may be performed in different steps.

Then, gate insulating films GI1, GI2, and GI3 are formed over the main surface of the semiconductor substrate SUB (in step S4 shown in FIG. 1). The gate insulating film GI1 is formed over the surface of the semiconductor substrate SUB (that is, the upper surface of the n-type well NW1) in the low breakdown voltage MISFET formation region 1A. The gate insulating film GI2 is formed over the surface of the semiconductor substrate SUB (that is, the upper surface of the n-type well NW2) in the intermediate breakdown voltage MISFET formation region 1B. The gate insulating film GI3 is formed over the surface of the semiconductor substrate SUB (that is, the upper surface of the n-type well NW3) in the high breakdown voltage MISFET formation region 1C.

Figure 5:
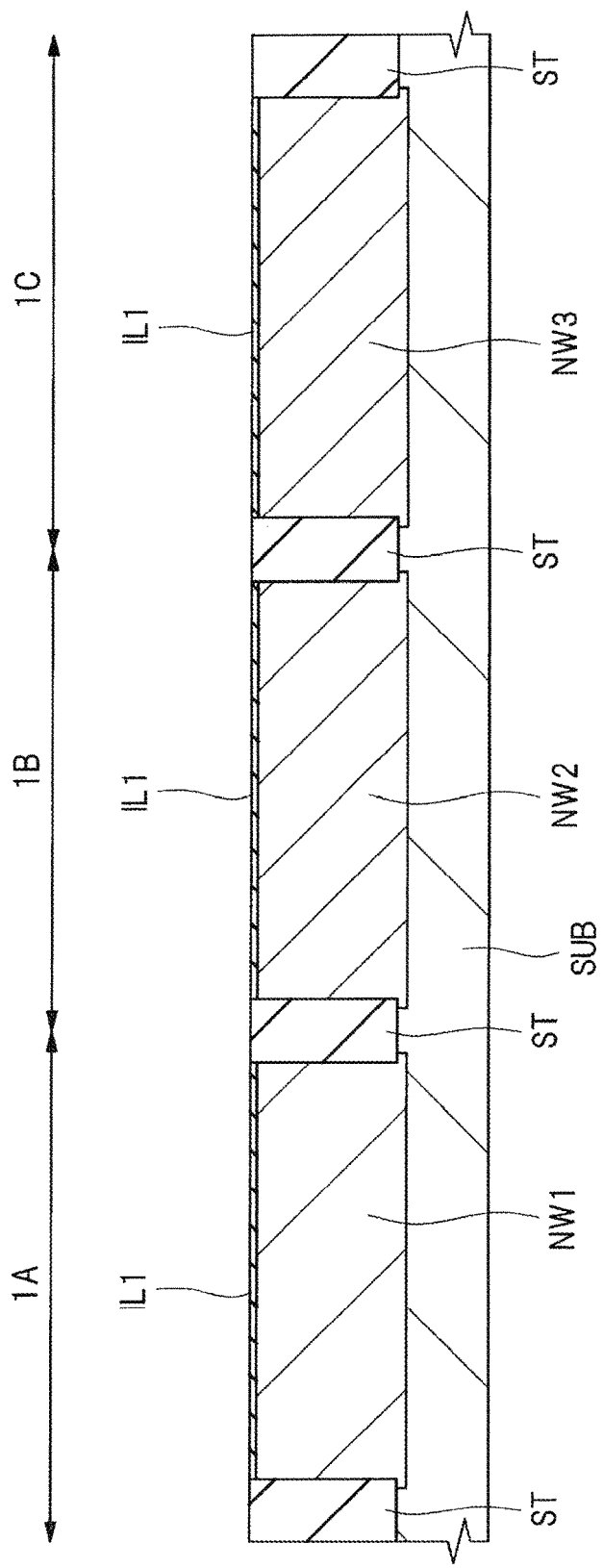
FIG. 5 is a cross-sectional view of a main part of another manufacturing step of the semiconductor device, following the step shown in FIG. 4.
Figure 6:
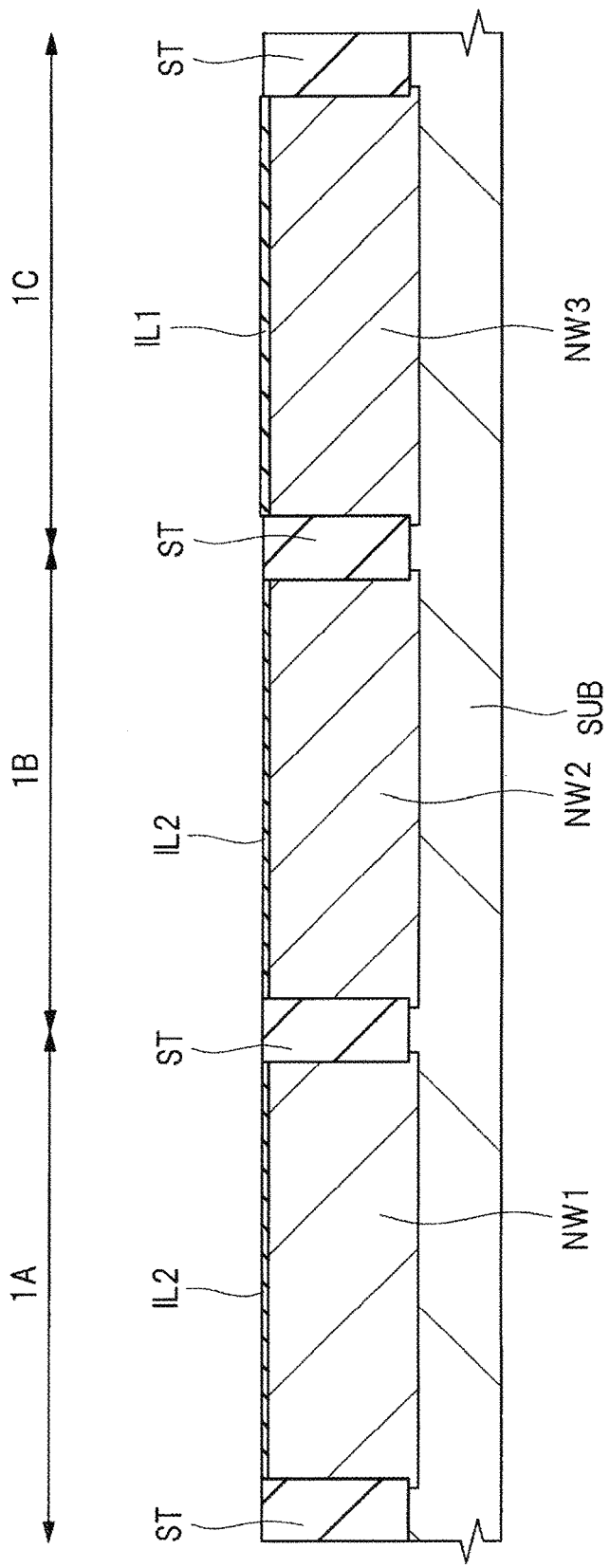
FIG. 6 is a cross-sectional view of a main part of another manufacturing step of the semiconductor device, following the step shown in FIG. 5.
Figure 7:
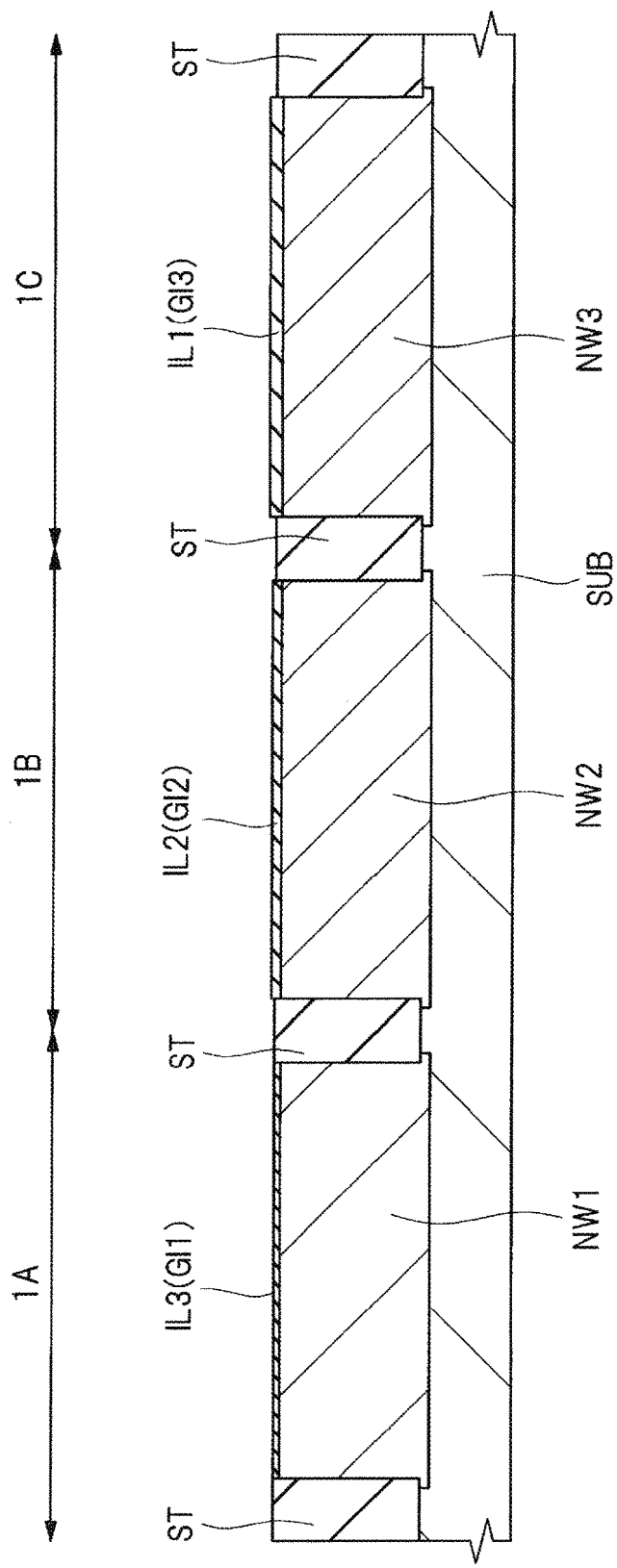
FIG. 7 is a cross-sectional view of a main part of another manufacturing step of the semiconductor device, following the step shown in FIG. 6.

The formation of the gate insulating films GI1, GI2, and GI3 in step S4 can be performed, for example, as follows (see FIGS. 5 to 7).

First, the surface of the semiconductor substrate SUB is cleaned (washed) by wet etching, for example, using hydrofluoric acid (HF) solution. Then, as shown in FIG. 5, an insulating film IL1 is formed of a silicon oxide film or the like over the surface of the semiconductor substrate SUB (including the surfaces of the n-type wells NW1, NW2, and NW3).

The insulating film IL1 is an insulating film for the gate insulating film GI3 of the MISFET to be formed in the high breakdown voltage MISFET formation region 1C. The insulating film IL1 can be formed, for example, by thermal oxidation. Additionally, the insulating film IL1 can also be formed by depositing a CVD film (which is a silicon oxide film formed by the CVD method) over the thermal oxide film formed in the thermal oxidation.

Then, the insulating film IL1 is etched using a photoresist layer (not shown) as an etching mask formed by photolithography to thereby remove the insulating film IL1 in the low breakdown voltage MISFET formation region 1A and the intermediate breakdown voltage MISFET formation region 1B, while leaving the insulating film IL1 in the high breakdown voltage MISFET formation region 1C.

Then, a silicon oxide film is formed over the main surface of the semiconductor substrate SUB by thermal oxidation of the semiconductor substrate SUB. Thus, as shown in FIG. 6, an insulating film IL2 is formed of the silicon oxide film (thermal oxide film) over the semiconductor substrate SUB (that is, over the n-type wells NW1 and NW2) in the low breakdown voltage MISFET region 1A and the intermediate breakdown voltage MISFET formation region 1B. At the same time, the insulating film IL1 in the high breakdown voltage MISFET formation region 1C becomes thicker.

Then, the insulating film IL2 is etched using a photoresist layer (not shown) as an etching mask formed by the photolithography to thereby remove the insulating film IL2 in the low breakdown voltage MISFET formation region 1A while leaving the insulating film IL2 in the intermediate breakdown voltage MISFET formation region 1B and the insulating film IL1 in the high breakdown voltage MISFET formation region 1C.

Then, a silicon oxide film is formed over the main surface of the semiconductor substrate SUB by thermal oxidation of the semiconductor substrate SUB. Thus, as shown in FIG. 7, an insulating film IL3 is formed of a silicon oxide film (thermal oxide film) over the semiconductor substrate SUB (that is, n-type well NW1) in the low breakdown voltage MISFET formation region 1A. At this time, the insulating film IL2 in the intermediate breakdown voltage MISFET formation region 1B and the insulating film IL1 in the high breakdown voltage MISFET formation region 1C are thicker than the insulating film IL3 in the low breakdown voltage MISFET formation region 1A.

The insulating film IL1 in the high breakdown voltage MISFET formation region 1C increases its thickness both at the times of formation of the insulating film IL2 and the insulating film IL3. The insulating film IL2 in the intermediate breakdown voltage MISFET formation region 1B increases its thickness only at the time of formation of the insulating film IL3. Thus, the thickness of the insulating film IL2 formed in the intermediate breakdown voltage MISFET formation region 1B is more than that of the insulating film IL3 formed in the low breakdown voltage MISFET formation region 1A. The thickness of the insulating film IL1 formed in the high breakdown voltage MISFET formation region 1C is more than that of the insulating film IL2 formed in the intermediate breakdown voltage MISFET formation region 1B.

The insulating film IL3 formed in the low breakdown voltage MISFET formation region 1A is a gate insulating film GI1 for the low breakdown voltage MISFETQ1 formed in the low breakdown voltage MISFET formation region 1A. The insulating film IL2 formed in the intermediate breakdown voltage MISFET formation region 1B is a gate insulating film GI2 for the intermediate breakdown voltage MISFETQ2 formed in the intermediate breakdown voltage MISFET formation region 1B. The insulating film IL1 formed in the high breakdown voltage MISFET formation region 1C is a gate insulating film GI3 for the high breakdown voltage MISFETQ3 formed in the high breakdown voltage MISFET formation region 1C.

In this way, the gate insulating films GI1, GI2, and GI3 are formed in the step S4. The gate insulating film GI1 is formed over the surface of the semiconductor substrate SUB in the low breakdown voltage MISFET formation region 1A. The gate insulating film GI2 is formed over the surface of the semiconductor substrate SUB in the intermediate breakdown voltage MISFET formation region 1B. The gate insulating film GI3 is formed over the surface of the semiconductor substrate SUB in the high breakdown voltage MISFET formation region 1C.

The thickness of the gate insulating film GI2 formed in the intermediate breakdown voltage MISFET formation region 1B is more than that of the gate insulating film GI1 formed in the low breakdown voltage MISFET formation region 1A. The thickness of the gate insulating film GI3 formed in the high breakdown voltage MISFET formation region 1C is more than that of the gate insulating film GI2 formed in the intermediate breakdown voltage MISFET formation region 1B. The thicknesses of the gate insulating films GI1, GI2, and GI3 are, for example, as follows. The thickness of the gate insulating film GI1 can be, for example, in a range of about 2 to 3 nm. The thickness of the gate insulating film GI2 can be, for example, in a range of about 5 to 10 nm. The thickness of the gate insulating film GI3 can be, for example, in a range of about 10 to 15 nm.

The thickness of the gate insulating film GI2 formed in the intermediate breakdown voltage MISFET formation region 1B is more than that of the gate insulating film GI1 formed in the low breakdown voltage MISFET formation region 1A. Thus, the breakdown voltage of the MISFETQ2 formed in the intermediate breakdown voltage MISFET formation region 1B is higher than that of the MISFETQ1 formed in the low breakdown voltage MISFET formation region 1A. The thickness of the gate insulating film GI3 formed in the high breakdown voltage MISFET formation region 1C is more than that of the gate insulating film GI2 formed in the intermediate breakdown voltage MISFET formation region 1B. Thus, the breakdown voltage of the MISFETQ3 formed in the high breakdown voltage MISFET formation region 1C is higher than that of the MISFETQ2 formed in the intermediate breakdown voltage MISFET formation region 1B.

Next, the gate electrodes GE1, GE2, and GE3 are formed (in step S5 of FIG. 1). The formation processes of the gate electrodes GE1, GE2, and GE3 in step S5 can be performed, for example, in the following way (see FIGS. 8 and 9).

Figure 8:
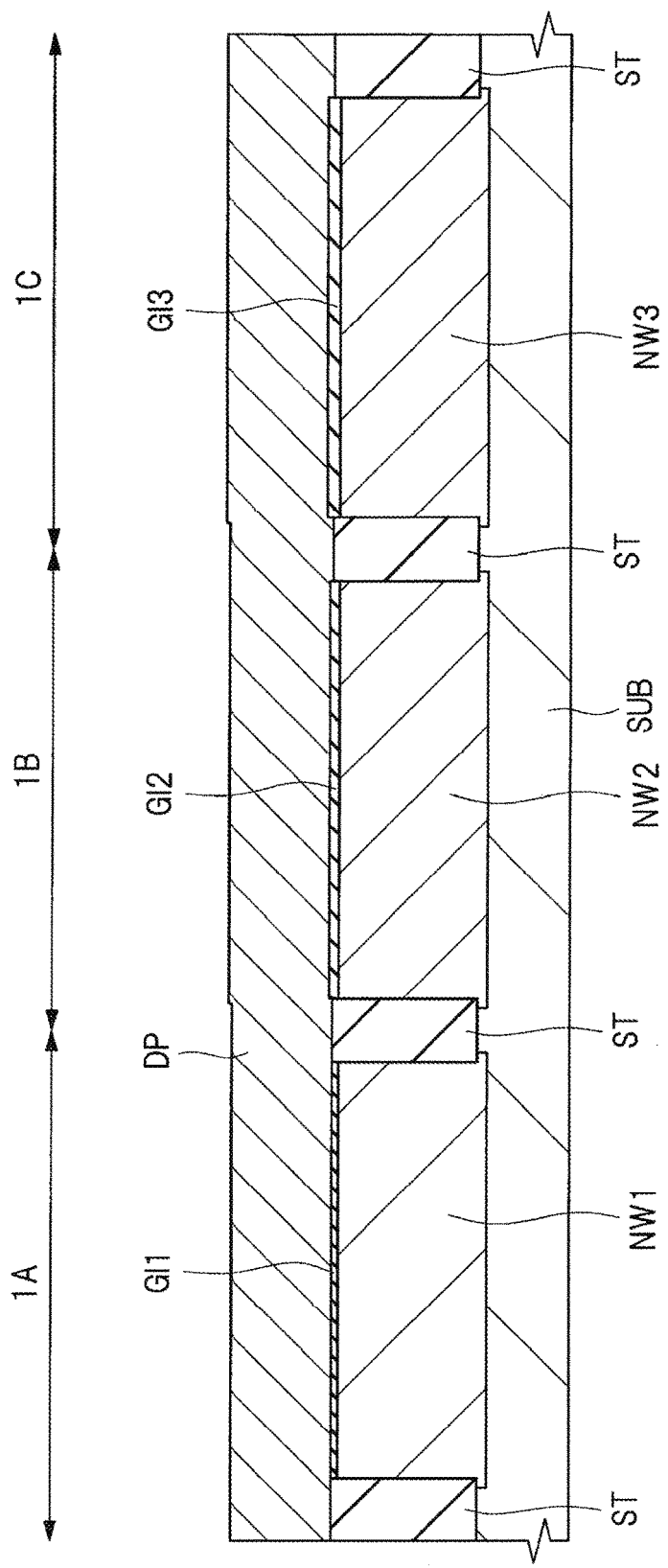
FIG. 8 is a cross-sectional view of a main part of another manufacturing step of the semiconductor device, following the step shown in FIG. 7.

First, as shown in FIG. 8, a conductive material film (conductive film, silicon film), such as a polycrystalline silicon film (doped polysilicon film) DP is formed (deposited) over the entire main surface of the semiconductor substrate SUB (that is, over a region covering the gate insulating films GI1, GI2, and GI3). The polycrystalline silicon film DP becomes a semiconductor film (conductive material film) having a low resistance formed by introducing impurities in or after the deposition. The thickness (deposited thickness) of the polycrystalline silicon film DP can be, for example, about 180 nm. The polycrystalline silicon film DP can be formed by converting an amorphous silicon film in the deposition into the polycrystalline silicon film by heat treatment after the deposition.

Figure 9:
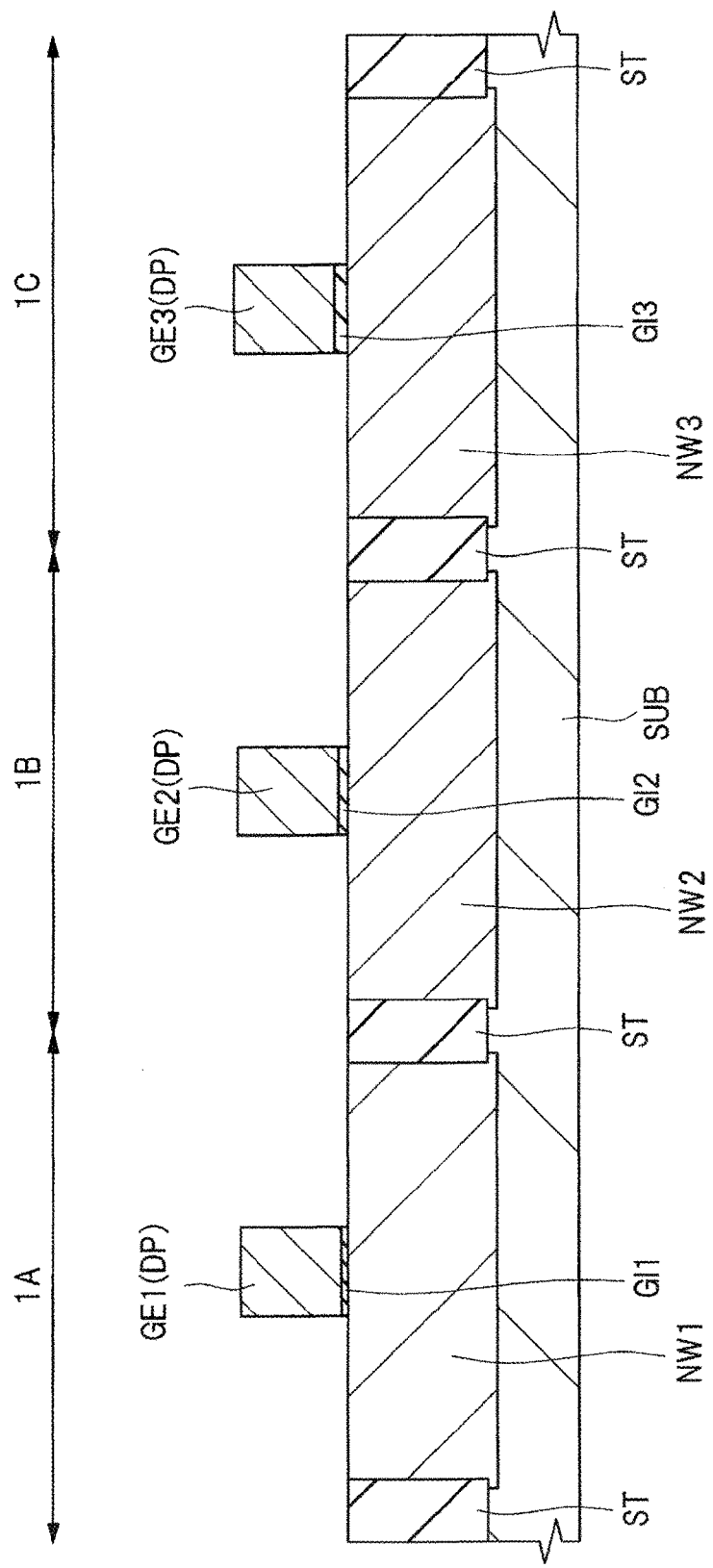
FIG. 9 is a cross-sectional view of a main part of another manufacturing step of the semiconductor device, following the step shown in FIG. 8.

Then, as shown in FIG. 9, the polycrystalline silicon film DP is patterned by the photolithography and dry etching to thereby form the gate electrodes GE1, GE2, and GE3. The gate electrodes GE1, GE2, and GE3 are respectively formed of the patterned polycrystalline silicon film DP.

Among the gate electrodes, the gate electrode GE1 is formed over the semiconductor substrate SUB (that is, n-type well NW1) via the gate insulating film GI1 in the low breakdown voltage MISFET formation region 1A. That is, the gate electrode GE1 is formed over the gate insulating film GI1 on the surface of the semiconductor substrate SUB (n-type well NW1) in the low breakdown voltage MISFET formation region 1A. The gate electrode GE2 is formed over the semiconductor substrate SUB (that is, over the n-type well NW2) via the gate insulating film GI2 in the intermediate breakdown voltage MISFET formation region 1B. That is, the gate electrode GE2 is formed over the gate insulating film GI2 on the semiconductor substrate SUB (over the n-type well NW2) in the intermediate breakdown voltage MISFET formation region 1B. The gate electrode GE3 is formed over the semiconductor substrate SUB (that is, over the n-type well NW3) via the gate insulating film GI3 in the high breakdown voltage MISFET formation region 1C. That is, the gate electrode GE3 is formed over the gate insulating film GI3 on the surface of the semiconductor substrate SUB (n-type well NW3) in the high breakdown voltage MISFET formation region 1C.

In this way, the gate electrodes GE1, GE2, and GE3 are formed in the step S5.

Then, parts of the gate insulating films GI1, GI2, and GI3 not covered with the gate electrodes GE1, GE2, and GE3 can be removed by dry etching for patterning the polycrystalline silicon film DP, or by wet etching after the dry etching.

Although not shown in the figure, the gate electrode for an n-channel MISFET is formed of a patterned polycrystalline silicon film DP in an n-channel MISFET formation region within the low breakdown voltage MISFET formation region 1A.

In this embodiment, the gate electrodes GE1, GE2, and GE3 are formed of a polycrystalline silicon film DP. In other embodiments, the gate electrodes GE1, GE2, and GE3 can be formed of a metal film or metal compound film. In this case, the gate electrodes GE1, GE2, and GE3 are the so-called metal gate electrode.

Figure 10:
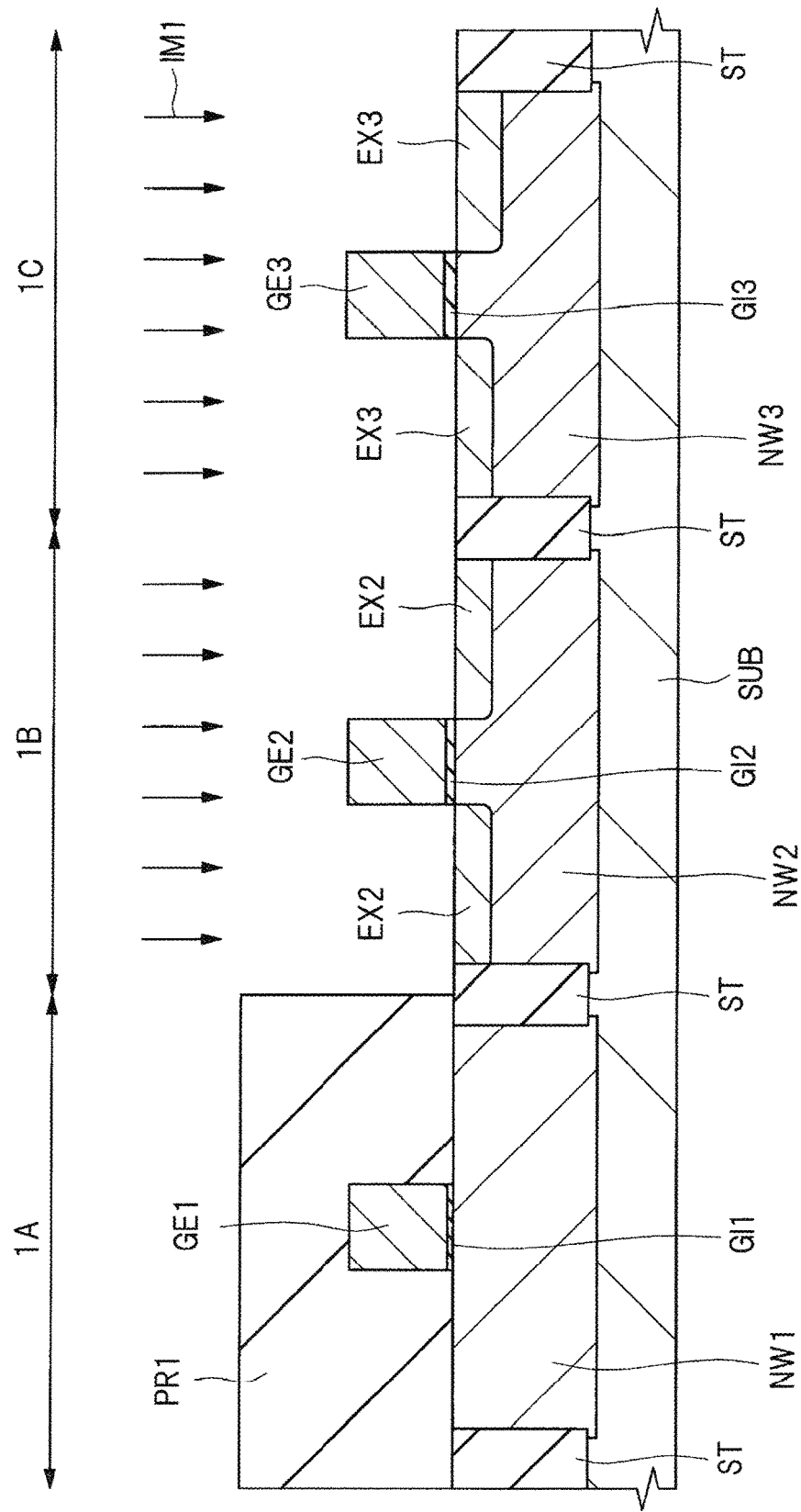
FIG. 10 is a cross-sectional view of a main part of another manufacturing step of the semiconductor device, following the step shown in FIG. 9.

Then, as shown in FIG. 10, p-type impurities are ion-implanted into the semiconductor substrate SUB (n-type wells NW2 and NW3) in the intermediate breakdown voltage MISFET formation region 1B and the high breakdown voltage MISFET formation region 1C to thereby form extension regions (source/drain extension region, p$^-$-type semiconductor region, and p-type impurity diffusion layer) EX2 and EX3 (in step S6 shown in FIG. 1). The ion implantation for forming the extension regions EX2 and EX3 performed in step S6 is hereinafter referred to as "ion implantation IM1". FIG. 10 schematically shows the ion implantation IM1 by the arrow.

In the step S6, a photoresist layer PR 1 is formed over the semiconductor substrate SUB in the low breakdown voltage MISFET formation region 1A so as to cover the low breakdown voltage MISFET formation region 1A and to expose the intermediate breakdown voltage MISFET formation region 1B and the high breakdown voltage MISFET formation region 1C, and then the ion implantation IM1 is performed on the substrate SUB. Thereafter, the photoresist layer PR1 is removed. In the ion implantation IM1, since the low breakdown voltage MISFET formation region 1A is covered with the photoresist layer PR1, the ion implantation is not performed on the semiconductor substrate SUB in the low breakdown voltage MISFET formation region 1A. Thus, in the step S6, the ion implantation IM1 is performed on the semiconductor substrate SUB (n-type wells NW2 and NW3) in the intermediate breakdown voltage MISFET formation region 1B and the high breakdown voltage MISFET formation region 1C.

In the ion implantation IM1 in step S6, the gate electrodes GE2 and GE3 can act as a mask (ion implantation blocking mask) in the intermediate breakdown voltage MISFET formation region 1B and the high breakdown voltage MISFET formation region 1C. Thus, impurities are prevented from being implanted directly under the gate electrodes GE2 and GE3 over the semiconductor substrate SUB (n-type well NW2), in the ion implantation IM1.

That is, in the intermediate breakdown voltage MISFET formation region 1B, the extension region EX2 is formed in regions of the semiconductor substrate SUB (n-type well NW2) located on both sides of the gate electrode GE2 by ion-implanting p-type impurities, such as boron (B). Thus, in the intermediate breakdown voltage MISFET formation region 1B, the extension region EX2 is formed to be aligned (self-aligned) with each sidewall of the gate electrode GE2. In the high breakdown voltage MISFET formation region 1C, the extension region is formed in regions of the semiconductor substrate SUB (n-type well NW3) located on both sides of the gate electrode GE3, by ion-implanting p-type impurities, such as boron (B). Thus, in the high breakdown voltage MISFET formation region 1C, the extension region EX3 is formed to be aligned (self-aligned) with each sidewall of the gate electrode GE3. In the ion implantation IM1, the p-type impurities can be ion-implanted also in the gate electrodes GE2 and GE3 (silicon films forming the electrodes).

The extension region EX2 is a semiconductor region of the same conduction type (p-type in this embodiment) as that of the source and drain regions SD2 to be formed later. However, the extension region EX2 has a lower concentration of impurities than that of the source and drain regions SD2, and a shallower depth (junction depth) than that of the source and drain regions SD2 to be formed later. The extension region EX3 is a semiconductor region of the same conduction type (p-type in this embodiment) as that of the source and drain regions SD3 to be formed later. However, the extension region EX3 has a lower concentration of impurities than that of the source and drain regions SD3, and a shallower depth (junction depth) than that of the source and drain regions SD3 to be formed later.

In this embodiment, the extension region EX2 in the intermediate breakdown voltage MISFET formation region 1B, and the extension region EX3 in the high breakdown voltage MISFET formation region 1C are formed in the same ion implantation step. In another embodiment, the extension region EX2 in the intermediate breakdown voltage MISFET formation region 1B, and the extension region EX3 in the high breakdown voltage MISFET formation region 1C can also be formed in different ion implantation steps.

After the ion implantation IM1, the above photoresist layer PR1 is removed.

Figure 11:
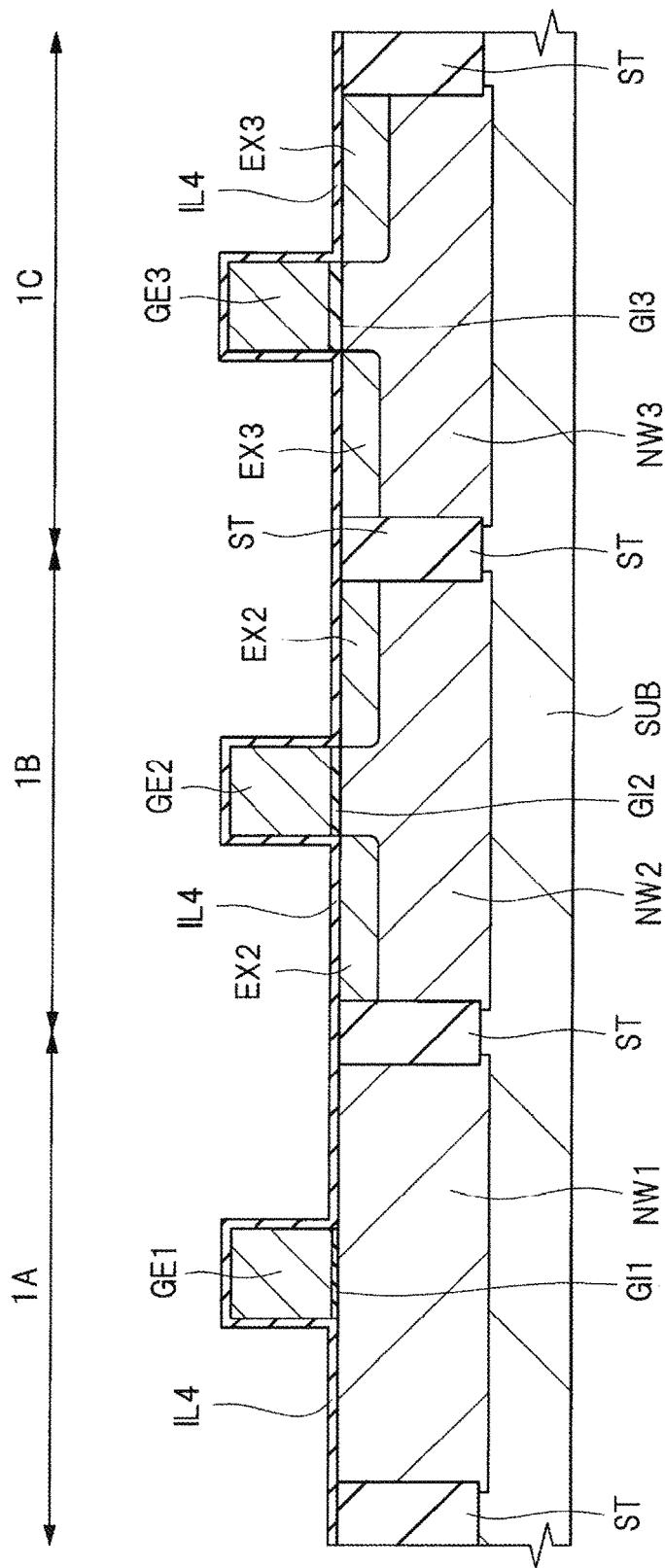
FIG. 11 is a cross-sectional view of a main part of another manufacturing step of the semiconductor device, following the step shown in FIG. 10.

Then, as shown in FIG. 11, an insulating film IL4 is formed over the main surface of the semiconductor substrate SUB to cover the gate electrodes GE1, GE2, and GE3 (in step S7 shown in FIG. 1).

The insulating film IL4 is an insulating film for an offset spacer of the n-channel MISFET having a low breakdown voltage. The insulating film IL4 is formed of, for example, a silicon oxide film, and can have a thickness of, for example, about 3 to 5 nm. The insulating film IL4 is formed over the upper surfaces and sidewalls of the gate electrodes GE1, GE2, and GE3, and parts of the semiconductor substrate SUB not covered by the gate electrodes GE1, GE2, and GE3 (n-type wells NW1, NW2, and NW3). The insulating film IL4 can be formed, for example, by a chemical vapor deposition (CVD) method and the like.

Although not shown in the figure, ion implantation (ion implantation of n-type impurities) for formation of the $n^-$-type extension region is performed in an n-channel MISFET formation region of the low breakdown voltage MISFET formation region 1A. At this time, a photoresist layer (not shown) is formed over the semiconductor substrate SUB to cover p-channel type MISFET formation regions of the low breakdown voltage MISFET formation region 1A, the intermediate breakdown voltage MISFET formation region 1B, and the high breakdown voltage MISFET formation region 1C, while exposing the n-channel MISFET formation region of the low breakdown voltage MISFET formation region 1A. After forming the photoresist layer, ion implantation is performed. Thereafter, the photoresist layer is removed. As a result, in the n-channel MISFET formation region of the low breakdown voltage MISFET formation region 1A, n-type impurities are ion-implanted into regions of the semiconductor substrate SUB (p-type well) on both sides of the gate electrode for the n-channel MISFET to thereby form $n^-$-type extension regions (not shown). At this time, the gate electrode for the n-channel MISFET and the insulating film IL4 over the sidewalls thereof can serve as a mask (ion implantation blocking mask). As a result, in the n-channel type MISFET formation region of the low breakdown voltage MISFET formation region 1A, the $n^-$-type extension region is formed to be aligned (self-aligned) with the side surfaces of the insulating film IL4 over the sidewalls of the gate electrode for the n-channel MISFET.

Figure 12:
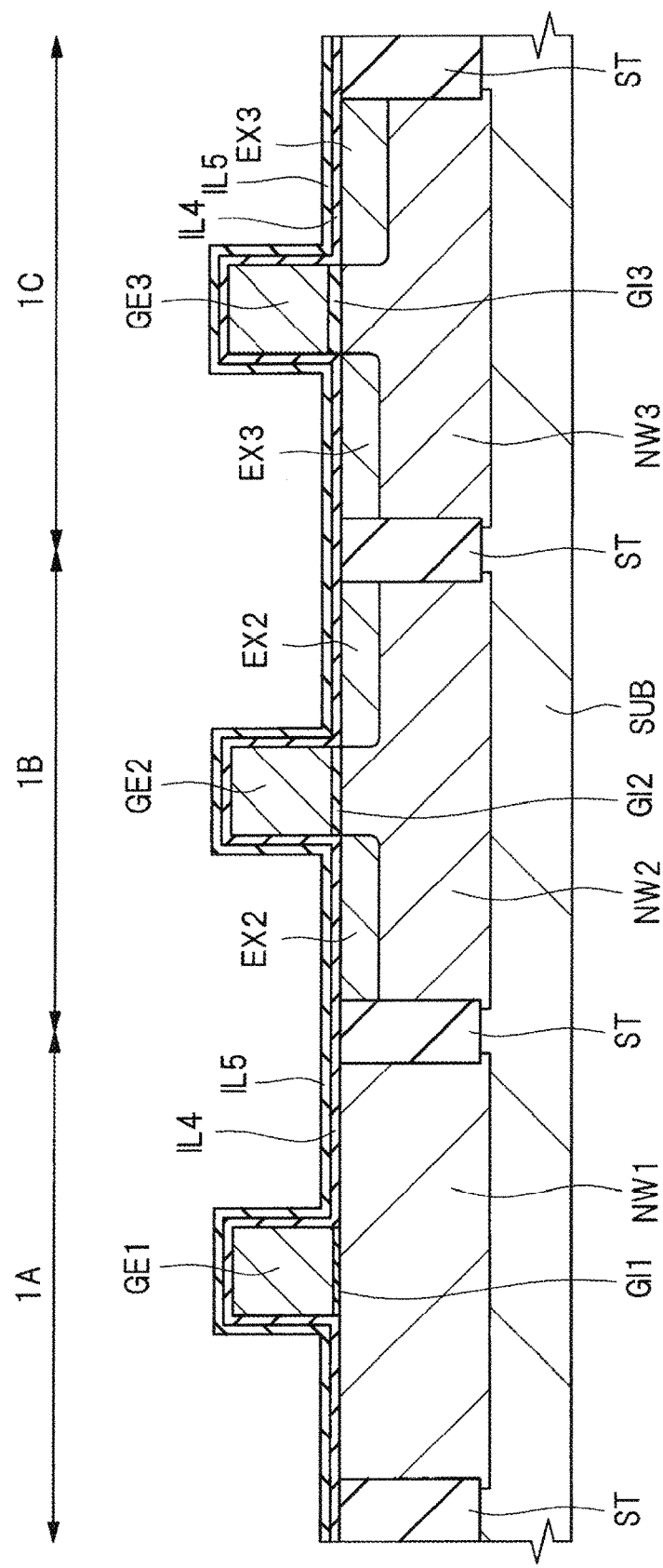
FIG. 12 is a cross-sectional view of a main part of another manufacturing step of the semiconductor device, following the step shown in FIG. 11.

Then, as shown in FIG. 12, an insulating film IL5 is formed over the main surface of the semiconductor substrate SUB, that is, over the insulating film IL4 to cover the gate electrodes GE1, GE2, and GE3 (in step S8 shown in FIG. 1).

The insulating film IL5 is an insulating film for an offset spacer of the p-channel MISFET having a low breakdown voltage. The insulating film IL5 is formed of, for example, a silicon nitride film, and can have a thickness of, for example, about 5 to 10 nm. The insulating film IL5 can be formed, for example, using the CVD method or the like.

Figure 13:
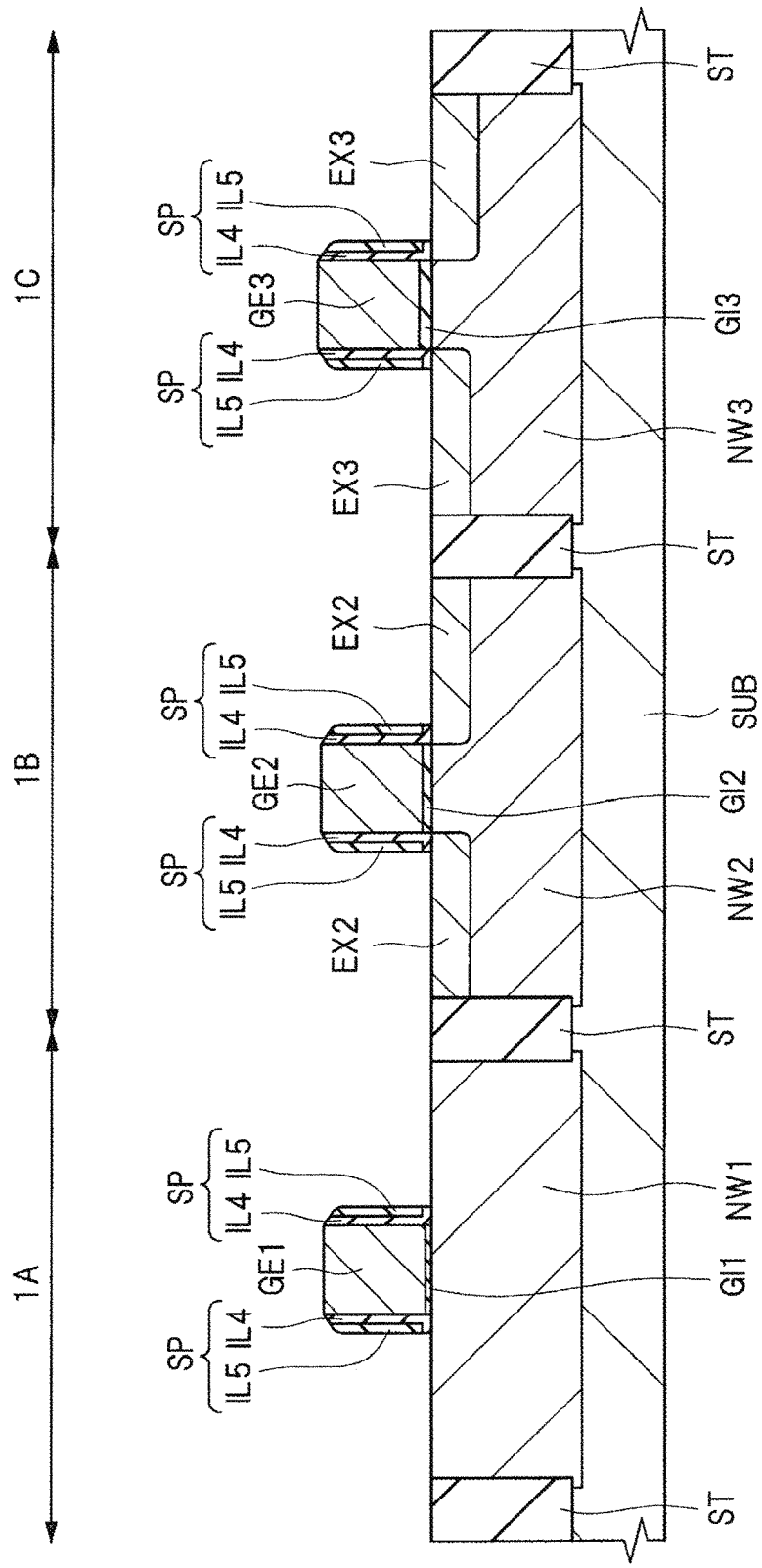
FIG. 13 is a cross-sectional view of a main part of another manufacturing step of the semiconductor device, following the step shown in FIG. 12.

Then, as shown in FIG. 13, the insulating films IL5 and IL4 are etched back (subjected to anisotropic etching) by a reactive ion etching (RIE) or the like to leave the insulating films IL5 and IL4 on the respective sidewalls of the gate electrodes GE1, GE2, and GE3, while removing other regions of the insulating films IL5 and IL4. Thus, offset spacers (sidewall insulating films) SP comprised of the remaining insulating films IL5 and IL 4 are formed over sidewalls of the gate electrodes GE1, GE2, and GE3 (in step S9 shown in FIG. 1).

Referring to FIG. 13, the insulating films IL5 and IL4 are etched back to leave the insulating films IL4 and IL5 over each sidewall of the gate electrode GE, while removing the parts of the insulating films IL5 and IL4 in other regions (over the upper surfaces of the gate electrodes GE1, GE2, and GE3, and over other parts of the semiconductor substrate SUB not covered by the gate electrodes GE1, GE2, and GE3). In this case, the offset spacer SP comprised of a lamination of the insulating films IL4 and IL5 is formed as the sidewall insulating film over each sidewall of the gate electrodes GE1, GE2, and GE3.

Figure 14:
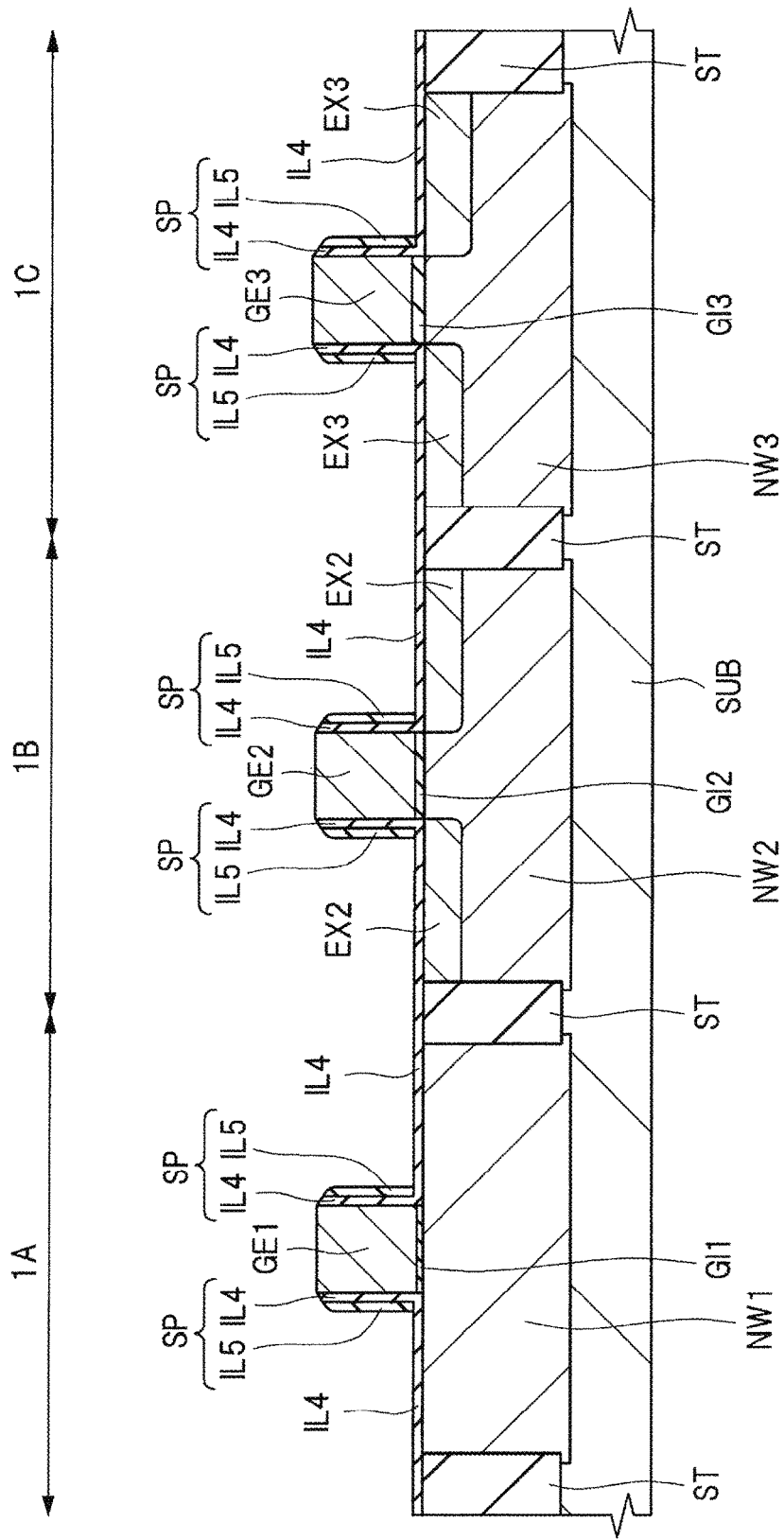
FIG. 14 is a cross-sectional view of a main part of another manufacturing step of the semiconductor device, following the step shown in FIG. 12.

Like FIG. 13, FIG. 14 also shows another cross-sectional view of the stage after step S9. Referring to FIG. 14, the insulating film IL5 located in regions except for the sidewalls of the gate electrodes GE1, GE2, and GE3 is removed in step S9 (that is, the insulating film IL5 located over the upper surfaces of parts of the semiconductor substrate SUB not covered by the gate electrodes GE1, GE2, and GE3 is removed). However, the insulating film IL4 remains in the form of layer over the upper surfaces of the parts of the semiconductor substrate SUB not covered by the gate electrodes GE1, GE2, and GE3. FIG. 13 is the same as FIG. 14 in that the insulating film IL5 located in the regions except for the sidewalls of the gate electrodes GE1, GE2, and GE3 is removed in step S9. However, FIG. 13 differs from FIG. 14 in that one insulating film IL4 remains in the form of layer over the upper surfaces of the parts of the semiconductor substrate SUB not covered by the gate electrodes GE1, GE2, and GE3 (which corresponds to FIG. 14), while the other insulating film IL4 does not remain (which corresponds to FIG. 13). This embodiment allows the case of FIG. 13, and also the case of FIG. 14. Steps after the step S9 in the case of FIG. 13 are basically the same as those in the case of FIG. 14. For this reason, as shown in all the figures following FIG. 15, the insulating film IL4 is removed like FIG. 13. However, also in the figures after FIG. 15, the insulating film IL4 may remain in the form of layer like FIG. 14 (note that in a salicide step to be described later, the exposed insulating film IL4 can be removed).

Figure 15:
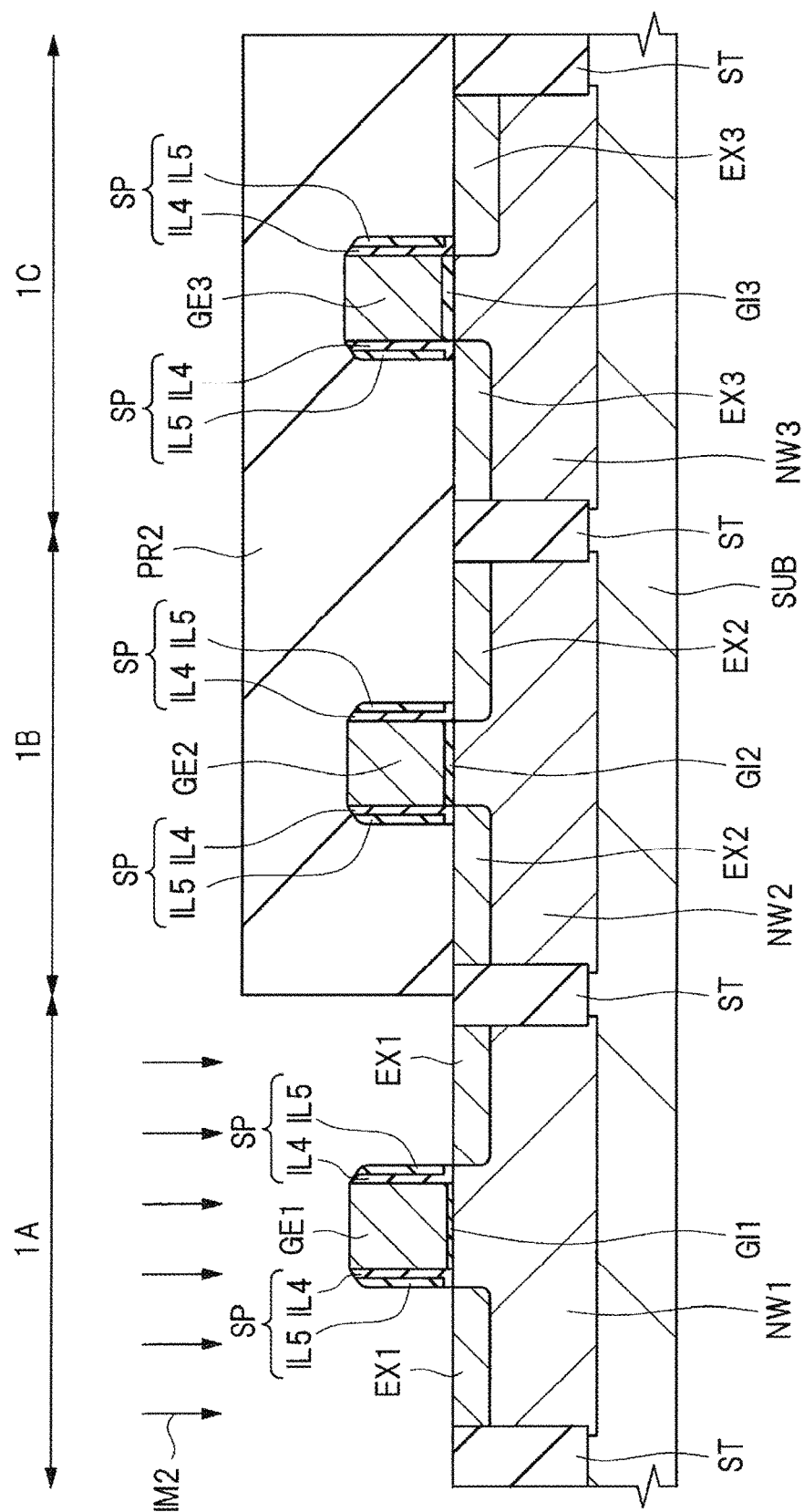
FIG. 15 is a cross-sectional view of a main part of another manufacturing step of the semiconductor device, following the step shown in FIG. 13.

Then, as shown in FIG. 15, p-type impurities are ion-implanted into the semiconductor substrate SUB (n-type well NW1) of the p-channel MISFET formation region in the low breakdown voltage MISFET formation region 1A to thereby form extension regions (source/drain extension region, $p^-$-type semiconductor region, and p-type impurity diffusion layer) EX1 (in step S10 shown in FIG. 1). The ion implantation for forming the extension region EX1 is hereinafter referred to as an "ion implantation IM2". FIG. 15 schematically shows the ion implantation IM2 by the arrow.

In step S10, a photoresist layer PR2 is formed to cover the n-channel MISFET formation region in the low breakdown voltage MISFET formation region 1A, the intermediate breakdown voltage MISFET formation region 1B, and the high breakdown voltage MISFET formation region 1C, while exposing the p-channel MISFET formation region in the low breakdown voltage MISFET formation region 1A. After forming the photoresist layer PR2 over the semiconductor substrate SUB, the ion implantation IM2 is performed. Thereafter, the photoresist layer PR2 is removed. In the ion implantation IM2, the photoresist layer PR2 covers the n-channel MISFET formation region in the low breakdown voltage MISFET formation region 1A, the intermediate breakdown voltage MISFET formation region 1B, and the high breakdown voltage MISFET formation region 1C. As a result, the semiconductor substrate SUB within these regions are not subjected to the ion implantation. In step S6, the ion implantation IM2 is performed in the p-channel MISFET formation region of the low breakdown voltage MISFET formation region 1A of the semiconductor substrate SUB (n-type well NW1).

In the ion implantation IM2 in step S10, in the p-channel MISFET formation region of the low breakdown voltage MISFET formation region 1A, the gate electrode GE1 and the offset spacers SP over the sidewalls thereof can serve as a mask (ion implantation blocking mask). Thus, impurities are prevented from being implanted directly under the gate electrode GE1 and the offset spacers SP over the sidewalls thereof of the semiconductor substrate SUB (n-type well NW1) in performing the ion implantation IM2. As a result, in the p-channel MISFET formation region of the low breakdown voltage MISFET formation region 1A, p-type impurities, such as boron (B), are ion-implanted in regions located on both sides of the gate electrode GE1 and the offset spacers SP over the sidewalls thereof of the semiconductor substrate SUB (n-type well NW1) to thereby form the extension regions EX1. Thus, in the low breakdown voltage MISFET formation region 1A, the extension region EX1 is formed to be aligned (self-aligned) with the side surfaces of the offset spacer SP over the sidewalls of the gate electrode GE1. In the ion implantation IM2, the p-type impurities can be ion-implanted also in the gate electrode GE1 (silicon film forming the electrode).

The extension region EX1 is a semiconductor region of the same conduction type (p-type in this embodiment) as that of the source and drain regions SD1 to be formed later. However, the extension region EX1 has a lower concentration of impurities than that of the source and drain regions SD1, and a shallower depth (junction depth) than that of the source and drain regions SD1 to be formed later.

After the ion implantation IM2, the above photoresist layer PR2 is removed.

In this embodiment, in order to form the extension regions (EX1 or the like) of the low breakdown voltage MISFET, the offset spacers are formed over the sidewalls of the gate electrode (GE1 or the like). When in other embodiments, the offset spacer does not need to be formed on the sidewall of the gate electrode (GE1 or the like) in forming the extension region (EX1 and the like), the step S7 (formation of the insulating film IL4), the step S8 (formation of the insulating film IL5), and the step S9 (etching back of the insulating films IL5 and IL4) can also be omitted.

Figure 16:
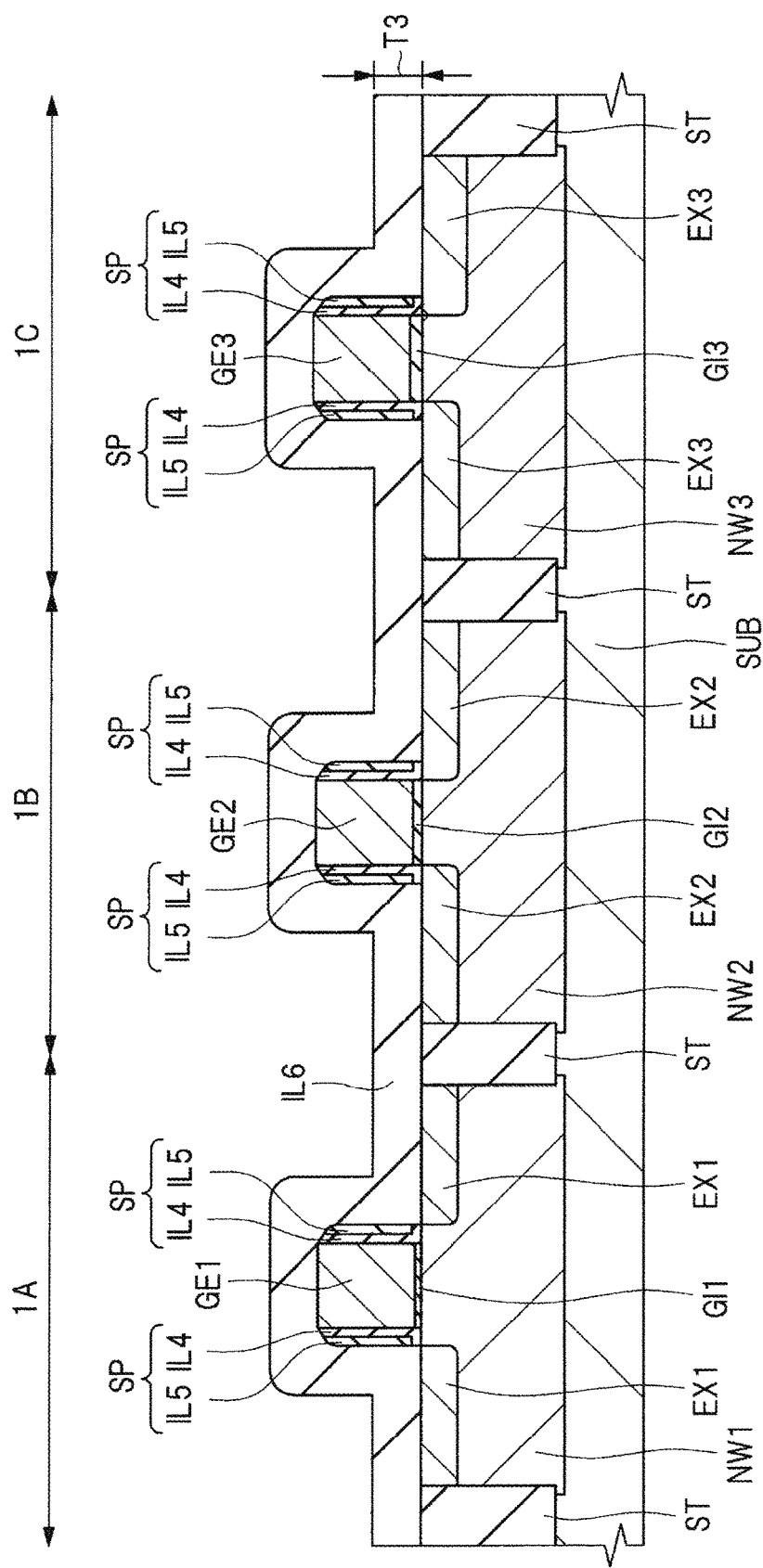
FIG. 16 is a cross-sectional view of a main part of another manufacturing step of the semiconductor device, following the step shown in FIG. 15.

Then, as shown in FIG. 16, an insulating film IL6 is formed over the main surface of the semiconductor substrate SUB to cover the gate electrodes GE1, GE2, and GE3 and the offset spacers SP over the sidewalls thereof (in step S11 shown in FIG. 2).

The insulating film IL6 is an insulating film for a sidewall spacer SW2 to be formed on the sidewalls of the gate electrodes GE1, GE2, and GE3, and preferably a single layer of the insulating film. The insulating film IL6 is preferably a silicon oxide film or silicon nitride film, and further preferably a silicon nitride film. The formation thickness T3 (deposited thickness) of the formed insulating film IL6 can be, for example, in a range of about 30 to 50 nm. The formation thickness T3 of the insulating film IL6 is set taking into consideration the widths (T1a, T1b) of wall spacers SW2a and SW2b to be formed later. The insulating film IL6 can be formed, for example, using the CVD method or the like.

Figure 17:
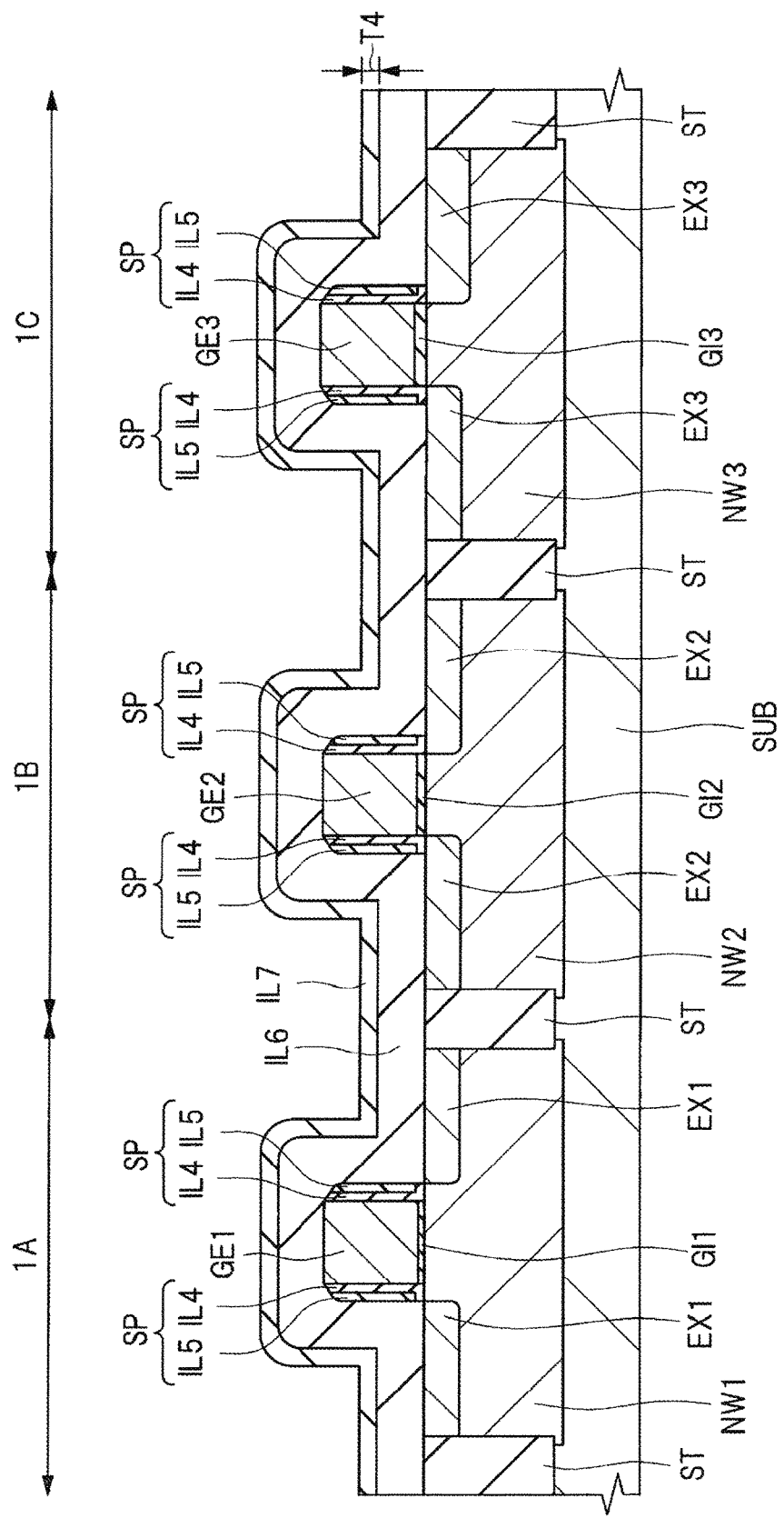
FIG. 17 is a cross-sectional view of a main part of another manufacturing step of the semiconductor device, following the step shown in FIG. 16.

Then, as shown in FIG. 17, an insulating film IL7 is formed over the main surface of the semiconductor substrate SUB, that is, over the insulating film IL6 (in step S12 shown in FIG. 2).

The insulating film IL7 is an insulating film for controlling the width of the sidewall spacer SW2 to be formed later over the sidewalls of the gate electrodes GE1, GE2, and GE3. The insulating film IL7 is preferably a single layer of an insulating film, and made of material different from the insulating film IL6. When the insulating film IL6 is a silicon nitride film, the insulating film IL7 is preferably a silicon oxide film. When the insulating film IL6 is a silicon oxide film, the insulating film IL7 is preferably a silicon nitride film. The formation thickness T4 of the insulating film IL7 formed in step S12 is preferably smaller (thinner) than the formation thickness T3 of the insulating film IL6 formed in step S11. The formation thickness (deposited thickness) T4 of the insulating film IL7 can be, for example, in a range of about 10 to 30 nm. The formation thickness T4 of the insulating film IL7 is set taking into consideration a difference between the width (T1c) of the sidewall spacer SW2c and the widths (T1a, and T1b) of the sidewall spacers SW2a and SW2b which are to be formed later. The insulating film IL7 can be formed, for example, using the CVD method or the like.

After the steps S11 and S12, a lamination of the insulating film IL6 and the insulating film IL7 over the insulating film IL6 is formed over the semiconductor substrate SUB to cover the gate electrodes GE1, GE2, and GE3 and the offset spacers SP over the sidewalls thereof.

Figure 18:
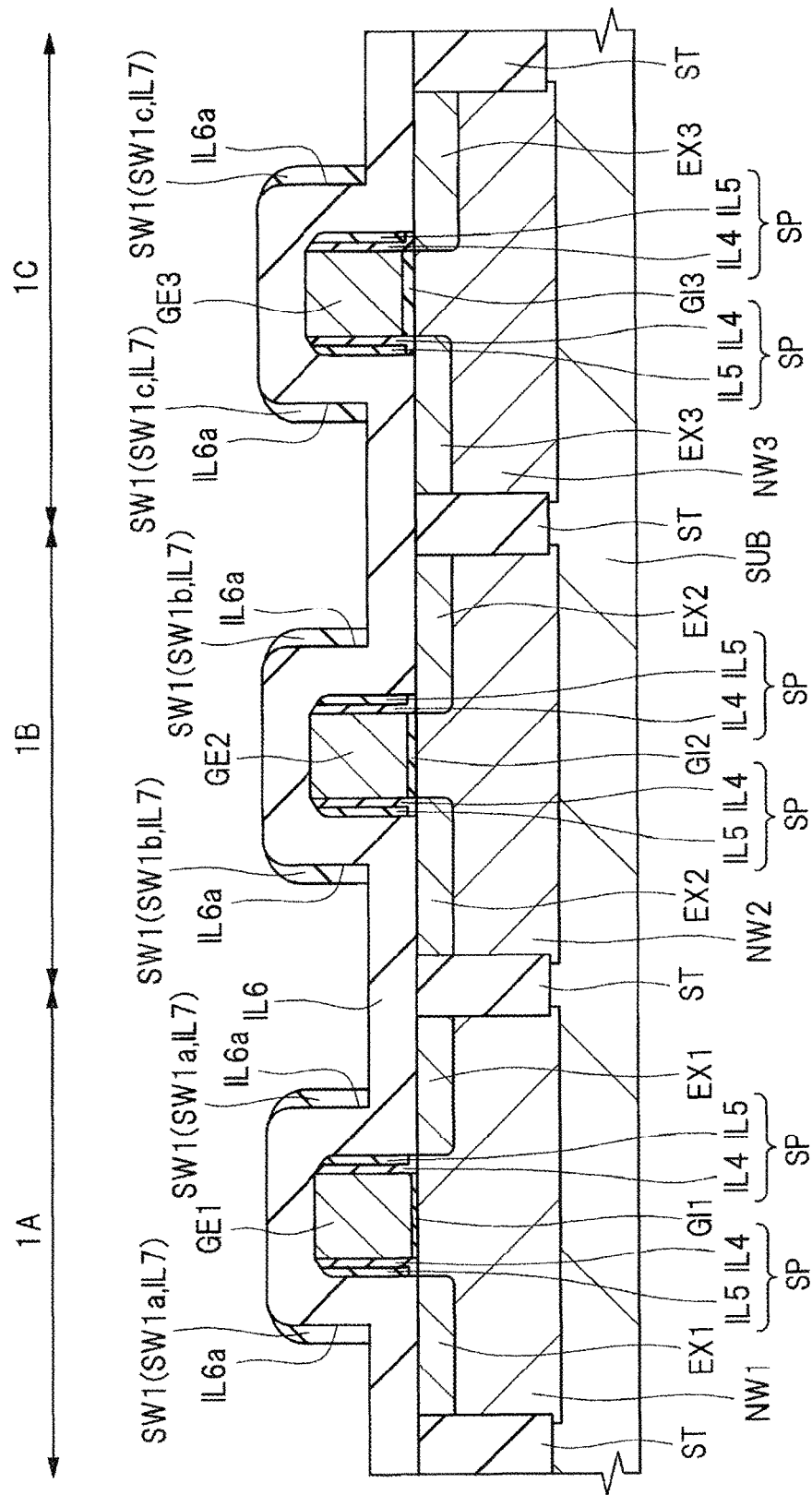
FIG. 18 is a cross-sectional view of a main part of another manufacturing step of the semiconductor device, following the step shown in FIG. 17.

Then, as shown in FIG. 18, the insulating film IL7 is etched back by an anisotropic etching technique (etching, dry etching, anisotropic etching) to thereby form sidewall spacers (sidewalls, sidewall insulating films) SW1 as the sidewall insulating film over the side surfaces (sidewalls) IL6a of the insulating films IL6 (in step S13 shown in FIG. 2).

The side surface IL6a of the insulating film IL6 is a side surface among the surfaces of the insulating films IL6 corresponding to each sidewall of the gate electrodes GE1, GE2, and GE3.

Since the insulating film IL6 is formed over the semiconductor substrate SUB to cover the gate electrodes GE1, GE2, and GE3 in step S11, the insulating film IL6 is formed to reflect concavities and convexities of the underlayer and to conform with the gate electrodes GE1, GE2, and GE3. Thus, the insulating film IL6 is provided with the side surfaces (sidewalls) IL6a corresponding to the sidewalls of the gate electrodes GE1, GE2, and GE3. That is, parts of the insulating film IL6 covering the gate electrodes GE1, GE2, and GE3 have their surface formed in a convex shape with the side of each convex shaped part being the side surface IL6a corresponding to each sidewall of the gate electrodes GE1, GE2, and GE3. The side surface IL6a of the insulating film IL6 is formed in the position away from each sidewall of the gate electrodes GE1, GE2, and GE3 in the gate length direction by the thickness of the insulating film IL6 (the sum of the thickness of the insulating film IL6 and the thickness of the offset spacer SP in forming the offset spacer SP). The side surface IL6a of the insulating film IL6 is usually parallel to each sidewall of the corresponding gate electrode GE1, GE2, or GE3. In some cases, the top of the side surface IL6a may be rounded.

After the step S13, each sidewall spacer SW1 is formed over the side surface IL6a of the insulating film IL6. From another perspective, the sidewall spacer SW1 is formed over each sidewall of the gate electrodes GE1, GE2, and GE3 via the insulating film IL6 (via the offset spacer SP and insulating film IL6 in formation of the offset spacer SP).

In step S13, a part of the insulating film IL7 located over the side surface IL6a of the insulating film IL6 is left as the sidewall spacer SW1, and the remaining part of the insulating film IL7 in the other region is removed. Thus, after the step S13, the parts of the insulating films IL7 locally remaining over the side surface IL6a of the insulating film IL6 serve as the sidewall spacer SW1, and the insulating films IL6 except for the parts thereof covered by the sidewall spacers SW1 are exposed.

The sidewall spacer SW1 formed over the side surface IL6a of the insulating film IL6 corresponding to the sidewall of the gate electrode GE1 in the low breakdown voltage MISFET formation region 1A is hereinafter referred to as a "sidewall spacer SW1a". The sidewall spacer SW1 formed over the side surface IL6a of the insulating film IL6 corresponding to the sidewall of the gate electrode GE2 in the intermediate breakdown voltage MISFET formation region 1B is hereinafter referred to as a "sidewall spacer SW1b". The sidewall spacer SW1 formed over the side surface IL6a of the insulating film IL6 corresponding to the sidewall of the gate electrode GE3 in the high breakdown voltage MISFET formation region 1C is hereinafter referred to as a "sidewall spacer SW1c".

In step S13, the etching back is preferably performed under conditions (etching conditions) that make an etching rate of the insulating film IL7 larger (higher) than that of the insulating film IL6. In other words, in step S13, the etching back is preferably performed under conditions (etching conditions) that make an etching rate of the insulating film IL6 smaller (lower) than that of the insulating film IL7. That is, the etching back is preferably performed on the etching conditions in which the insulating film IL6 is less likely to be etched than the insulating film IL7. Thus, in step S13, the insulating film IL6 can serve as an etching stopper. In step S13, the insulating film IL6 can be suppressed or prevented from being etched.

In step S13, the etching rates of the insulating film IL6 and the insulating film IL7 need to differ from each other. Also in the following step S14, the etching rate of the insulating film IL6 should be different from that of the insulating film IL7 (sidewall spacer SW1). Thus, the insulating film IL6 and the insulating film IL7 are formed of different materials.

In the step S13 and step S14 to be described later, the etching conditions that can etch the insulating film IL7, while suppressing etching of the insulating film IL6 as much as possible are preferably adopted. Thus, the material of the insulating film IL7 is preferably selected that can have a high etching selectivity as compared to the material of the insulating film IL6. From this point, preferably, one of the insulating film IL6 and the insulating film IL7 is formed of a silicon oxide film, whereas the other of the insulating film IL6 and the insulating film IL7 is formed of a silicon nitride film.

When the insulating film IL7 is the silicon oxide film and the insulating film IL6 is the silicon nitride film, the etching back process of the insulating film IL7 in step S13 preferably uses an etching gas described below by way of example. That is, for example, the etching gas for use can be a mixed gas of $C_4F_8$ gas, $O_2$ gas, and Ar gas.

Next, the sidewall spacers SW1 (that is, sidewall spacers SW1a and SW1b) in the low breakdown voltage MISFET formation region 1A and the intermediate breakdown voltage MISFET formation region 1B are removed, and the sidewall spacer SW1 (that is, sidewall spacer SW1c) in the high breakdown voltage MISFET formation region 1C is maintained (in step S14 shown in FIG. 2).

Figure 19:
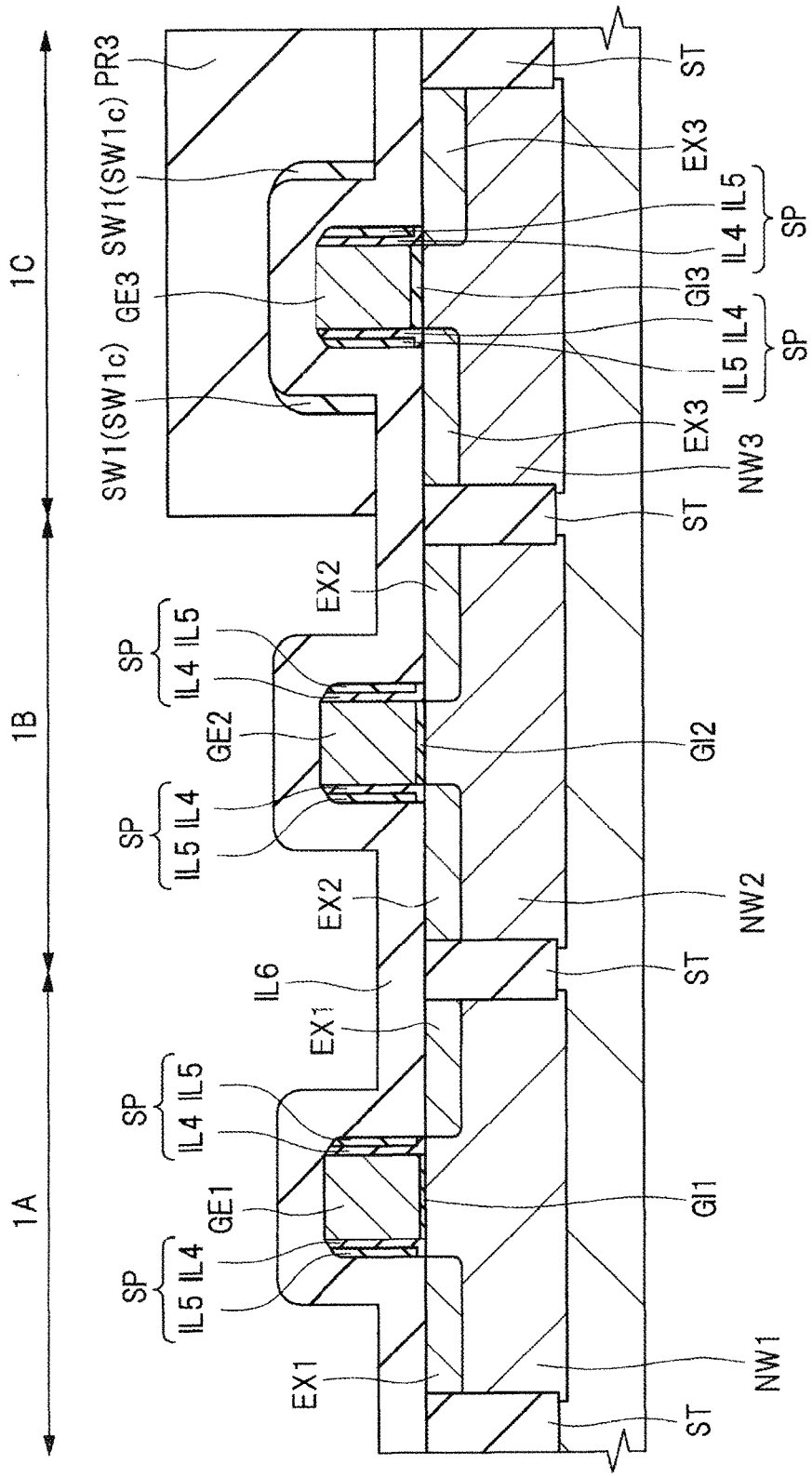
FIG. 19 is a cross-sectional view of a main part of another manufacturing step of the semiconductor device, following the step shown in FIG. 18.
Figure 20:
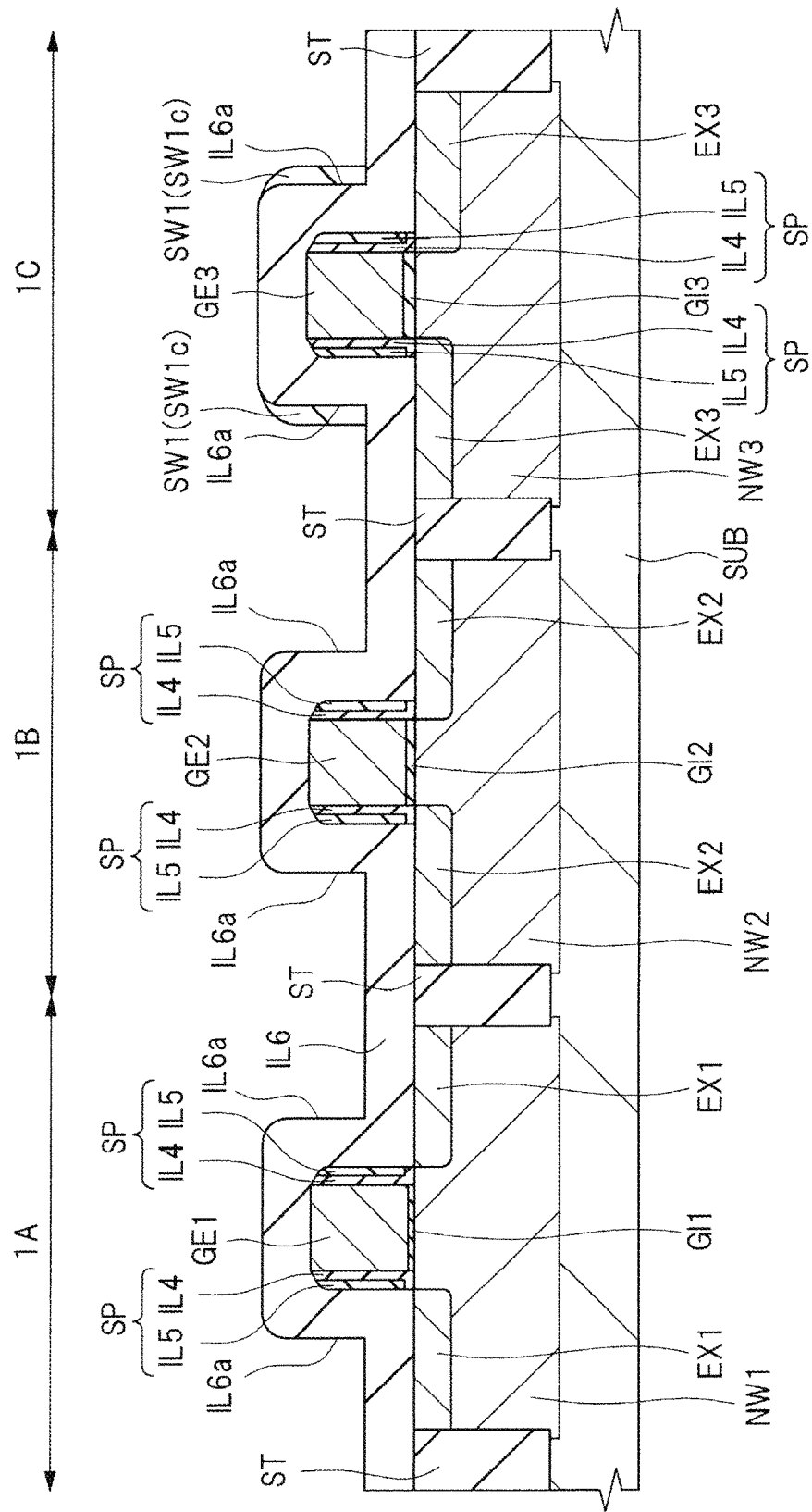
FIG. 20 is a cross-sectional view of a main part of another manufacturing step of the semiconductor device, following the step shown in FIG. 19.

The process in step S14 can be performed in the following way. That is, as shown in FIG. 19, a photoresist layer (mask layer) PR3 is formed over the semiconductor substrate SUB to cover the high breakdown voltage MISFET formation region 1C and to expose the low breakdown voltage MISFET formation region 1A and the intermediate breakdown voltage MISFET formation region 1B. Then, the sidewall spacers SW1 (that is, the sidewall spacers SW1a and SW1b) formed in the low breakdown voltage MISFET formation region 1A and the intermediate breakdown voltage MISFET formation region 1B are removed by the etching. Thereafter, as shown in FIG. 20, the photoresist layer PR3 is removed. In this way, the process in the step S14 is performed to remove the sidewall spacers SW1a and SW1b in the low breakdown voltage MISFET formation region 1A and the intermediate breakdown voltage MISFET formation region 1B.

Specifically, in the step S14, the etching is performed while the sidewall spacers SW1 (SW1a and SW1b) in the low breakdown voltage MISFET formation region 1A and the intermediate breakdown voltage MISFET formation region 1B are exposed, and the sidewall spacer SW1 (sidewall spacer SW1c) in the high breakdown voltage MISFET formation region 1C is not exposed (that is, is covered with the photoresist layer PR3). In the etching process in step S14, the sidewall spacers SW1 (SW1a and SW1b) in the low breakdown voltage MISFET formation region 1A and the intermediate breakdown voltage MISFET formation region 1B are removed, and the sidewall spacer SW1 (sidewall spacer SW1c) in the high breakdown voltage MISFET formation region 1C remains without being removed.

In step S14, the etching is preferably performed under conditions (etching conditions) that makes an etching rate of the sidewall spacer SW1 larger (higher) than that of the insulating film IL6. In other words, in step S14, the etching is preferably performed under conditions (etching conditions) that makes an etching rate of the insulating film IL6 smaller (lower) than that of the sidewall spacer SW1. That is, in step S14, the etching is preferably performed on the etching conditions in which the insulating film IL6 is less likely to be etched than the sidewall spacer SW1. In step S14, the insulating film IL6 can be suppressed or prevented from being etched.

In step S14, the sidewall spacers SW1a and SW1b are desirably removed while suppressing the etching of the insulating film IL6 as much as possible. This arrangement can suppress or prevent the decrease in thickness of the insulating film IL6 in the low breakdown voltage MISFET formation region 1A and the intermediate breakdown voltage MISFET formation region 1B by the etching in step S14, which can also suppress or prevent a difference in thickness of the insulating film IL6 between the low and intermediate breakdown voltage MISFET formation regions 1A and 1B and the high breakdown voltage MISFET formation region 1C. From this point, the etching in step S14 is preferably wet etching, which can accurately remove the sidewall spacers SW1a and SW1b, while suppressing the etching of the insulating film IL6 as much as possible. The use of wet etching can easily achieve the etching having a high etching selectivity between the silicon oxide film and the silicon nitride film. As mentioned above, preferably, one of the insulating film IL6 and the insulating film IL7 is the silicon oxide film, while the other is the silicon nitride film, and wet etching is used as the etching in step S14. When the insulating film IL6 is the silicon nitride film, and the insulating film IL7 is the silicon oxide film, in step S14, the wet etching using, for example, hydrofluoric acid (buffered hydrofluoric acid) can be suitably used.

In the above step S13, the anisotropic etching is needed to enable the formation of the sidewall spacers SW1 and thus the dry etching is performed. In step S15 to be described later, the anisotropic etching (also causing side etching) is needed to enable the formation of the sidewall spacers SW2, and thus the dry etching is performed. In step S14, isotropic etching is preferable so as to remove the entire sidewall spacers SW1a and SW1b, while suppressing the etching of the insulating film IL6 exposed. In particular, wet etching is more preferable.

Figure 21:
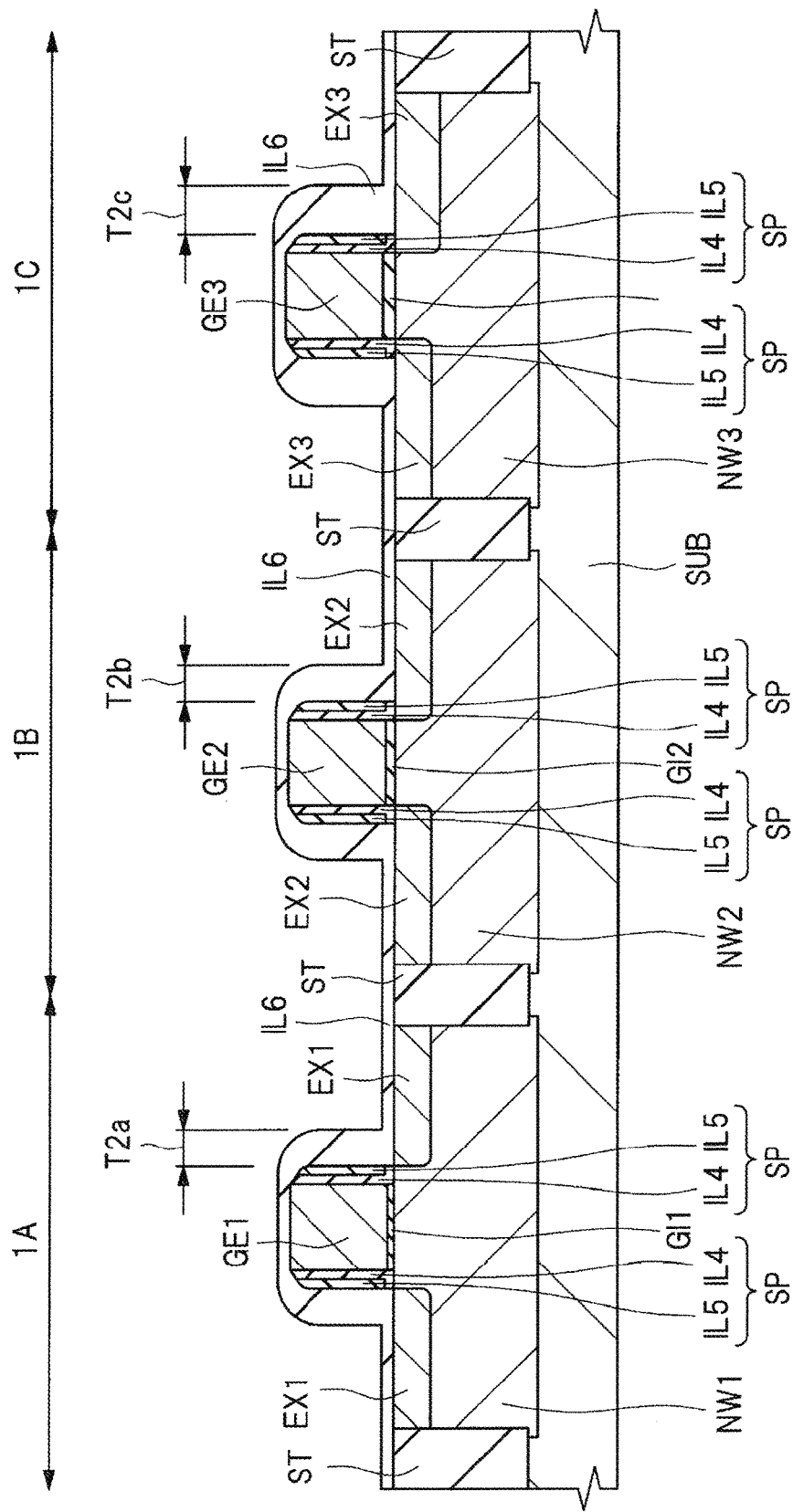
FIG. 21 is a cross-sectional view of a main part of another manufacturing step of the semiconductor device, following the step shown in FIG. 20.
Figure 22:
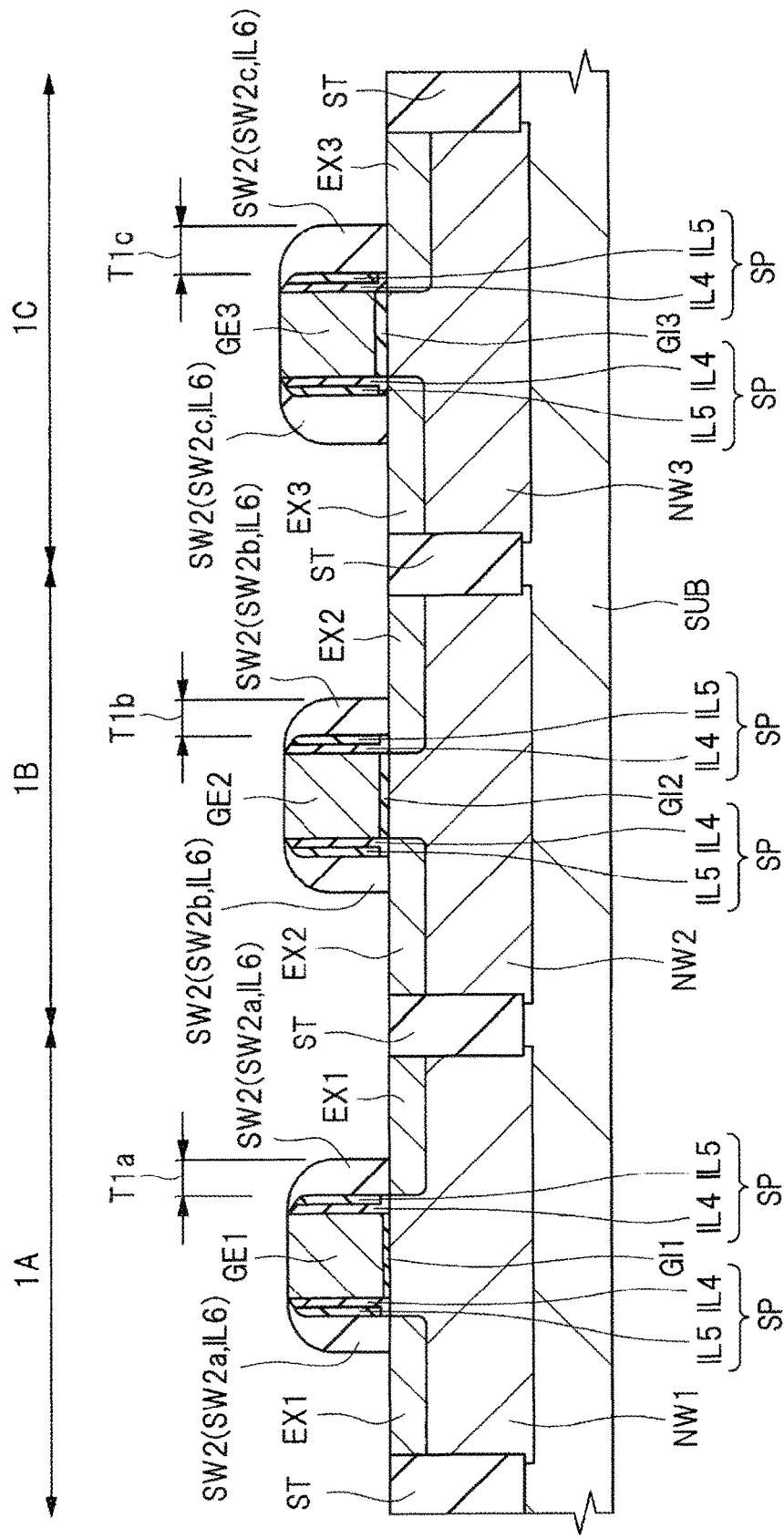
FIG. 22 is a cross-sectional view of a main part of another manufacturing step of the semiconductor device, following the step shown in FIG. 21.

Then, as shown in FIGS. 21 and 22, the sidewall spacers SW1c, and the insulating film IL6 are subjected to etching back (etching, dry etching), so that sidewall spacers (sidewalls, sidewall insulating films) SW2 are formed as the sidewall insulating film over the sidewalls of the gate electrodes GE1, GE2, and GE3 (in step S15 shown in FIG. 2).

In the etching back process of step S15, the etching conditions are controlled to cause not only the anisotropic etching, but also the side etching (isotropic etching). That is, in step S15, the sidewall spacer SW1c and the insulating film IL6 are subjected to side etching as well as the anisotropic etching. The balance between the anisotropic etching and the side etching can be controlled by the kind of gas used for the etching, the flow rate of the gas, and the like.

Thus, in step S15, the sidewall spacer SW1c and the insulating film IL6 are subjected to the anisotropic etching, which decreases the thickness of the insulating film IL6 as viewed in the direction substantially perpendicular to the main surface of the semiconductor substrate SUB. Together with this, in step S15, the sidewall spacers SW1c and the insulating film IL6 are subjected to the side etching, which decreases the thicknesses of the sidewall spacers SW1c and the insulating film IL6 as viewed in the direction substantially parallel to the direction of the gate length of the gate electrodes (GE1, GE2, GE3).

In step S15, the sidewall spacers SW1c are removed, so that the insulating films IL6 are left over the sidewalls of the gate electrodes GE1, GE2, and GE3 to become the sidewall spacers SW2 with the insulating film IL6 in other regions removed. Thus, the sidewall spacers SW2 are formed of the insulating film IL6 remaining over the sidewalls of the gate electrodes GE1, GE2, and GE3. In step S15, the insulating film IL6 except for the parts of the insulating film IL6 remaining as the sidewall spacer SW2 over the sidewalls of the gate electrodes GE1, GE2, and GE3 can be removed.

In the above step S15, the entire sidewall spacers SW1c are preferably removed not to leave the sidewall spacers SW1c at all. As a result, after the end of the process in step S15, the sidewall spacers SW2 made of the remaining insulating film IL6 are formed over the sidewalls of the gate electrodes GE1, GE2, and GE3 without the sidewall spacer SW1 (which are not remaining). That is, after the end of the process in step S15, the sidewall spacer SW2 formed on each sidewall of the gate electrodes GE1, GE2, and GE3 is formed of not the insulating film IL6 and the remaining part of the sidewall spacer SW1, but the single layer of the insulating film IL6.

In step S15, the etching back is preferably performed on the conditions (etching conditions) in which both the sidewall spacers SW1c (insulating film IL7) and the insulating film IL6 are etched. When the insulating film IL7 (sidewall spacer SW1c) is the silicon oxide film and the insulating film IL6 is the silicon nitride film, the etching back process of step S15 can use the following etching gas by way of example. That is, for example, the etching gas for use can be a mixed gas of $CF_4$ gas, and Ar gas.

FIG. 21 shows the halfway stage of the etching process in step S15, specifically, the stage directly after removal of the entire sidewall spacer SW1c during the etching process in step S15. FIG. 21 shows the stage directly after ending the etching process in step S15, following the stage shown in FIG. 20.

In the etching process of step S15, in the stage where the entire sidewall spacers SW1c are removed, the insulating film IL6 preferably remains in the form of layer over the semiconductor substrate SUB as shown in FIG. 21. After removing the entire sidewall spacers SW1c in the etching process of step S15, etching is preferably continued not to leave the insulating film IL6 in the form of layer over the semiconductor substrate SUB. That is, the insulating film IL6 except for the parts thereof serving as the sidewall spacer SW2 is removed.

When the offset spacers SP are formed over the sidewalls of the gate electrodes GE1, GE2, and GE3, the sidewall spacer SW2 is formed over each sidewall of the gate electrodes GE1, GE2, and GE3 via the offset spacer SP.

The sidewall spacer SW2 formed over the sidewall of the gate electrode GE1 among the sidewall spacers SW2 is hereinafter referred to as a "sidewall spacer SW2a". The sidewall spacer SW2 formed over the sidewall of the gate electrode GE2 among the sidewall spacers SW2 is hereinafter referred to as a "sidewall spacer SW2b". The sidewall spacer SW2 formed over the sidewall of the gate electrode GE3 among the sidewall spacers SW2 is hereinafter referred to as a "sidewall spacer SW2c".

A width T1c of the sidewall spacer SW2c is larger than a width T1a of the sidewall spacer SW2a, and larger than a width T1b of the sidewall spacer SW2b (that is, T1c>T1a, and T1c>T1b). In other words, the width T1a of the sidewall spacer SW2a is smaller than the width T1c of the sidewall spacer SW2c (T1a<T1c), and the width T1b of the sidewall spacer SW2b is smaller than the width T1c of the sidewall spacer SW2c (T1b<T1c). The width T1a of the sidewall spacer SW2a is substantially equal to the width T1b of the sidewall spacer SW2b (that is, T1a=T1b).

The width T1a of the sidewall spacer SW2a corresponds to a distance (distance measured in the direction parallel to the gate length direction of the gate electrode GE1) between one side surface (side surface of the sidewall spacer SW2a) opposed (adjacent) to the sidewall of the gate electrode GE1, and the other side surface (the other side surface of the sidewall spacer SW2) opposite to the above side surface, among the side surfaces of the sidewall spacer SW2a. That is, the width T1a of the sidewall spacer SW2a corresponds to the size (width) of the sidewall spacer SW2a as measured at the lower part of the sidewall of the gate electrode GE1 in the direction parallel to the gate length direction of the gate electrode GE1.

The width T1b of the sidewall spacer SW2b corresponds to a distance (distance measured in the direction parallel to the gate length direction of the gate electrode GE2) between one side surface (side surface of the sidewall spacer SW2b) opposed (adjacent) to the sidewall of the gate electrode GE2, and the other side surface (the other side surface of the sidewall spacer SW2b) opposite to the above side surface, among the side surfaces of the sidewall spacer SW2b. That is, the width T1b of the sidewall spacer SW2b corresponds to the size (width) of the sidewall spacer SW2b as measured at the lower part of the sidewall of the gate electrode GE2 in the direction parallel to the gate length direction of the gate electrode GE2.

The width T1c of the sidewall spacer SW2c corresponds to a distance (distance measured in the direction parallel to the gate length direction of the gate electrode GE3) between one side surface (side surface of the sidewall spacer SW2c) opposed (adjacent) to the sidewall of the gate electrode GE3, and the other side surface (the other side surface of the sidewall spacer SW2c) opposite to the above side surface, among the side surfaces of the sidewall spacer SW2c. That is, the width T1c of the sidewall spacer SW2c corresponds to the size (width) of the sidewall spacer SW2c as measured at the lower part of the sidewall of the gate electrode GE3 in the direction parallel to the gate length direction of the gate electrode GE3.

The width T1a of the sidewall spacer SW2a can be regarded as the thickness of the sidewall spacer SW2a (thickness thereof over the sidewall of the gate electrode GE1). The width T1b of the sidewall spacer SW2b can be regarded as the thickness of the sidewall spacer SW2b (thickness thereof over the sidewall of the gate electrode GE2). The width T1c of the sidewall spacer SW2c can be regarded as the thickness of the sidewall spacer SW2c (thickness thereof over the sidewall of the gate electrode GE2).

The following will be the reason why the width T1a of the sidewall spacer SW2a and the width T1b of the sidewall spacer SW2b are smaller than the width T1c of the sidewall spacer SW2c (that is, T1a<T1c, and T1b<T1c).

In the etching process of step S15, not only the anisotropic etching, but also side etching is performed. Since in the high breakdown voltage MISFET formation region 1C, the sidewall spacer SW1c is formed over each side surface IL6a of the insulating film IL6, the sidewall spacers SW1c are mainly subjected to the side etching. Until the entire sidewall spacer SW1c is removed, the side surface IL6a of the insulating film IL6 is not subjected to the side etching. That is, in the high breakdown voltage MISFET formation region 1C, only after the removal of the sidewall spacer SW1c to expose the side surface IL6a of the insulating film IL6 in the whole etching time of the step S15, the side surface IL6a of the insulating film IL6 is subjected to the side etching.

In contrast, in the low and intermediate breakdown voltage MISFET formation regions 1A and 1B, while the sidewall spacer SW1 is not formed over the side surface IL6a of the insulating film IL6 (with the sidewall spacers SW1a and SW1b already removed), the etching in step S15 is started. As a result, in the low and intermediate breakdown voltage MISFET formation regions 1A and 1B, during the entire etching time of step S15, the side surface IL6a of the insulating film IL6 is not subjected to the side etching.

As compared to the high breakdown voltage MISFET formation region 1C, the side surface IL6a of the insulating film IL6 in the low breakdown voltage MISFET formation region 1A and the intermediate breakdown voltage MISFET formation region 1B are subjected to the side etching for a long time. When the side surface IL6a of the insulating film IL6 is subjected to the side etching, the longer the time of the side etching, the more the amount of the insulating film IL6 subjected to the side etching (the thickness of the side etched film) becomes to make the insulating film IL6 over each sidewall of the gate electrode thinner.

As a result, in the stage after the end of the etching in step S15, the thickness of the insulating film IL6 remaining over each sidewall of the gate electrodes GE1 and GE2 in the low and intermediate breakdown voltage MISFET formation regions 1A and 1B is smaller (thinner) than that of the insulating film IL6 remaining over the sidewall of the gate electrode GE3 in the high breakdown voltage MISFET formation region 1C. That is, each of the widths T1a and T1b of the sidewall spacers SW2a and SW2b is smaller than the width T1c of the sidewall spacer SW2c (T1c>T1a, and T1c>T1b).

As mentioned above, in this embodiment, the etching process in step S15 is performed with the sidewall spacer SW1c remaining over each side surface IL6a of the insulating film IL6 in the high breakdown voltage MISFET formation region 1C, and with the sidewall spacers SW1a and SW1b removed from each side surface IL6a of the insulating film IL6 in the low and intermediate breakdown voltage MISFET formation regions 1A and 1B. In the high breakdown voltage MISFET formation region 1C, the sidewall spacers SW1c can serve as a prevention film of the side etching of the insulating film IL6, and thus can decrease the amount of side etching of the insulating film IL6 by reducing the side etching time of the insulating film IL6 as compared to in the low and intermediate breakdown voltage MISFET formation regions 1A and 1B. Such a difference in amount of the side etching of the insulating film IL6 between the MISFET formation regions decreases the thickness of the insulating film IL6 over the sidewall of the gate electrode in the high breakdown voltage MISFET formation region 1C as compared to in the low and intermediate breakdown voltage MISFET formation regions 1A and 1B. As a result, the width T1c of the sidewall spacer SW2c can be made larger than each of the widths T1a and T1b of the sidewall spacers SW2a and SW2b.

In this way, the sidewall spacers SW2 (SW2a, SW2b, SW2c) are formed.

The sidewall spacers SW2 are formed over the sidewalls of the gate electrodes (gate electrodes GE1, GE2, and GE3) after forming the extension regions (extension regions EX1, EX2, and EX3) having a low concentration of impurities in the lightly doped drain (LDD) structure. The sidewall spacers SW2 are formed before ion implantation for forming source and drain regions (specifically, source and drain regions SD1, SD2, and SD3 to be described later) having a high concentration of impurities in the LDD structure. In the ion implantation, the sidewall spacers SW2 serve as an ion implantation blocking mask.

Figure 23:
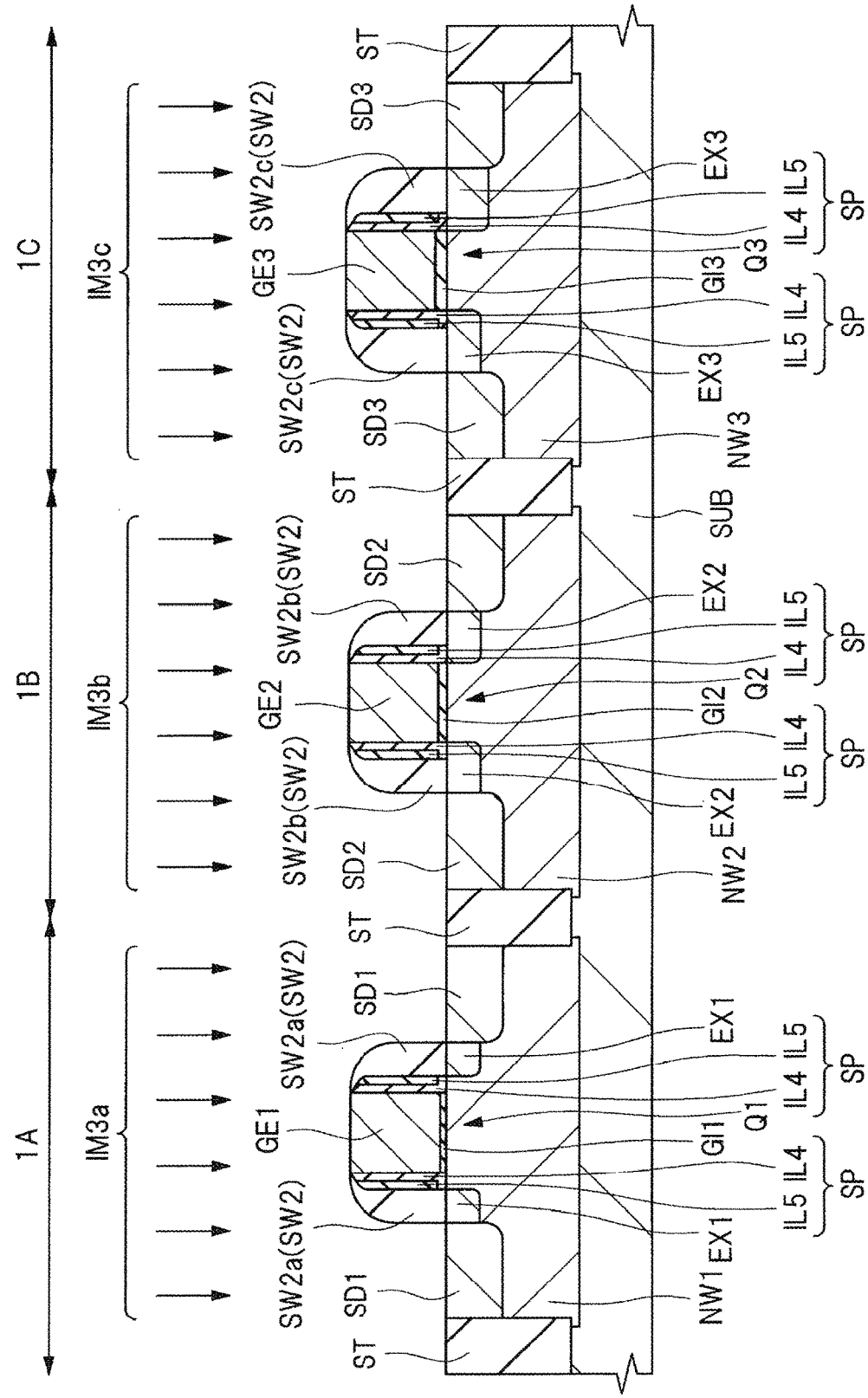
FIG. 23 is a cross-sectional view of a main part of another manufacturing step of the semiconductor device, following the step shown in FIG. 22.

Then, as shown in FIG. 23, the source and drain regions SD1, SD2, and SD3 which are $n^+$-type semiconductor regions (n-type impurity diffusion layer) are formed (in step S16 shown in FIG. 2).

The source and drain SD1 can be formed by ion-implanting p-type impurities, such as boron (B), in the semiconductor substrate SUB within the low breakdown voltage MISFET formation region 1A (this ion implantation being hereinafter referred to as an "ion implantation IM3a"). FIG. 23 schematically shows the ion implantation IM3a for forming the source and drain regions SD1 by the arrow.

In the ion implantation IM3a, the sidewall spacers SW2a over the sidewalls of the gate electrode GE1 in the low breakdown voltage MISFET formation region 1A can serve as a mask (ion implantation blocking mask). The offset spacer SP is formed between the gate electrode GE1 and the sidewall spacer SW2a, and can also serve as the mask (ion implantation blocking mask). Thus, the implantation of impurities are prevented in the ion implantation IM3a into the regions directly under the gate electrode GE1 and the sidewall spacers SW2a over the sidewalls thereof (also directly under the offset spacer SP in the presence of the offset spacer SP) in the semiconductor substrate SUB (n-type well NW1).

Thus, the source and drain regions SD1 are formed by ion-implanting p-type impurities, such as boron (B), into the regions on both sides of the gate electrode GE1 and sidewall spacers SW2a over the sidewalls thereof in the semiconductor substrate SUB (n-type well NW1) within the low breakdown voltage MISFET formation region 1A. Thus, the source and drain regions SD1 in the low breakdown voltage MISFET formation region 1A are aligned (self-aligned) with the side surfaces of the sidewall spacers SW2a over the sidewalls of the gate electrode GE1. In the ion implantation IM3a, the p-type impurities can also be ion-implanted in the gate electrode GE1 (silicon film forming the gate electrode).

The source and drain regions SD1 are the semiconductor region having the same conduction type (herein of the p-type) as the extension region EX1, but have a higher concentration of impurities (p-type impurity concentration) than that of the extension region EX1, and a deeper depth (junction depth) than that of the extension region EX1.

As a result, in the low breakdown voltage MISFET formation region 1A, the p-type semiconductor region (impurity diffusion layer) serving as the source or drain of the p-channel MISFETQ1 is formed of the source/drain region SD1 and extension region EX1. In other words, the extension region EX1 and the source or drain region SD1 having the higher impurity concentration than the region EX1 serve as the semiconductor region for the source or drain of the MISFETQ1 (p-type semiconductor region). Thus, the source region and drain region of the MISFETQ1 form the LDD structure. As mentioned above, the extension region EX1 is formed to be self-aligned with the offset spacer SP over the sidewall of the gate electrode GE. The source and drain regions SD1 are formed to be self-aligned with the sidewall spacers SW2a formed over the sidewalls of the gate electrode GE1 via the offset spacers SP.

The source and drain SD2 can be formed by ion-implanting p-type impurities, such as boron (B), in the semiconductor substrate SUB within the intermediate breakdown voltage MISFET formation region 1B (this ion implantation being hereinafter referred to as "ion implantation IM3b"). FIG. 23 schematically shows the ion implantation IM3b for forming the source and drain regions SD2 by the arrow.

In the ion implantation IM3b, the gate electrode GE2 and the sidewall spacers SW2a over the sidewalls of the gate electrode GE2 in the intermediate breakdown voltage MISFET formation region 1B can serve as a mask (ion implantation blocking mask). When the offset spacer SP is formed between the gate electrode GE2 and the sidewall spacer SW2b, the offset spacer SP can also serve as the mask (ion implantation blocking mask). Thus, in the ion implantation IM3b, the implantation of impurities are prevented in the regions directly under the gate electrode GE2 and the sidewall spacers SW2b over the sidewalls thereof (also directly under the offset spacer SP in the presence of the offset spacer SP) in the semiconductor substrate SUB (n-type well NW2).

In the intermediate breakdown voltage MISFET formation region 1B, the source and drain regions SD2 are formed by implanting p-type impurities, such as boron (B), into the regions on both sides of the gate electrode GE2 and sidewall spacers SW2b over the sidewalls thereof in the semiconductor substrate SUB (n-type well NW2). Thus, the source and drain regions SD2 are formed in the intermediate breakdown voltage MISFET formation region 1B to be aligned (self-aligned) with the side surfaces of the sidewall spacers SW2b over the sidewalls of the gate electrode GE2. In the ion implantation IM3b, the p-type impurities can also be ion-implanted in the gate electrode GE2 (silicon film forming the gate electrode).

The source and drain regions SD2 are the semiconductor region having the same conduction type (herein, the p-type) as the extension region EX2, but have a higher concentration of impurities (p-type impurity concentration) than that of the extension region EX2, and a deeper depth (junction depth) than that of the extension region EX2.

Thus, in the intermediate breakdown voltage MISFET formation region 1B, the p-type semiconductor region (impurity diffusion layer) serving as the source or drain of the p-channel MISFETQ2 is formed of the source/drain region SD2 and extension region EX2. In other words, the extension region EX2 and the source or drain region SD2 having the high impurity concentration serve as the semiconductor region for the source or drain of the MISFETQ2 (p-type semiconductor region). Thus, the source region and drain region of the MISFETQ2 form the LDD (Lightly Doped Drain) structure. As mentioned above, the extension region EX2 is formed to be self-aligned with the gate electrode GE2. The source and drain regions SD2 are formed to be self-aligned with the sidewall spacers SW2b formed over the sidewalls of the gate electrode GE2.

The source and drain SD3 can be formed by ion-implanting p-type impurities, such as boron (B), in the semiconductor substrate SUB within the high breakdown voltage MISFET formation region 1C (this ion implantation being hereinafter referred to as "ion implantation IM3c"). FIG. 23 schematically shows the ion implantation IM3c for forming the source and drain regions SD3 by the arrow.

In the ion implantation IM3c, the gate electrode GE3 and the sidewall spacers SW2c over the sidewalls thereof in the high breakdown voltage MISFET formation region 1C can serve as a mask (ion implantation blocking mask). When the offset spacer SP is formed between the gate electrode GE3 and the sidewall spacer SW2c, the offset spacer SP can also serve as the mask (ion implantation blocking mask). The implantation of impurities is prevented in the ion implantation IM3c in the regions directly under the gate electrode GE3 and the sidewall spacers SW2c over the sidewalls thereof (also directly under the offset spacer SP in the presence of the offset spacer SP) in the semiconductor substrate SUB (n-type well NW3).

Thus, the source and drain regions SD3 are formed in the high breakdown voltage MISFET formation region 1C by ion-implanting p-type impurities, such as boron (B), into the regions on both sides of the gate electrode GE3 and sidewall spacers SW2c over the sidewalls thereof in the semiconductor substrate SUB (n-type well NW3). Thus, the source and drain regions SD3 in the high breakdown voltage MISFET formation region 1C are formed to be aligned (self-aligned) with the side surfaces of the sidewall spacers SW2c over the sidewalls of the gate electrode GE3. The p-type impurities can also be ion-implanted in the gate electrode GE3 (silicon film forming the gate electrode) in the ion implantation IM3c.

The source and drain regions SD3 are the semiconductor region having the same conduction type (herein, the p-type) as the extension region EX3, but have a higher concentration of impurities (p-type impurity concentration) than that of the extension region EX3, and a deeper depth (junction depth) than that of the extension region EX3.

Thus, in the high breakdown voltage MISFET formation region 1C, the p-type semiconductor region (impurity diffusion layer) serving as the source or drain of the p-channel MISFETQ3 is formed of the source/drain region SD3 and extension region EX3. In other words, the extension region EX3 and the source and drain regions SD3 having the higher impurity concentration than that of the region EX3 serve as the semiconductor region for the source and drain of the MISFETQ3 (p-type semiconductor region). Thus, the source region and drain region of the MISFETQ3 form the LDD (Lightly Doped Drain) structure. As mentioned above, the extension region EX3 is formed to be self-aligned with the gate electrode GE3. The source and drain regions SD3 are formed to be self-aligned with the sidewall spacers SW2c formed over the sidewalls of the gate electrode GE3.

The ion implantation IM3a for forming the source and drain regions SD1, the ion implantation IM3b for forming the source and drain regions SD2, and the ion implantation IM3c for forming the source and drain regions SD3 may be performed in the same ion implantation step, or can be performed in different ion implantation steps. Two of the ion implantations IM3a, IM3b, and IM3c can be performed in the same ion implantation step, but the remaining ion implantation can be performed in another ion implantation step.

When performing the ion implantations IM3a, IM3b, and IM3c in the same ion implantation step, the ion implantation is simultaneously performed on the entire semiconductor substrate SUB in the low, intermediate, and high breakdown voltage MISFET formation regions 1A, 1B, and 1C to thereby collectively form the source and drain regions SD1, SD2, and SD3.

When the ion implantations IM3a, IM3b, and IM3c are performed in different steps, each ion implantation is performed while forming a photoresist layer so as to expose regions of interest for formation of the source and drain regions by the ion implantation among the low, intermediate, and high breakdown voltage MISFET formation regions 1A, 1B, and 1C, and to cover the remaining regions with the photoresist layer. For example, while the photoresist layer is formed to cover the intermediate and high breakdown voltage MISFET formation regions 1B and 1C, and to expose the low breakdown voltage MISFET formation region 1A, the ion implantation IM3a is performed on the semiconductor substrate SUB in the low breakdown voltage MISFET formation region 1A to thereby form the source and drain regions SD1. While the photoresist layer is formed to cover the low and high breakdown voltage MISFET formation regions 1A and 1C, and to expose the intermediate breakdown voltage MISFET formation region 1B, the ion implantation IM3b is performed on the semiconductor substrate SUB in the low breakdown voltage MISFET formation region 1B to thereby form the source and drain regions SD2. While the photoresist layer is formed to cover the low and intermediate breakdown voltage MISFET formation regions 1A and 1B, and to expose the high breakdown voltage MISFET formation region 1C, the ion implantation IM3c is performed on the semiconductor substrate SUB in the high breakdown voltage MISFET formation region 1C to thereby form the source and drain regions SD3.

When the ion implantations IM3b and IM3c are performed in the same step, and the ion implantation IM3a is performed in another step among the ion implantations IM3a, IM3b, and IM3c, for example, the ion implantations may be performed in the following way. That is, while the photoresist layer is formed to cover the intermediate and high breakdown voltage MISFET formation regions 1B and 1C, and to expose the low breakdown voltage MISFET formation region 1A, the ion implantation IM3a is performed on the semiconductor substrate SUB in the low breakdown voltage MISFET formation region 1A to thereby form the source and drain regions SD1. While the photoresist layer is formed to cover the low breakdown voltage MISFET formation regions 1A, and to expose the intermediate and high breakdown voltage MISFET regions 1B and 1C, another ion implantation is performed on the semiconductor SUB in the intermediate and high breakdown voltage MISFET formation regions 1B and 1C to thereby collectively form the source and drain regions SD2 and SD3.

Next, in order to active the impurities introduced by the ion implantations, the annealing process (heat treatment) is performed (in step S17 shown in FIG. 2).

In this way, the MISFETQ1 is formed in the low breakdown voltage MISFET formation region 1A of the semiconductor substrate SUB, the MISFETQ2 is formed in the intermediate breakdown voltage MISFET formation region 1B of the substrate, and the MISFETQ3 is formed in the high breakdown voltage MISFET formation region 1C of the substrate.

In the low breakdown voltage MISFET formation region 1A, the semiconductor regions for the source or drain of the MISFETQ1 are formed on both sides (both sides in the gate length direction) of the gate electrode GE1 in the semiconductor substrate SUB. Each of the semiconductor regions for the source or drain of the MISFETQ1 is formed of the extension region EX1 and the source/drain region SD1 having a higher impurity concentration than that of the extension region. That is, in the semiconductor substrate SUB within the low breakdown voltage MISFET formation region 1A, (a pair of) the extension regions EX1 are formed in respective regions spaced apart from each other via a channel formation region. The source and drain regions SD1 each having a higher impurity concentration than that of the extension region EX1 are formed outside the respective extension regions EX1 (on the side apart from the channel formation region). Thus, the extension region EX1 is adjacent to the channel formation region, and the source/drain region SD1 is spaced apart from the channel formation region by the extension region EX1, and adjacent to the extension region EX1. The part of the semiconductor substrate SUB under the gate electrode GE1 becomes a region where the channel of the MISFETQ1 (channel formation region) is formed. The gate electrode GE1 and the gate insulating film GI1 under the gate electrode GE1 serve as the gate electrode and the gate insulating film of the MISFETQ1, respectively.

In the intermediate breakdown voltage MISFET formation region 1B, the semiconductor regions for the source and drain of the MISFETQ2 are formed on both sides (both sides in the gate length direction) of the gate electrode GE2 in the semiconductor substrate SUB. Each of the semiconductor regions for the source or drain of the MISFETQ2 is formed of the extension region EX2 and the source/drain region SD2 having a higher impurity concentration than that of the extension region. That is, in the semiconductor substrate SUB within the intermediate breakdown voltage MISFET formation region 1B, (a pair of) the extension regions EX2 are formed in respective regions spaced apart from each other via a channel formation region. The source and drain regions SD2 each having a higher impurity concentration than that of the extension region EX2 are formed outside the respective extension regions EX2 (on the side apart from the channel formation region). Thus, the extension region EX2 is adjacent to the channel formation region, and the source/drain region SD2 is spaced apart from the channel formation region by the extension region EX2, and adjacent to the extension region EX2. The part of the semiconductor substrate SUB under the gate electrode GE2 becomes a region where the channel of the MISFETQ2 (channel formation region) is formed. The gate electrode GE2 and the gate insulating film GI2 under the gate electrode GE2 serve as the gate electrode and the gate insulating film of the MISFETQ2, respectively.

In the high breakdown voltage MISFET formation region 1C, the semiconductor regions for the source and drain of the MISFETQ3 are formed on both sides (both sides in the gate length direction) of the gate electrode GE3 in the semiconductor substrate SUB. Each of the semiconductor regions for the source or drain of the MISFETQ3 is formed of the extension region EX3 and the source/drain region SD3 having a higher impurity concentration than that of the extension region. That is, in the semiconductor substrate SUB within the high breakdown voltage MISFET formation region 1C, (a pair of) the extension regions EX3 are formed in respective regions spaced apart from each other via a channel formation region. The source and drain regions SD3 each having a higher impurity concentration than that of the extension region EX3 are formed outside the respective extension regions EX3 (on the side apart from the channel formation region). Thus, the extension region EX3 is adjacent to the channel formation region, and the source/drain region SD3 is spaced apart from the channel formation region by the extension region EX3, and adjacent to the extension region EX3. The part of the semiconductor substrate SUB under the gate electrode GE3 becomes a region where the channel of the MISFETQ3 (channel formation region) is formed. The gate electrode GE3 and the gate insulating film GI3 under the gate electrode GE3 serve as the gate electrode and the gate insulating film of the MISFETQ3, respectively.

As mentioned above, the widths T1a and T1b of the sidewall spacers SW2a and SW2b are smaller than the width T1c of the sidewall spacer SW2c (T1a<T1c, and T1b<T1c). Reflecting the above arrangement, the distance (gap) between the source/drain region SD1 and the channel formation region (channel formation region directly under the gate electrode GE1) in the low breakdown voltage MISFET formation region 1A is smaller than that between the source/drain region SD3 and the channel formation region (channel formation region directly under the gate electrode GE3) in the high breakdown voltage MISFET formation region 1C. Thus, the width (size) of the extension region EX1 measured in the gate length direction of the gate electrode GE1 is smaller than that of the extension region EX3 measured in the gate length direction of the gate electrode GE3. The distance (gap) between the source/drain region SD2 and the channel formation region (channel formation region directly under the gate electrode GE2) in the intermediate breakdown voltage MISFET formation region 1B is smaller than that between the source/drain region SD3 and the channel formation region (channel formation region directly under the gate electrode GE3) in the high breakdown voltage MISFET formation region 1C. Thus, the width (size) of the extension region EX2 measured in the gate length direction of the gate electrode GE2 is smaller than that of the extension region EX3 measured in the gate length direction of the gate electrode GE3.

Figure 24:
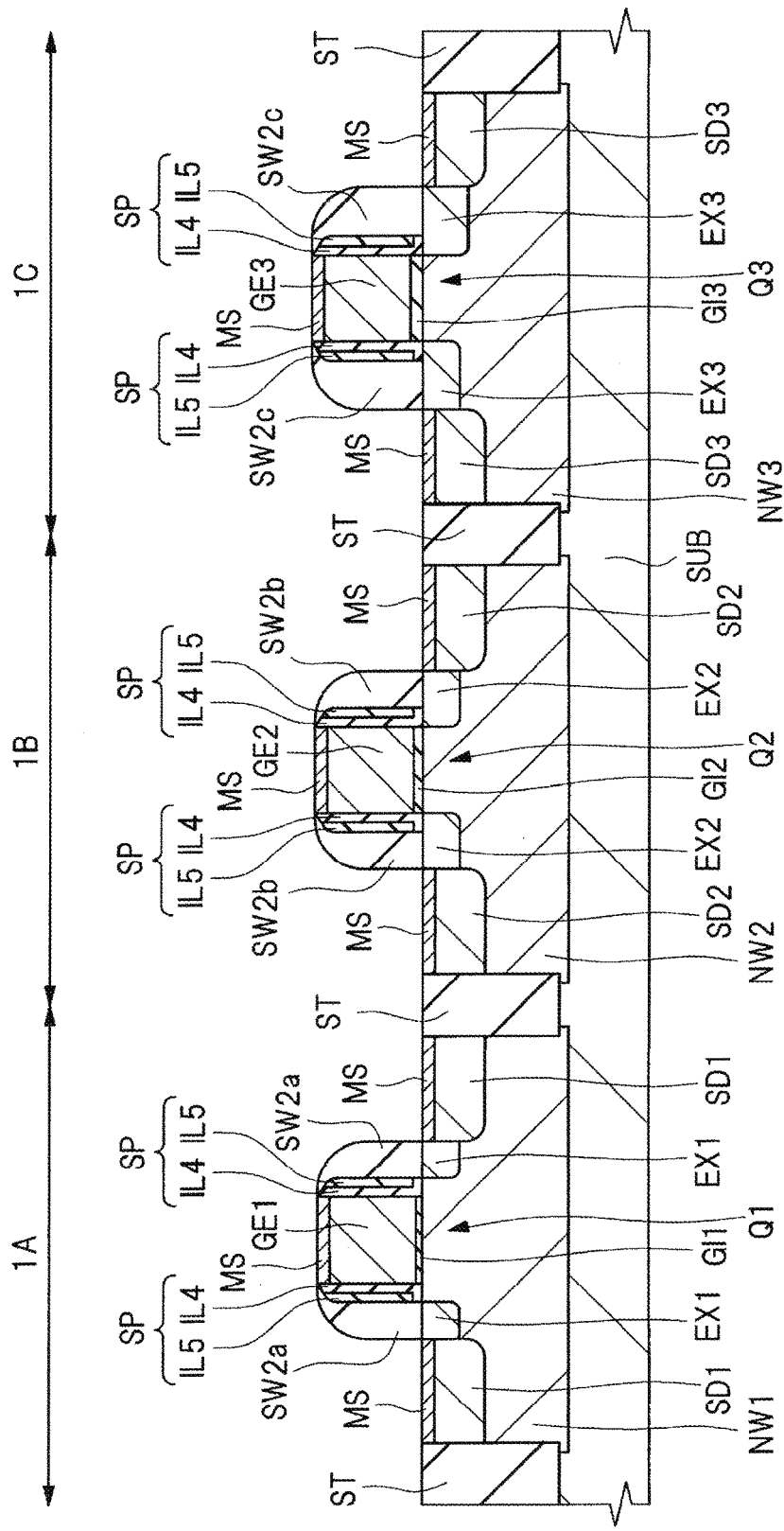
FIG. 24 is a cross-sectional view of a main part of another manufacturing step of the semiconductor device, following the step shown in FIG. 23.

Then, as shown in FIG. 24, a metal salicide layer MS having a low resistance is formed over the front surface (superficial layer, upper layer) of each of the gate electrodes GE1, GE2, and GE3 and the source and drain regions SD1, SD2, and SD3 by a self-aligned silicide (Salicide) technique (in step S18 shown in FIG. 2).

After exposing the front surface (upper surface) of each of the gate electrodes GE1, GE2, and GE3 and the source and drain regions SD1, SD2, and SD3, for example, a metal film, such as a cobalt film, a nickel film, or a nickel platinum alloy film, is formed over the semiconductor substrate SUB to cover the gate electrode GE1, GE2, and GE3 and the sidewall spacers SW2a, SW2b, and SW2c.

Then, the heat treatment is performed on the substrate to react the metal film with the upper layers of the gate electrode GE1, GE2, and GE3 and the source and drain regions SD1, SD2, and SD3. As a result, the metal silicide layer MS can be formed over the front surface (front layer part, upper layer) of each of the gate electrodes GE1, GE2, and GE3 and the source and drain regions SD1, SD2, and SD3. Thereafter, the non-reacted metal film is removed, which is illustrated in FIG. 24. The formation of the metal silicide layer MS can decrease the resistance, including diffusion resistance or contact resistance of the source and drain regions SD1, SD2, and SD3.

Figure 25:
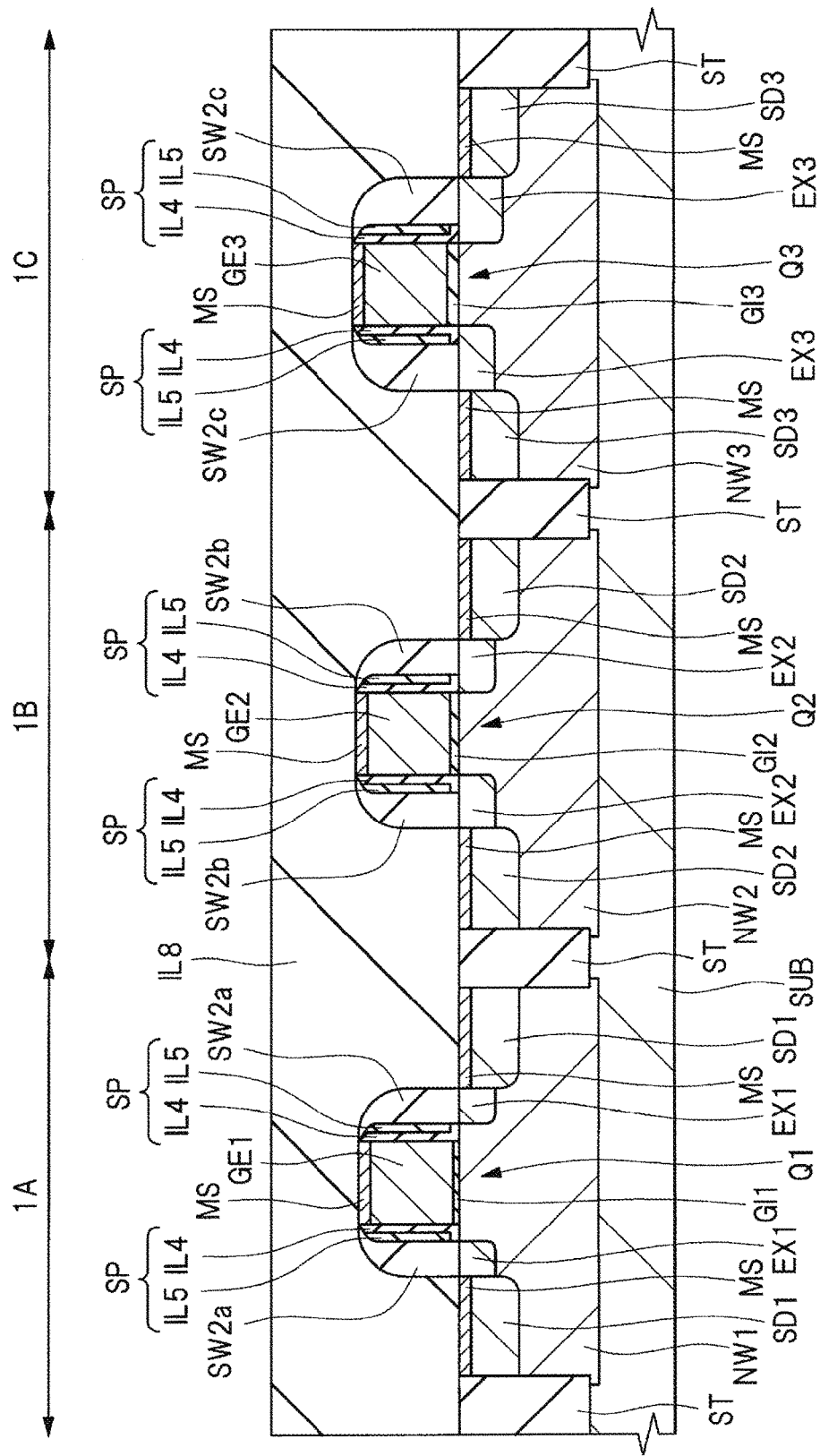
FIG. 25 is a cross-sectional view of a main part of another manufacturing step of the semiconductor device, following the step shown in FIG. 24.

Then, as shown in FIG. 25, an insulating film (interlayer insulating film) IL8 is formed over the main surface of the semiconductor substrate SUB. That is, the insulating film IL8 is formed over the semiconductor substrate SUB including the metal silicide layer MS to cover the gate electrodes GE1, GE2, and GE3 and the sidewall spacers SW2a, SW2b, and SW2c. The insulating film IL8 is formed of, for example, a single silicon oxide film, or a lamination of a silicon nitride film and a silicon oxide film thicker than the silicon nitride film (the silicon nitride film being located as a lower layer, and the silicon oxide film being located as an upper layer). Then, by polishing the front surface (upper surface) of the insulating film IL8 by the CMP method, the upper surface of the insulating film IL8 is planarized. Even when the concavities and convexities are formed on the surface of the insulating film IL8 due to the presence of bumps of the underlayer, the interlayer insulating film having a flat surface can be obtained by polishing the front surface of the insulating film IL8 by the CMP method.

Figure 26:
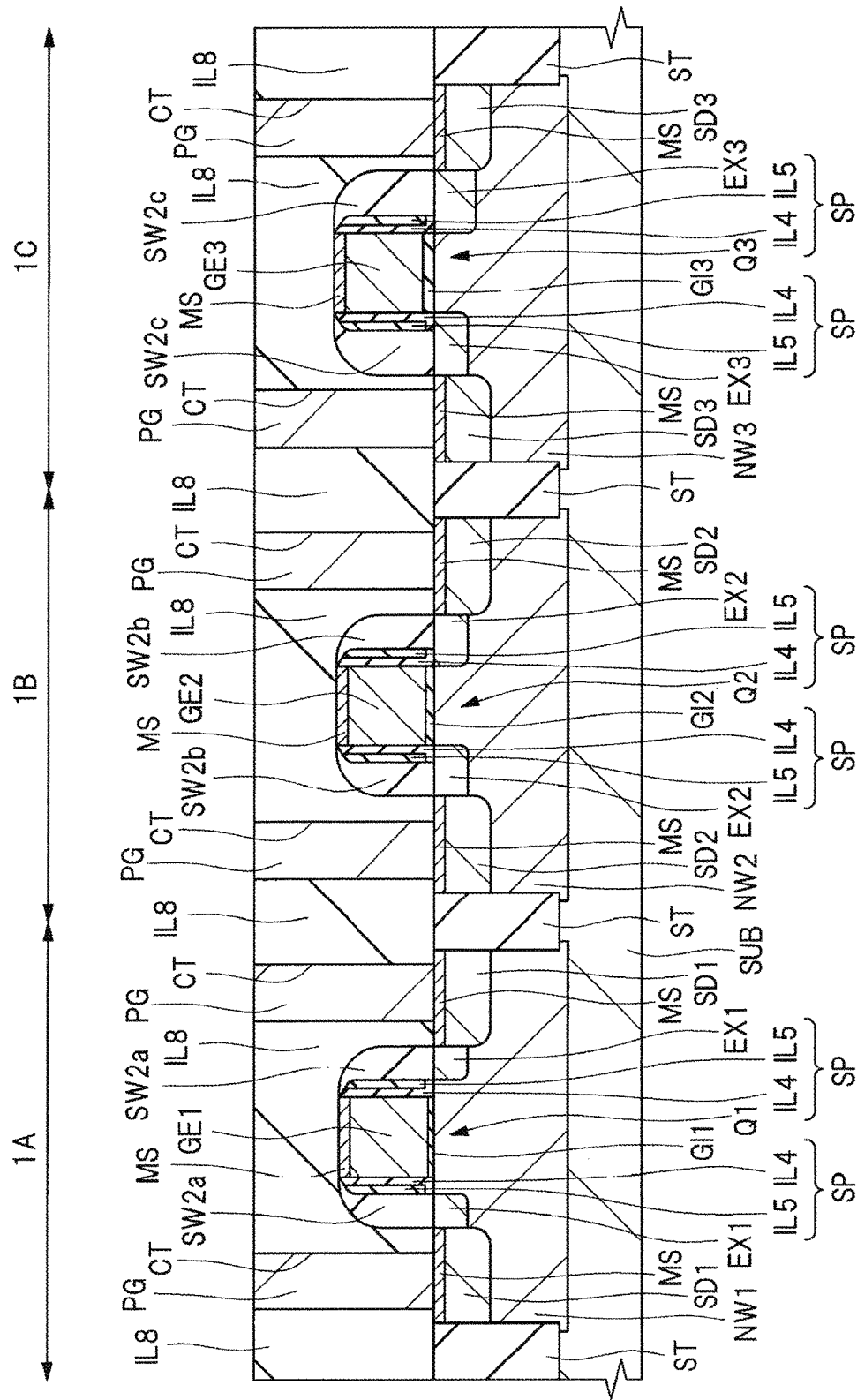
FIG. 26 is a cross-sectional view of a main part of another manufacturing step of the semiconductor device, following the step shown in FIG. 25.

Then, as shown in FIG. 26, the insulating film IL8 is dry etched using a photoresist layer (not shown) formed over the insulating film IL8 as an etching mask to thereby form contact holes (through holes, openings) CT in the insulating film IL8. Parts of the main surface of the semiconductor substrate SUB, for example, parts of the metal silicide layer MS over the front surface of each of the source and drain regions SD1, SD2, and SD3, and parts of the metal silicide layer MS on the front surface of the gate electrodes GE1, GE2, and GE3, are exposed at the bottoms of the contact holes CT.

Then, a conductive plug (conductor for connection) PG is formed of tungsten (W) in each contact hole CT. In order to form the plug PG, for example, a barrier conductive film (for example, a titanium film, a titanium nitride film, or a lamination thereof) is formed over the insulating film IL8 including the inside (bottom and sidewalls) of each contact hole CT by sputtering or plasma CVD method. Then, the main conductive film is formed of a tungsten film over the barrier conductive film by the CVD method to fill in the contact hole CT. Then, unnecessary parts of the main conductive film and barrier conductive film located outside the contact hole CT (over the insulating film IL8) are removed by the CMP method or etching back. As a result, the upper surface of the insulating film IL8 is exposed, and the plug PG is formed of the barrier conductive film and the main conductive film filling and remaining in the contact hole CT of the insulating film IL8. For simplifying the figure, as shown in FIG. 26, the plug PG is illustrated to be comprised of integration of the main conductive film and the barrier conductive film. The plug PG is electrically coupled to the metal silicide layer MS at its bottom over the front surface of each of the gate electrode GE1, GE2, and GE3, and the source and drain regions SD1, SD2, and SD3.

Figure 27:
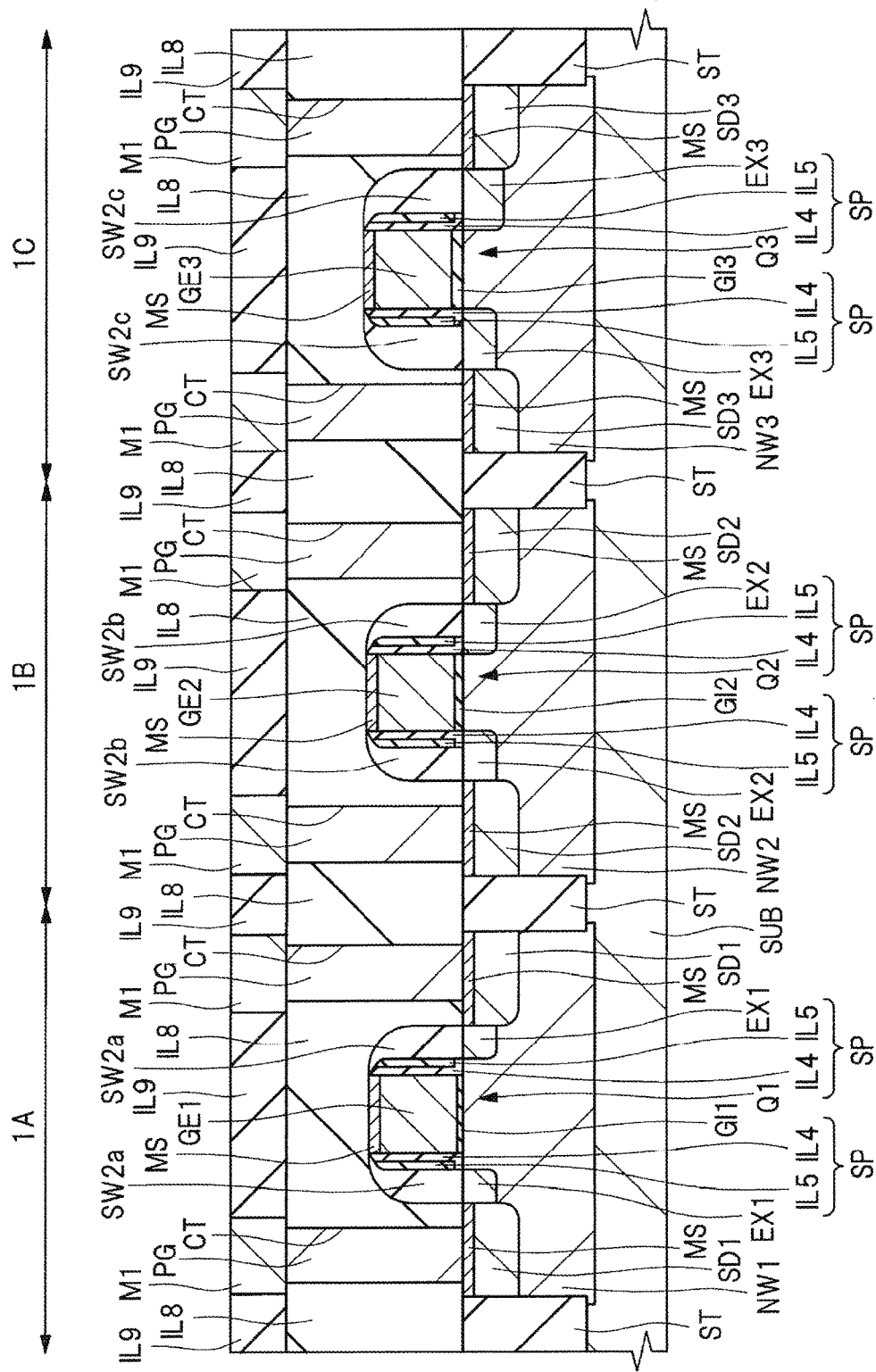
FIG. 27 is a cross-sectional view of a main part of another manufacturing step of the semiconductor device, following the step shown in FIG. 26.

Then, as shown in FIG. 27, an insulating film IL9 for formation of wirings is formed over the insulating film IL8 with the plugs PG embedded therein. The insulating film IL9 can be a single film (single insulating film) or a laminated film (laminated insulating film).

Then, a wiring M1 is formed as a first wiring layer by a single damascene method. Specifically, the wiring M1 can be formed in the following way. First, a wiring trench is formed in a predetermined region of the insulating film IL9 by dry etching using a photoresist layer (not shown) as a mask. Then, a barrier conductive film (for example, a titanium nitride film, a tantalum film, or a tantalum nitride film) is formed over the insulating film IL9 including the bottom and sidewalls of the wiring trench. Subsequently, a copper seed layer is formed over the barrier conductive film by the CVD or sputtering, and then a copper plating film is formed over the seed layer by electrolytic plating or the like, so that the copper plating film fills the trench. Thereafter, the main conductive film (copper plating film and seed layer) and barrier conductive film except for those located in the wiring trenches are removed by the CMP method to thereby form the first wiring layer M1 filled in the wiring trench and containing copper as a main conductive material. For simplifying the figure, FIG. 27 shows integration of the copper plating film, the seed layer, and the barrier metal film as the wiring M1.

The wiring M1 is coupled to the plug PG, and electrically coupled to the source/drain region SD1, SD2, or SD3, or the gate electrode GE1, GE2, or GE3 via the plug PG.

Thereafter, a second wiring layer is formed by the dual damascene method. However, the illustration and description thereof will be omitted below. Wirings following the first wiring layer M1 and the second wiring layer are not limited to a damascene wiring. The wiring can also be formed by patterning a conductive film for wiring, and can be, for example, a tungsten wiring or aluminum wiring.

In the way described above, the semiconductor device of this embodiment is manufactured.

<Manufacturing Procedure of Semiconductor Device in Examined Examples>

Next, examples examined by the inventors will be described.

FIGS. 28 to 31 are cross-sectional views of main parts of manufacturing steps of the semiconductor device in a first examined example. In the first examined example, the semiconductor substrate SUB 101 corresponding to the semiconductor substrate SUB of this embodiment includes a low breakdown voltage MISFET formation region 101A in which the MISFET having a low breakdown voltage is formed, and a high breakdown voltage MISFET formation region 101C in which the MISFET having a high breakdown voltage is formed.

Figure 28:
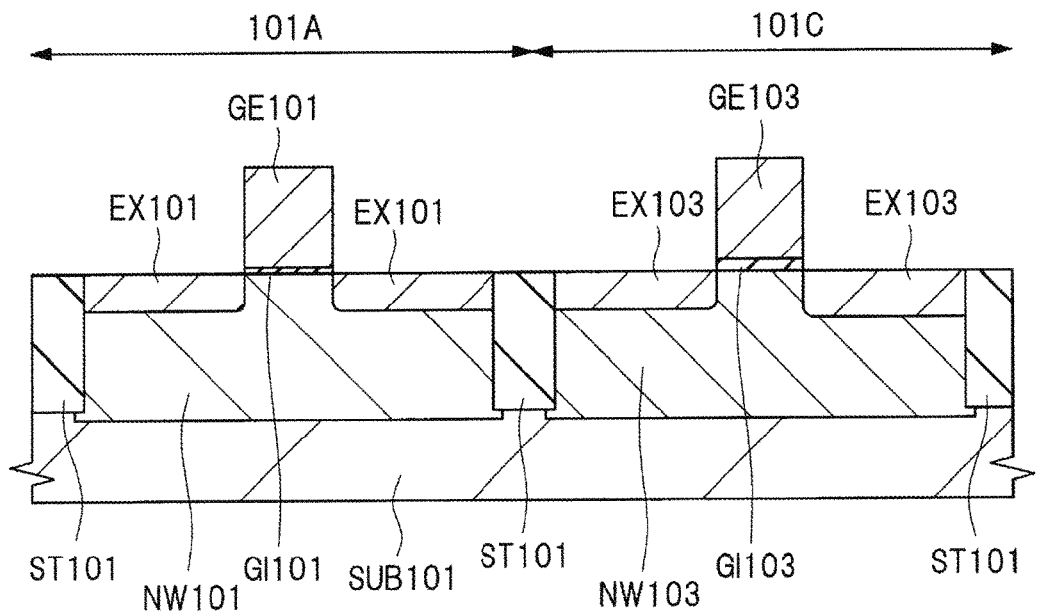
FIG. 28 is a cross-sectional view of a main part of one manufacturing step of the semiconductor device in a first examined example.

In the first examined example, as shown in FIG. 28, element isolation regions ST101 corresponding to the element isolation regions ST are formed over the semiconductor substrate SUB101. An n-type well NW101 is formed in the semiconductor substrate SUB101 within the low breakdown voltage MISFET formation region 101A. An n-type well NW103 is formed in the semiconductor substrate SUB101 within the high breakdown voltage MISFET formation region 101C. A gate electrode GE101 is formed over the semiconductor substrate SUB101 (n-type well NW101) within the low breakdown voltage MISFET formation region 101A via the gate insulating film GI101. A gate electrode GE103 is formed over the semiconductor substrate SUB101 (n-type well NW103) within the high breakdown voltage MISFET formation region 101C via the gate insulating film GI103. The thickness of the gate insulating film GI103 is larger than that of the gate insulating film GI101. A p⁻-type extension region EX101 is formed in the semiconductor substrate SUB101 within the low breakdown voltage MISFET formation region 101A by ion implantation. A p⁻-type extension region EX103 is formed in the semiconductor substrate SUB101 within the high breakdown voltage MISFET formation region 101C by ion implantation.

After obtaining the structure shown in FIG. 28 in this way, sidewall spacers SW102a and SW102c are formed over the sidewalls of the gate electrodes GE101 and GE103, respectively. The sidewall spacers SW102a and SW102c are formed in the following way.

Figure 29:
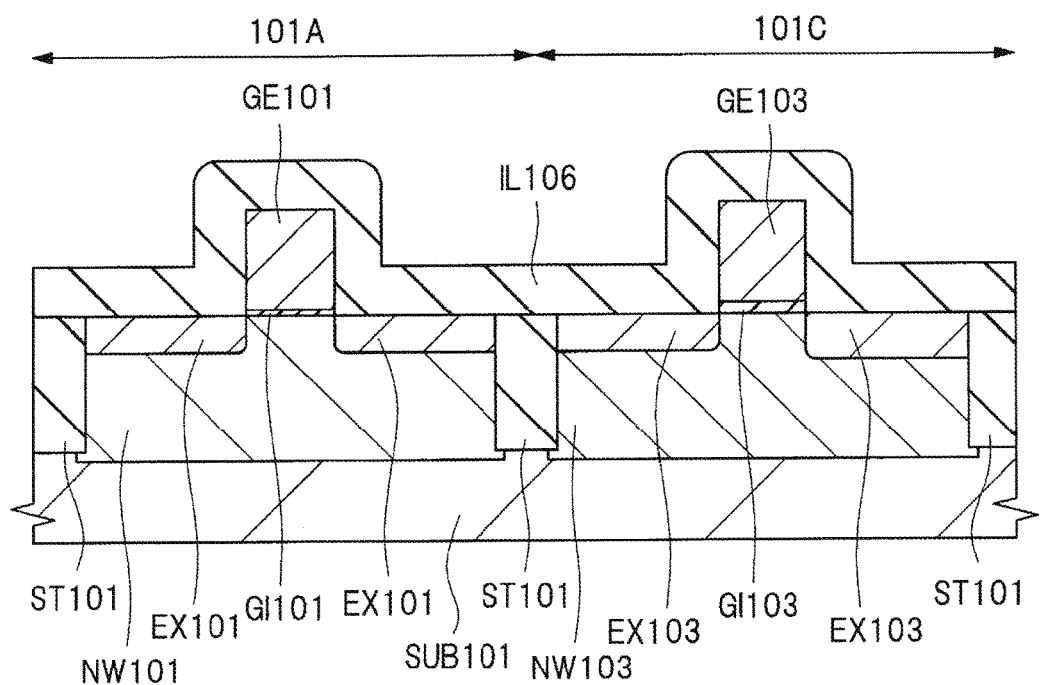
FIG. 29 is a cross-sectional view of a main part of another manufacturing step of the semiconductor device in a first examined example, following the step shown in FIG. 28.
Figure 30:
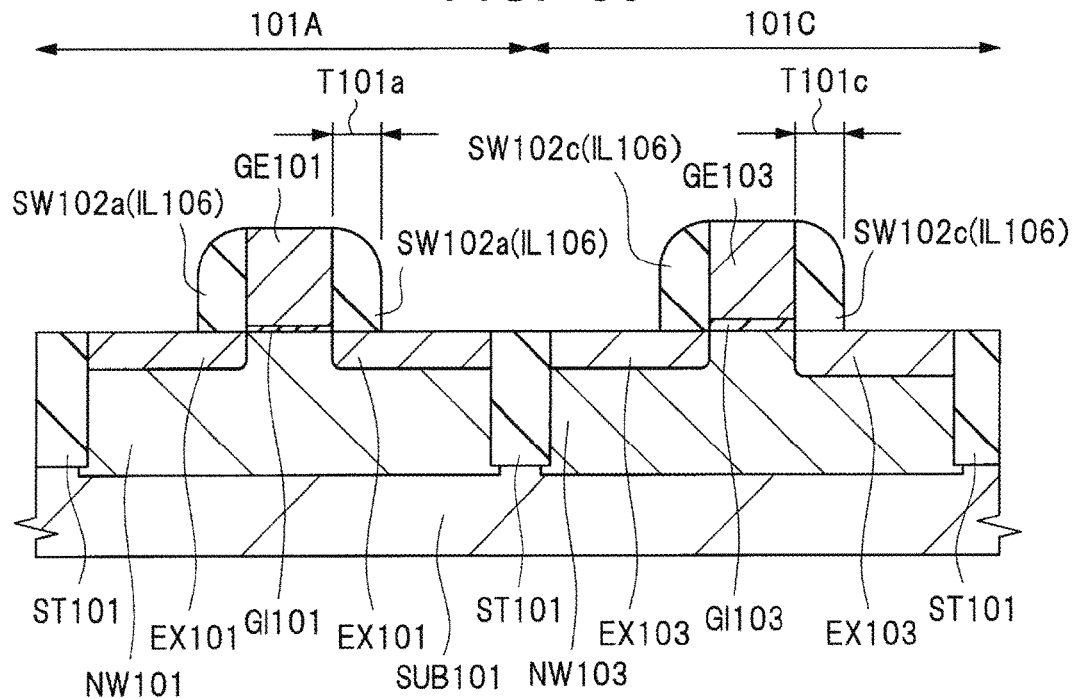
FIG. 30 is a cross-sectional view of a main part of another manufacturing step of the semiconductor device in a first examined example, following the step shown in FIG. 29.

First, as shown in FIG. 29, an insulating film IL106 is formed over the semiconductor substrate SUB101 to cover the gate electrodes GE101 and GE103. Then, as shown in FIG. 30, the insulating film IL106 is etched back by anisotropic etching to leave the insulating film IL106 over each sidewall of the gate electrodes GE101 and GE103 and to remove the insulating film IL106 in the remaining regions. Thus, the sidewall spacers SW102a and SW102c are formed which include the insulating film IL106 remaining over the sidewalls of the gate electrodes GE101 and GE103. The sidewall spacer SW102a is formed over each sidewall of the gate electrode GE101. The sidewall spacer SW102c is formed over each sidewall of the gate electrode GE103.

Figure 31:
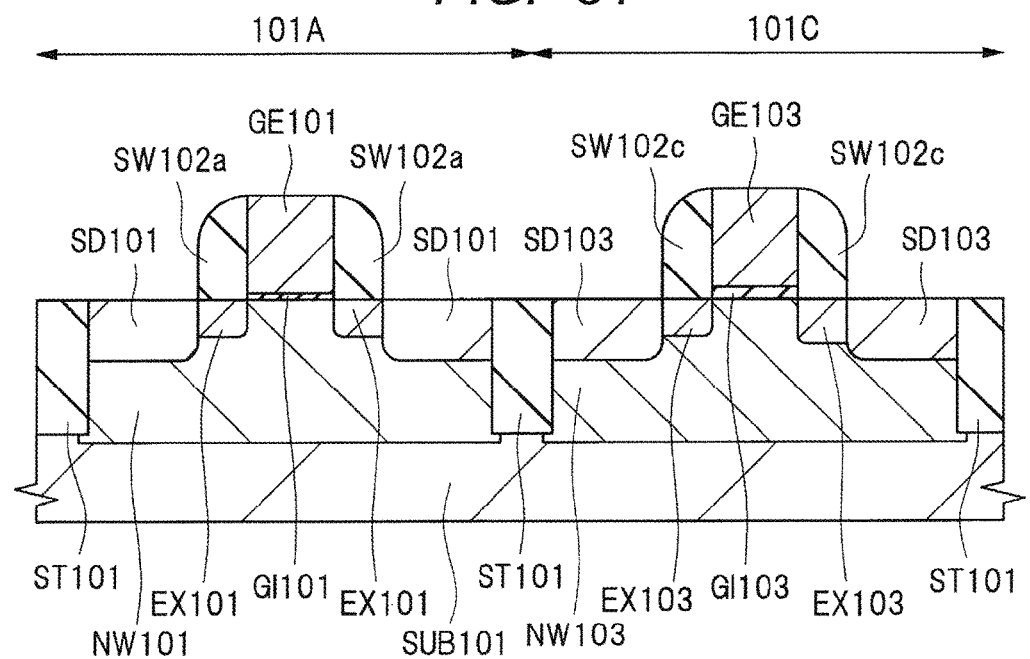
FIG. 31 is a cross-sectional view of a main part of another manufacturing step of the semiconductor device in a first examined example, following the step shown in FIG. 30.

After forming the sidewall spacers SW102a and SW102c in this way, as shown in FIG. 31, the source and drain regions SD101 and SD103 are formed by the ion implantation. The source/drain regions SD101 is a semiconductor region having the same conduction type (herein, the p-type) as the extension region EX101, and having a higher concentration of impurities than that of the extension region EX103.

The source/drain region SD103 is a semiconductor region having the same conduction type (herein of the p-type) as the extension region EX103, and having a higher concentration of impurities than that of the extension region EX101.

In the ion implantation for forming the source and drain regions SD101, the gate electrode GE101 and the sidewall spacers SW102a over the sidewalls thereof in the low breakdown voltage MISFET formation region 101A can serve as the mask (ion implantation blocking mask). Thus, in the low breakdown voltage MISFET formation region 101A, the source/drain region SD101 is formed to be aligned (self-aligned) to the side surface of the sidewall spacer SW102a over the sidewall of the gate electrode GE101. In the ion implantation for forming the source and drain regions SD103, the gate electrode GE103 and the sidewall spacers SW102c over the sidewalls thereof in the high breakdown voltage MISFET formation region 101C can serve as the mask (ion implantation blocking mask). Thus, the source/drain regions SD103 in the high breakdown voltage MISFET formation region 101C are formed to be aligned (self-aligned) with the side surfaces of the sidewall spacers SW102c over the sidewalls of the gate electrode GE103.

Thereafter, the salicide process form those corresponding to the metal silicide layer MS, the insulating film IL8, the contact hole CT, and the plug PG. The illustration and description thereof will be omitted below.

In the first examined example shown in FIGS. 28 to 31, the width T101a of the sidewall spacer SW102a formed over the sidewall of the gate electrode GE101 in the low breakdown voltage MISFET formation region 101A is the same as the width T101c of the sidewall spacer SW102c formed over the sidewall of the gate electrode GE103 in the high breakdown voltage MISFET formation region 101C (that is, T101a=T101c).

In the first examined example, the insulating film IL106 is formed to have the same thickness between in the low breakdown voltage MISFET formation region 101A and the high breakdown voltage MISFET formation region 101C. The insulating film IL106 is etched back to have the same etched state between in the low breakdown voltage MISFET formation region 101A and the high breakdown voltage MISFET formation region 101C. The width T101c of the sidewall spacer SW102c is the same as the width T101a of the sidewall spacer SW102a (that is, T101c=T101a).

In order to improve the performance of the semiconductor device as much as possible, however, the width of the sidewall spacer formed on each sidewall of the gate electrodes is required to differ according to the type of the MISFET.

For example, the low breakdown voltage MISFET is required to enhance the current driving force, whereas the high breakdown voltage MISFET is required to enhance the breakdown voltage. Desirably, a certain distance between the source/drain region SD103 and the channel formation region in the high breakdown voltage MISFET is ensured, while a distance between the source/drain region SD101 and the channel formation region in the low breakdown voltage MISFET is not excessively large. Thus, the distance between the source/drain region SD103 and the channel formation region in the high breakdown voltage MISFET can be preferably larger than that between the source/drain region SD101 and the channel formation region in the low breakdown voltage MISFET to thereby improve the total performance of the semiconductor device.

However, when the width T101c of the sidewall spacer SW102c is set the same as the width T101a of the sidewall spacers SW102a (T101c=T101a), the distance between the channel formation region and the source/drain region (SD101, SD103) in the low breakdown voltage MISFET becomes the same as that in the high breakdown voltage MISFET.

For this reason, a technique is studied for differing the width of the sidewall spacer formed over the sidewall of the gate electrode between the low breakdown voltage MISFET formation region 101A and the high breakdown voltage MISFET formation region 101c. FIGS. 32 to 37 are cross-sectional views of main parts of manufacturing steps of the semiconductor device in a second studied example.

The second examined example can obtain the structure shown in FIG. 28 in the same way as the first example. In the second examined example, as shown in FIGS. 32 to 36, the sidewall spacers SW202a and SW202c are formed over the sidewalls of the gate electrodes GE101 and GE103. The formation of sidewall spacers SW202a and SW202c will be specifically described below.

Figure 32:
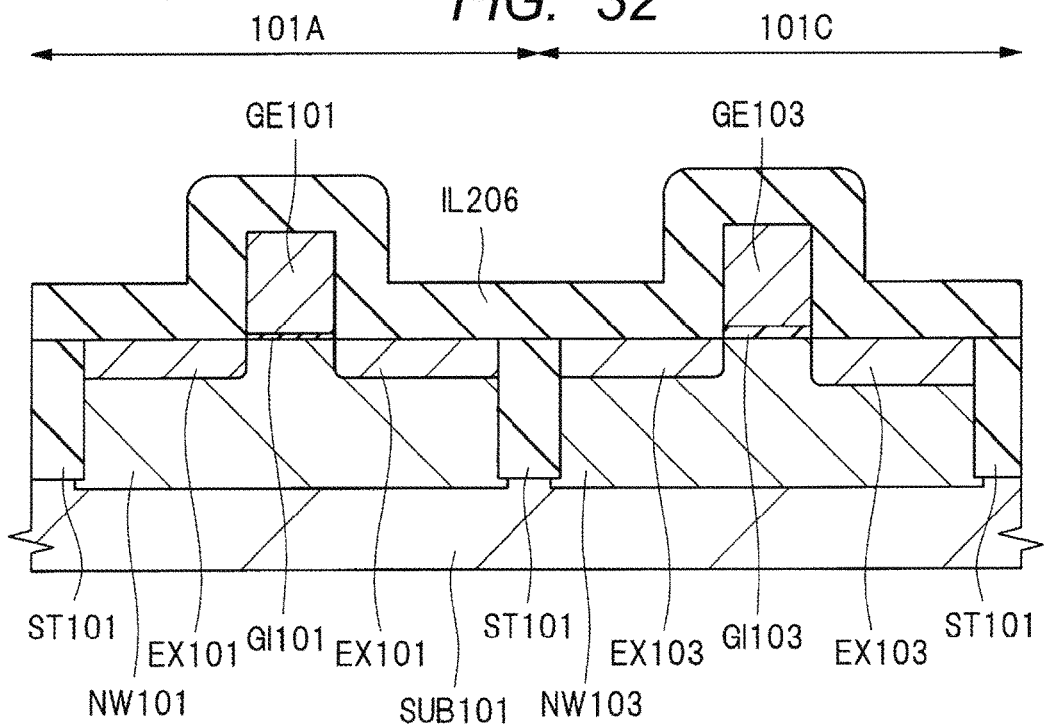
FIG. 32 is a cross-sectional view of a main part of one manufacturing step of the semiconductor device in a second examined example.
Figure 33:
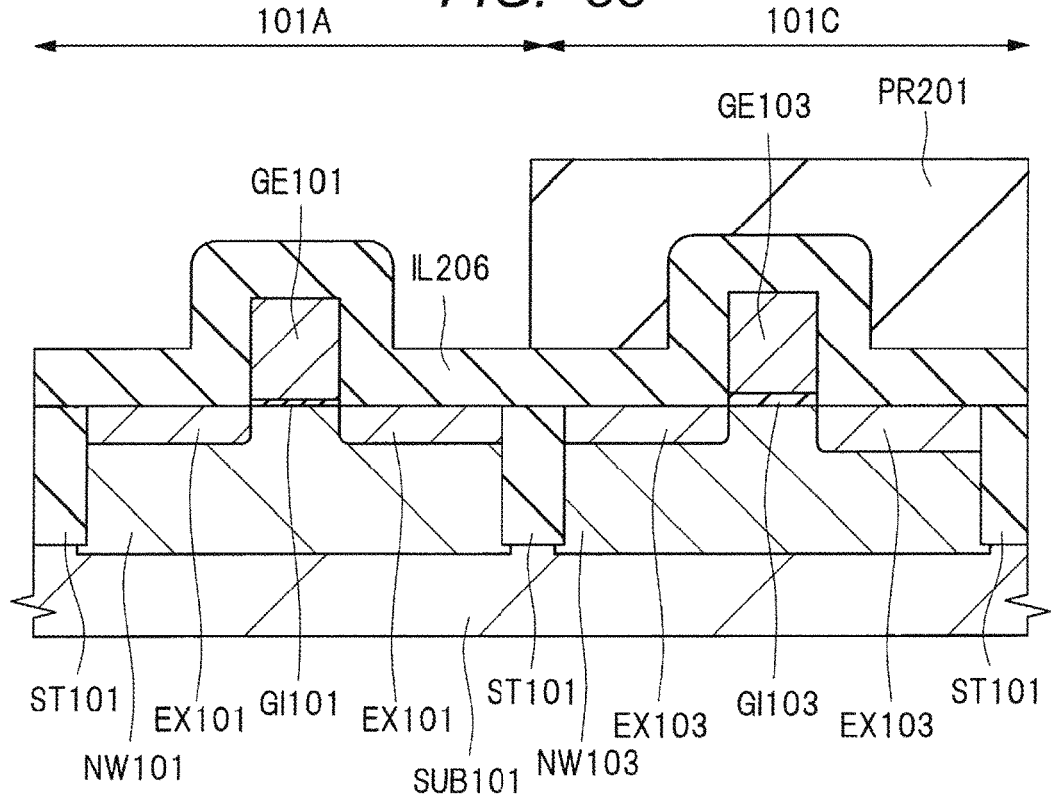
FIG. 33 is a cross-sectional view of a main part of another manufacturing step of the semiconductor device in the second examined example, following the step shown in FIG. 32.

First, as shown in FIG. 32, an insulating film IL206 is formed over the semiconductor substrate SUB101 to cover the gate electrodes GE101 and GE103. Then, as shown in FIG. 33, a photoresist layer PR201 is formed over the insulating film IL206 to cover the high breakdown voltage MISFET formation region 101C and to expose the low breakdown voltage MISFET formation region 101A.

Figure 34:
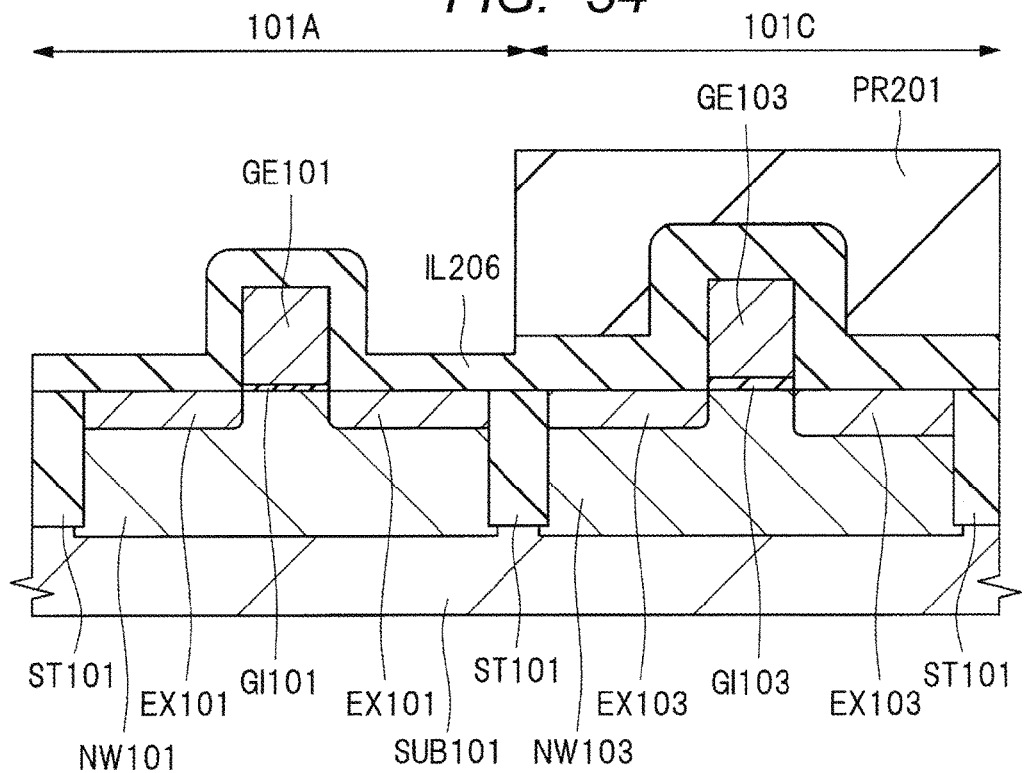
FIG. 34 is a cross-sectional view of a main part of another manufacturing step of the semiconductor device in the second examined example, following the step shown in FIG. 33.

Then, as shown in FIG. 34, the insulating film IL206 is etched using the photoresist layer PR201 as a mask (etching mask). At this time, the etching is not performed through the entire thickness of the insulating film IL206, but continued halfway through the entire thickness of the insulating film IL206. As a result, the insulating film IL206 in the high breakdown voltage MISFET formation region 101C is not etched, but the insulating film IL206 in the low breakdown voltage MISFET formation region 101A is continuously etched up to the halfway through the entire thickness of the insulating film. Thus, a thickness T201a of the insulating film IL206 in the low breakdown voltage MISFET formation region 101A is thinner than a thickness T201c of the insulating film IL206 in the high breakdown voltage MISFET formation region 101C. That is, T201a<T201c. The thicknesses T201a and T201c are shown in FIG. 35.

Figure 35:
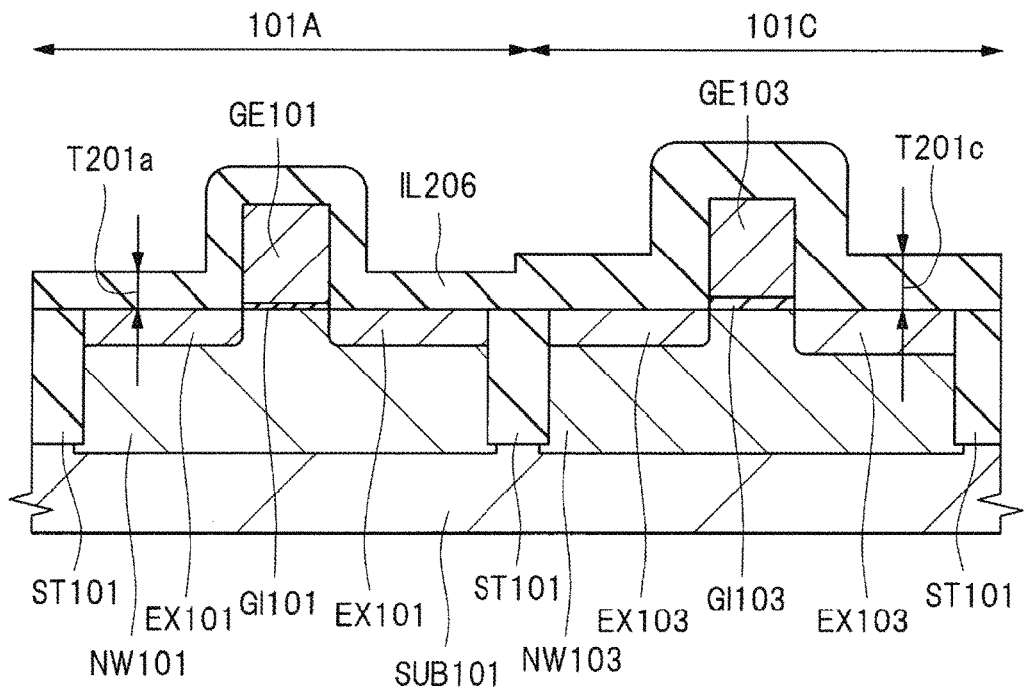
FIG. 35 is a cross-sectional view of a main part of another manufacturing step of the semiconductor device in the second examined example, following the step shown in FIG. 34.
Figure 36:
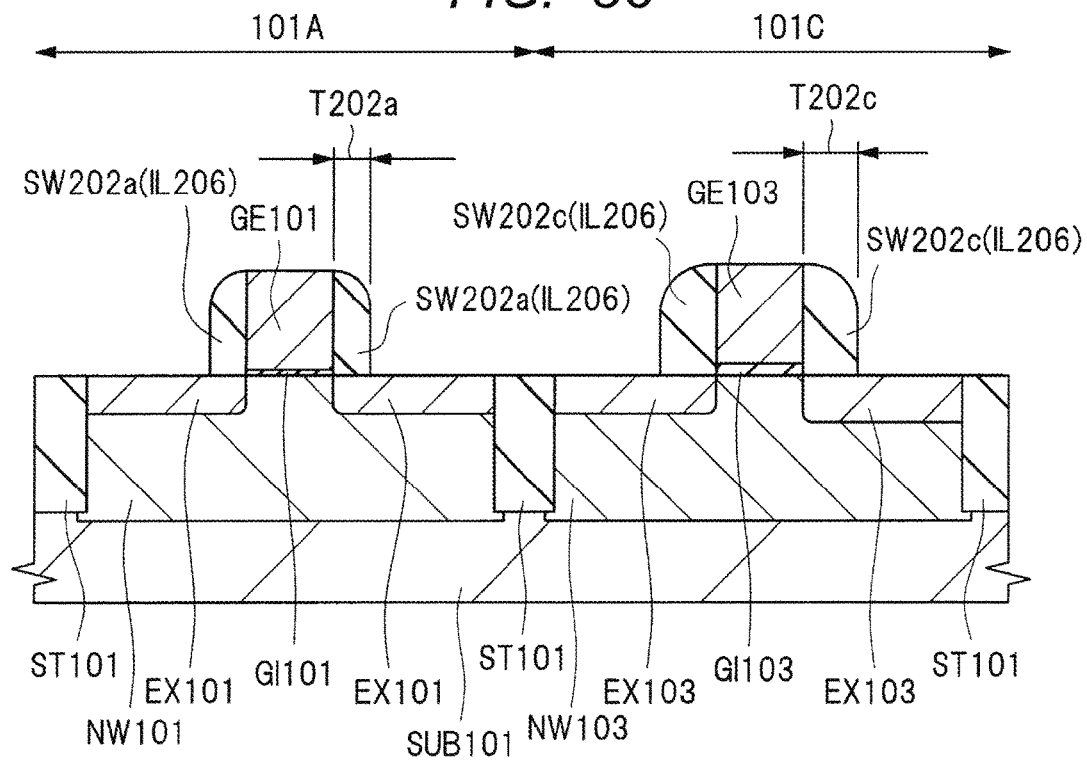
FIG. 36 is a cross-sectional view of a main part of another manufacturing step of the semiconductor device in the second examined example, following the step shown in FIG. 35.

Thereafter, as shown in FIG. 35, the photoresist layer PR201 is removed. As shown in FIG. 36, the insulating film IL206 is etched back to leave the insulating film IL206 over each sidewall of the gate electrodes GE101 and GE103 and to remove the insulating film IL206 located in the remaining regions. Thus, the sidewall spacers SW202a and 202c are formed of the insulating film IL206 remaining over the sidewalls of the gate electrodes GE101 and GE103. The sidewall spacers SW202a are formed over the sidewalls of the gate electrode GE101, and the sidewall spacers SW202c are formed over the sidewalls of the gate electrode GE103.

Figure 37:
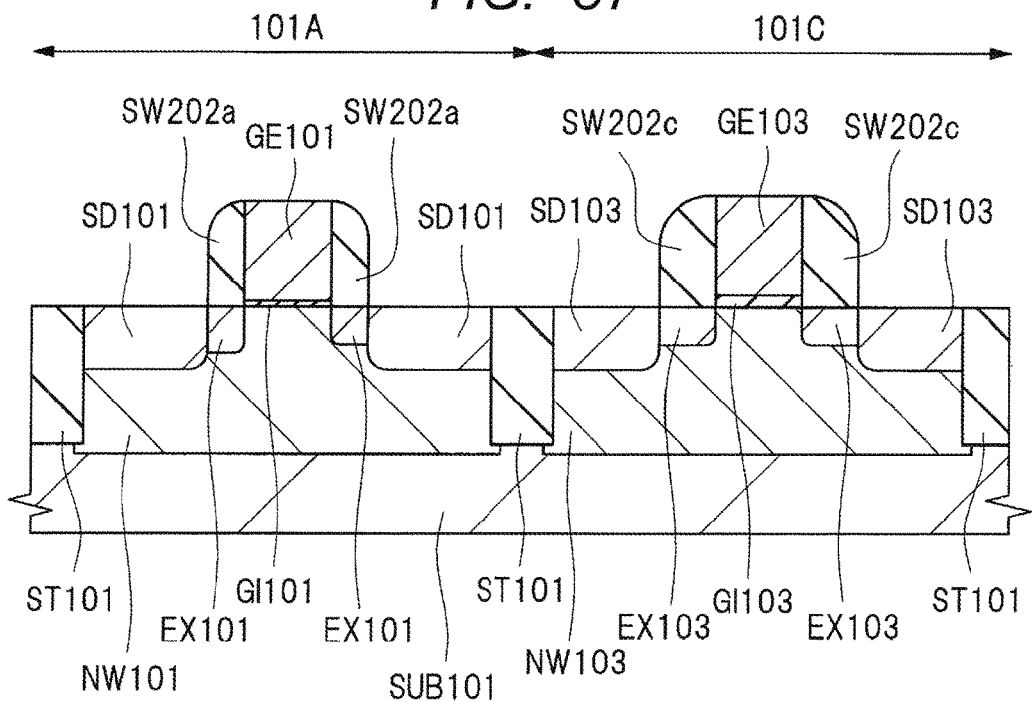
FIG. 37 is a cross-sectional view of a main part of another manufacturing step of the semiconductor device in the second examined example, following the step shown in FIG. 36.

After forming the sidewall spacers SW202a and SW202c in this way, manufacturing steps in the second examined example are the same as those in the first examined example. That is, like the first examined example, the second examined example also form the source and drain regions SD101 and SD103 by the ion implantation as shown in FIG. 37.

In the second examined example shown in FIGS. 32 to 37, the insulating film IL206 in the low breakdown voltage MISFET formation region 101A is formed to have substantially the same thickness as that in the high breakdown voltage MISFET formation region 101C (see FIG. 32). Then, the thickness T201a of the insulating film IL206 in the low breakdown voltage MISFET formation region 101A is thinner than the thickness T201c of the insulating film IL106 in the high breakdown voltage MISFET formation region 101C (see FIG. 34). Thereafter, the insulating film IL206 is etched back to thereby form the sidewall spacers SW202a and SW202c. The difference between the thicknesses T201a and T201c of the insulating film IL206 reflects the widths T202a and T202c of the sidewall spacers SW202a and SW202c, respectively. As a result, the width T202a of the sidewall spacer SW202a in the low breakdown voltage MISFET formation region 101A can be made smaller than the width T202c of the sidewall spacer SW202c in the high breakdown voltage MISFET formation region 101C (T202a<T202c).

In the second examined example, however, as shown in FIG. 35, the thickness T201a of the insulating film IL206 in the low breakdown voltage MISFET formation region 101A is made thinner than the thickness T201c of the insulating film IL106 in the high breakdown voltage MISFET formation region 101C, and then the insulating film IL206 is etched back to thereby form sidewall spacers SW202a and SW202c as shown in FIG. 36. Thus, in the etching back process of the insulating film IL206 shown in FIG. 36, the etching is continued also in the low breakdown voltage MISFET formation region 101A until the insulating film IL206 located in a region other than the sidewalls of the gate electrode GE103 in the high breakdown voltage MISFET formation region 101C is removed. As a result, the thickness 201a of the insulating film IL206 in the low breakdown voltage MISFET formation region 101A is thinner than the thickness T201c of the insulating film IL106 in the high breakdown voltage MISFET formation region 101C. Thus, even after the insulating film IL206 in the region other than the sidewalls of the gate electrode GE101 in the low breakdown voltage MISFET formation region 101A is completely removed, the etching process might be continued. This leads to overetching of the semiconductor substrate SUB101 in the low breakdown voltage MISFET formation region 101A, causing the damage on the semiconductor substrate SUB101, which might reduce the performance or reliability of the MISFET formed in the low breakdown voltage MISFET formation region 101A. This might also lead to the reduction in reliability of the manufactured semiconductor device.

<Main Features and Effects of Present Embodiments>

In this embodiment, in step S11, the insulating film IL6 is formed over the semiconductor substrate SUB to cover the gate electrodes GE1, GE2, and GE3, and then in step S12, the insulating film IL7 is formed of different material from that of the insulating film IL6, over the insulating film IL6. Then, in step S13, the insulating film IL7 is etched back to thereby form the sidewall spacers SW1a, SW1b, and SW1c serving as the sidewall insulating film. The sidewall spacers SW1a, SW1b, and SW1c each are formed of the insulating film IL7 remaining on the respective side surfaces IL6a of the insulating films IL6. Among the sidewall spacers, the sidewall spacer SW1a is formed over the side surface IL6a of the insulating film IL6 corresponding to each sidewall of the gate electrode GE1. The sidewall spacer SW1b is formed over the side surface IL6a of the insulating film IL6 corresponding to each sidewall of the gate electrode GE2. The sidewall spacer SW1c is formed over the side surface IL6a of the insulating film IL6 corresponding to each sidewall of the gate electrode GE3. In step S14, the sidewall spacers SW1a and SW1b are removed to leave the sidewall spacers SW1c. Thereafter, in step S15, the sidewall spacers SW1c and the insulating film IL6 are etched back to thereby form the sidewall spacers SW2a, SW2b, and SW2c over the respective sidewalls of the gate electrodes GE1, GE2, and GE3. Among the sidewall spacers, the sidewall spacer SW2a is formed of the insulating film IL6 remaining over each sidewall of the gate electrode GE1. The sidewall spacer SW2b is formed of the insulating film IL6 remaining over each sidewall of the gate electrode GE2. The sidewall spacer SW2c is formed of the insulating film IL6 remaining over each sidewall of the gate electrode GE3. The relationship among the widths T1a, T1b, and T1c of the thus-formed sidewall spacers SW2a, SW2b, and SW2c is that each of the width T1a of the sidewall spacer SW2a and the width T1b of the sidewall spacer SW2b is smaller than the width T1c of the sidewall spacer SW2c (that is, T1a<T1c, T1b<T1c).

The above and following brief description will be given about the reason why each of the width T1a of the sidewall spacer SW2a and the width T1b of the sidewall spacer SW2b is smaller than the width T1c of the sidewall spacer SW2c (that is, T1a<T1c, T1b<T1c).

That is, in steps S12 and S13, the sidewall spacers SW1a, SW1b, and SW1c are formed. In step S14, the sidewall spacers SW1a and SW1b are removed to leave the sidewall spacer SW1c. Then, in step S15, the sidewall spacer SW1c and the insulating film IL6 are etched back. Since in the etching back process of step S15, the insulating film IL6 over the sidewalls of the gate electrode GE3 is not subjected to the side etching until the sidewall spacer SW1c is removed, the amount of side etching of the insulating film IL6 over the sidewalls of the gate electrodes GE1 and GE2 is larger than that over the sidewalls of the gate electrode GE3. Such a difference in amount of the side etching of the insulating film IL6 between the gate electrodes reflect the following features: each of the width T1a of the sidewall spacer SW2a and the width T1b of the sidewall spacer SW2b is smaller than the width T1c of the sidewall spacer SW2c (that is, T1a<T1c, T1b<T1c).

In this way, this embodiment can make the width T1a of the sidewall spacer SW2a and the width T1b of the sidewall spacer SW2b smaller than the width T1c of the sidewall spacer SW2c (T1a<T1c, and T1b<T1c).

Reflecting the difference between the width T1a of the sidewall spacer SW2a and the width T1c of the sidewall spacer SW2c, a distance (specifically, the distance in the direction parallel to the gate length direction) between the source/drain region SD1 and the channel formation region in the MISFETQ1 can be smaller than that (that is, the distance in the direction parallel to the gate length direction) between the source/drain region SD3 and the channel formation region in the MISFETQ3. Reflecting the difference between the width T1b of the sidewall spacer SW2b and the width T1c of the sidewall spacer SW2c, a distance (specifically, the distance in the direction parallel to the gate length direction) between the source/drain region SD2 and the channel formation region in the MISFETQ2 can be smaller than that (specifically, the distance in the direction parallel to the gate length direction) between the source/drain region SD3 and the channel formation region in the MISFETQ3.

Thus, the size (specifically, the size in the gate length direction) of the extension region EX1 having a low impurity concentration and extending between the source/drain region SD1 and the channel formation region in the MISFETQ1 can be smaller than that (specifically, the distance in the direction parallel to the gate length direction) of the extension region EX3 having a low impurity concentration and extending between the source/drain region SD3 and the channel formation region in the MISFETQ3. Thus, the size (specifically, the size in the gate length direction) of the extension region EX2 having a low impurity concentration and extending between the source/drain region SD2 and the channel formation region in the MISFETQ2 can be smaller than that (specifically, the distance in the direction parallel to the gate length direction) of the extension region EX3 having a low impurity concentration and extending between the source/drain region SD3 and the channel formation region in the MISFETQ3.

Desirably, the MISFETQ3 can ensure a certain distance between the source/drain region SD3 and the channel formation region, and can improve its breakdown voltage. In contrast, the MISFETQ1 and Q2 can decrease the distance between the source/drain region (SD1, SD2) and the channel formation region as compared to that in the MISFETQ3 to thereby improve the current driving force of the MISFETQ1 and Q2. Thus, the total performance of the semiconductor device can be improved.

In this embodiment, in step S12, the insulating film IL7 is formed, and then in step S13, the insulating film IL7 is etched back to thereby form the sidewall spacers SW1a, SW1b, and SW1c. In step S13, in the low breakdown voltage MISFET formation region 1A, the intermediate breakdown voltage MISFET formation region 1B, and the high breakdown voltage MISFET formation region 1C, the respective insulating films IL7 except for the sidewall spacers SW1a, SW1b, SW1c are removed to expose the insulating films IL6 substantially at the same timing. Thus, the amounts of the overetching of the respective insulating films IL6 are substantially the same. In the stage where the sidewall spacers SW1a, SW1b, and SW1c are formed in step S13, the thicknesses of the respective insulating films IL6 in the low, intermediate, and high breakdown voltage MISFET formation regions 1A, 1B, and 1C can be substantially the same. Thus, in etching back the sidewall spacer SW1c and the insulating film IL6 in step S15, the insulating films IL6 located except for the sidewalls of the gate electrodes (GE1, GE2, GE3) can be removed at the same timing in the low, intermediate, and high breakdown voltage MISFET formation regions 1A, 1B, and 1C. This arrangement can suppress or prevent the excessive overetching in any one of the low, intermediate, and high breakdown voltage MISFET formation regions 1A, 1B, and 1C to thereby suppress or prevent the damage on the semiconductor substrate SUB in the etching back step of step S15. This embodiment can suppress or prevent the overetching of the semiconductor substrate SUB in the low, intermediate, and high breakdown voltage MISFET formation regions 1A, 1B, and 1C to thereby suppress or prevent the damage on the substrate SUB, and thus can improve the reliability of the manufactured semiconductor device.

In this embodiment, in step S14, the sidewall spacers SW1a and SW1b are removed to leave the sidewall spacer SW1c. Then, in step S15, the sidewall spacer SW1c and the insulating film IL6 are etched back. In performing etching to remove the sidewall spacers SW1a and SW1b, while leaving the sidewall spacer SW1c in step S14, the sidewall spacers SW1a and SW1b are desirably etched and removed, while suppressing the etching of the insulating film IL6 as much as possible. This arrangement can appropriately suppress or prevent the difference in thickness of the insulating film IL6 among the low, intermediate, and high breakdown voltage MISFET formation regions 1A, 1B, and 1C in the stage of removing the sidewall spacers SW1a and SW1b in step S14. Thus, upon etching back the sidewall spacer SW1c and the insulating film IL6 in step S15, in the low, intermediate, and high breakdown voltage MISFET formation regions 1A, 1B, and 1C, the respective insulating films IL6 except for those located over the sidewalls of the gate electrodes (GE1, GE2, GE3) can be removed at the same timing with more accuracy. This embodiment can accurately suppress or prevent the damage on the semiconductor substrate SUB due to the excessive overetching in any one of the low, intermediate, and high breakdown voltage MISFET formation regions 1A, 1B, and 1C in the etching back process of step S15.

As mentioned above, in performing etching to remove the sidewall spacers SW1a and SW1b and maintain the sidewall spacer SW1c in step S14, the etching of the insulating film IL6 is desirably suppressed as much as possible. From this point, the process in step S14 preferably selects etching conditions that set an etching selectivity of the sidewall spacers SW1a and SW1b (insulating film IL7) with respect to the insulating film IL6 to more than 1. The etching selectivity of 1.5 or more is more preferable.

In performing etching to remove the sidewall spacers SW1a and SW1b and to remain the sidewall spacers SW1c in step S14, wet etching is preferably used to surely remove the sidewall spacers SW1a and SW1b, while suppressing the etching of the insulating film IL6 as much as possible.

The etching back process in step S13 preferably uses the dry etching, which facilitates the formation of the sidewall spacers SW1a, SW1b, and SW1c. The etching back process in step S15 preferably uses the dry etching, which facilitates the formation of the sidewall spacers SW2a, SW2b, and SW2c.

Preferably, one of the insulating film IL6 and the insulating film IL7 is a silicon oxide film, and the other is a silicon nitride film, which can easily improve the etching selectivity of the insulating film IL7 (sidewall spacer SW1) with respect to the insulating film IL6. Thus, the process in step S14 easily removes the entire sidewall spacers SW1a and SW1b, while suppressing the etching of the insulating film IL6 as much as possible. Further, the etching of the insulating film IL6 can be suppressed or prevented in the process of step S13.

Although preferably, one of the insulating film IL6 and the insulating film IL7 is a silicon oxide film and the other is a silicon nitride film, in another embodiment, one of the insulating films IL6 and IL7 can be a silicon oxide film or a silicon nitride film, and the other can be a silicon oxynitride film. In a further embodiment, the insulating films IL6 and IL7 can be formed of silicon oxynitride films with different compositions.

When the etching rate of the sidewall spacer SW1c (insulating film IL7) is too slow in the etching back process of step S15, the insulating film IL6 over the semiconductor substrate SUB except for those located over the sidewalls of the gate electrodes GE1, GE2, and GE3 might be removed before removing the entire sidewall spacer SW1c. In this case, the etching might be continued (until the entire sidewall spacer SW1c is removed and the sidewall spacers SW2a, SW2b, and SW2c are formed) with the insulating film IL6 over the semiconductor substrate SUB removed except for over the sidewalls of the gate electrodes GE1, GE2, and GE3. This might lead to the damage of the semiconductor substrate SUB due to the overetching of the substrate.

For this reason, as shown in FIG. 21, in step S15, the etching rate of the sidewall spacer SW1c (insulating film IL7) is preferably increased to such a certain level that leaves the insulating film IL6 over the semiconductor substrate SUB in the form of layer upon completely removing the entire sidewall spacer SW1c. In other words, in step S15, the respective etching rates of the sidewall spacer SW1c and the insulating film IL6 are preferably adjusted so as to leave the insulating film IL6 over the semiconductor substrate SUB in the form of layer upon completely removing the entire sidewall spacer SW1c. This can leave the insulating film IL6 over the semiconductor substrate SUB in the form of layer upon completely removing the entire sidewall spacer SW1c in step S15 to thereby prevent the exposure of the semiconductor substrate SUB. The process in step S15 can suppress or prevent the overetching of the semiconductor substrate SUB.

That is, in step S15, upon completely removing the entire sidewall spacer SW1c, the insulating film IL6 is left over the semiconductor substrate SUB in the form of layer. Then, the etching process is continued. Thereafter, the etching is preferably stopped when the layered insulating film IL6 is preferably etched and removed (that is, in the stage where the insulating film IL6 located over the semiconductor substrate SUB except over the sidewalls of the gate electrodes GE1, GE2, and GE3 is removed). This arrangement can form the sidewall spacers SW2a, SW2b, and SW2c, while accurately suppressing or preventing the overetching of the semiconductor substrate SUB.

The excessive etching rate of the sidewall spacer SW1c (insulating film IL7) is too fast in step S15, which leads to a small difference between the thickness of the insulating film IL6 over the sidewalls of the gate electrodes GE1 and GE2, and the thickness of the insulating film IL6 over the sidewall of the gate electrode GE3 upon completely removing the entire sidewall spacers SW1c. In this case, a difference between the width T1c of the sidewall spacer SW2c and each of the widths T1a and T1b of the sidewall spacers SW2a and SW2b becomes smaller.

In the stage where the entire sidewall spacers SW1c are removed in step S15 as shown in FIG. 21, each of the thickness T2a of the insulating film IL6 over the sidewall of the gate electrode GE1, and
the thickness T2b of the insulating film IL6 over the sidewall of the gate electrode GE2 is preferably thinner than the thickness T2c of the insulating film IL6 over the sidewall of the gate electrode GE3 by 3 nm or more. That is, in the stage where the entire sidewall spacers SW1c are removed, the following relationships are preferably satisfied: T2a≤T2c−3 nm, and T2b≤T2c−3 nm. In other words, in the stage where the entire sidewall spacers SW1c are removed in step S15, the respective etching rates of the sidewall spacer SW1c and the insulating film IL6 are preferably adjusted to satisfy the following relationships: T2a≤T2c−3 nm, and T2b≤T2c−3 nm. That is, until the entire sidewall spacers SW1c are removed after starting of the etching back process in step S15, each of the insulating films IL6 located over the sidewalls of the gate electrodes GE1 and GE2 preferably has its thickness decreased by 3 nm or more due to the side etching. This arrangement can make the widths T1a and T1b of the sidewall spacers SW2a and SW2b smaller than the width T1c of the sidewall spacer SW2c, and can appropriately ensure the difference between the widths (specifically, difference between the width T1c and each of the widths T1a and T1b). FIG. 21 shows the thicknesses T2a, T2b, and T2c of the insulating films IL6 over the sidewalls of the gate electrodes GE1, GE2, and GE3.

The thickness T2a of the insulating film IL6 over the sidewall of the gate electrode GE1 corresponds to the thickness (size) of the insulating film IL6 over the sidewall of the gate electrode GE1 as measured in the direction parallel to the gate length direction of the gate electrode GE1. The measurement direction of the thickness T2a of the insulating film IL6 is the same as that of the width T1a of the sidewall spacer SW2a. The thickness T2b of the insulating film IL6 over the sidewall of the gate electrode GE2 corresponds to the thickness (size) of the insulating film IL6 over the sidewall of the gate electrode GE2 as measured in the direction parallel to the gate length direction of the gate electrode GE2. The measurement direction of the thickness T2b of the insulating film IL6 is the same as that of the width T1b of the sidewall spacer SW2b. The thickness T2c of the insulating film IL6 over the sidewall of the gate electrode GE3 corresponds to the thickness (size) of the insulating film IL6 over the sidewall of the gate electrode GE3 as measured in the direction parallel to the gate length direction of the gate electrode GE3. The measurement direction of the thickness T2c of the insulating film IL6 is the same as that of the width T1c of the sidewall spacer SW2c.

As mentioned above, in the stage where the entire sidewall spacer SW1c is removed, the relationships of T1a≤T2c−3 nm and T2b≤T2c−3 nm are satisfied, so that at the end of the step S15, each of the thickness T1a of the sidewall spacer SW2a, and the width T1b of the sidewall spacer SW2b can be smaller than the width T1c of the sidewall spacer SW2c by 3 nm or more. That is, the following relationships can be satisfied: T1a≤T1c−3 nm, and T1b≤T1c−3 nm. Thus, each of the width T1a and T1b of the sidewall spacers SW2a and SW2b can be set smaller than the width T1c of the sidewall spacer SW2c, which can accurately ensure the difference therebetween (namely, difference between the width T1c and each of the widths T1a and T1b). Even when the semiconductor devices have production tolerances, the widths T1a and T1b of the sidewall spacers SW2a and SW2b can be surely maintained to be smaller than the width T1c of the sidewall spacer SW2c (that is, T1a<T1c, and T1b<T1c).

When the thickness of the insulating film IL7 formed in step S12 is excessively great, the width (corresponding to the size in the direction parallel to the gate length direction) of the sidewall spacer SW1 formed in step S13 becomes larger, which increases the amount of etching of the sidewall spacer SW1c in step S15. In this case, variations in width (T1a, T1b, T1c) of the sidewall spacers SW2a, SW2b, and SW2c finally formed might be created. This is because as an insulating film becomes thicker, variations (fluctuations) in thickness of the insulating film tends to be generated. The large thickness of the formed insulating film IL7 leads to variations in width of the sidewall spacer SW1, which results in variations in width (T1a, T1b, T1c) of the sidewall spacers SW2a, SW2b, and SW2c finally formed. As the film to be etched becomes thicker, unevenness in etching might occur upon etching. When the thickness of the formed insulating film IL7 is excessively thick to make the width of the sidewall spacer SW1 much larger, the unevenness in etching tends to cause variations in width (T1a, T1b, T1c) of the sidewall spacers SW2a, SW2b, and SW2c finally formed.

For this reason, the formation thickness (thickness) T4 of the insulating film IL7 formed in step S12 is preferably smaller (thinner) than the formation thickness (thickness) T3 of the insulating film IL6 formed in step S11 (that is, T4<T3). Thus, variations in width (T1a, T1b, T1c) of the sidewall spacers SW2a, SW2b, and SW2c can be suppressed or prevented.

The etching back process of the sidewall spacer SW1c and the insulating film IL6 is more preferably performed on the etching conditions in which the formation thickness T4 of the insulating film IL7 is smaller than the formation thickness T3 of the insulating film IL6 (T4<T3) and the etching rate of the insulating film IL6 is larger (faster) than that of the sidewall spacer SW1c (insulating film IL7) in step S15. Thus, even when the width of the sidewall spacer SW1c becomes small because of the thin formation thickness T4 of the insulating film IL7, in step S15, the thickness of the insulating film IL6 over each sidewall of the gate electrodes GE1 and GE2 can be sufficiently reduced during the etching process of the sidewall spacers SW1c. This can increase the difference between the width T1c of the sidewall spacer SW2c formed in step S15 and each of the widths T1a and T1b of the sidewall spacers SW2a and SW2b.

In ion-implanting in the semiconductor substrate with the insulating film formed thereover, the ease of penetration of impurities differs depending on the material of the insulating film. The silicon nitride film is less likely to allow impurities for ion implantation (for example, phosphorus (P), boron (B), or arsenic (As)) to penetrate the substrate than the silicon oxide film. Thus, when the sidewall spacer formed over the sidewall of the gate electrode is formed of a lamination of a silicon nitride film and a silicon oxide film, implanted impurity ions nonuniformly penetrate the sidewall spacer in the ion implantation for forming the source and drain regions. As a result, the impurity ions might be nonuniformly implanted into regions directly under the sidewall spacers of the semiconductor substrate. This leads to nonuniform concentration of impurities in the extension region directly under the sidewall spacer, causing variations (fluctuations) in state (impurity distribution) of the extension regions between the MISFETs, which might result in variations (fluctuations) in characteristics of the MISFET.

In contrast, in this embodiment, each of the sidewall spacers SW2a, SW2b, and SW2c is formed of the insulating film IL6. That is, the sidewall spacers SW2a, SW2b, and SW2c each are formed of the single insulating film. This structure can prevent the implanted impurity ions from nonuniformly penetrating the sidewall spacers (SW2a, SW2b, SW2c) in the ion implantation for forming the source and drain regions in step S16, and can also prevent the impurity ions from being nonuniformly implanted into the region directly under the sidewall spacers (SW2a, SW2b, SW2c) of the semiconductor substrate SUB. Thus, this embodiment can suppress or prevent variations (fluctuations) in state (impurity distribution) of the extension regions between the MISFETs, and thus can also suppress and prevent variations (fluctuations) in characteristics between the MISFETs. Therefore, this embodiment can improve the performance of the semiconductor device. Further, this embodiment can also improve the reliability of the semiconductor device.

For example, when the insulating film IL6 is formed of a single silicon oxide film, the sidewall spacers SW2a, SW2b, and SW2c are formed of the silicon oxide film. In this case, upon ion-implanting for forming the source and drain regions in step S16, the implanted impurity ions can penetrate the sidewall spacers (SW2a, SW2b, SW2c) formed of the single layer to some degree. However, the ease of penetration of the ion impurities tends to be uniform because the entire sidewall spacers (SW2a, SW2b, SW2c) are formed of the single silicon oxide film. As a result, the impurity ions can be uniformly implanted into the regions directly under the sidewall spacers (SW2a, SW2b, SW2c) of the semiconductor substrate SUB in the ion implantation for forming the source and drain regions in step S16. Thus, this embodiment can more accurately suppress or prevent variations (fluctuations) in state (impurity distribution) of the extension regions between the MISFETs, and thus can also more accurately suppress or prevent variations (fluctuations) in characteristics between the MISFETs.

For example, when the insulating film IL6 is formed of a single nitride film, the sidewall spacers SW2a, SW2b, and SW2c are formed of the silicon nitride film. In this case, upon ion-implanting for forming the source and drain regions in step S16, the implanted impurity ions are less likely to penetrate the sidewall spacers (SW2a, SW2b, SW2c) each made of the single silicon nitride film. Thus, impurity ions hardly be implanted into the regions directly under the sidewall spacers (SW2a, SW2b, SW2c) of the semiconductor substrate SUB upon ion implanting for formation of the source and drain regions in step S16. Thus, this embodiment can suppress or prevent variations (fluctuations) in state (impurity distribution) of the extension regions between the MISFETs, and thus can also suppress and prevent variations (fluctuations) in characteristics between the MISFETs.

The insulating film IL6 is more preferably formed of the single silicon nitride film. In this case, upon ion-implanting for forming the source and drain regions in step S16, the impurity ions for implantation can be surely prevented from being implanted into the regions of the semiconductor substrate SUB directly under the sidewall spacers (SW2a, SW2b, SW2c). Thus, this embodiment can suppress or prevent variations (fluctuations) in state (impurity distribution) of the extension regions between the MISFETs, and thus can also suppress and prevent variations (fluctuations) in characteristics between the MISFETs.

Second Embodiment

In the above first embodiment, each of the widths T1a and T1b of the sidewall spacers SW2a and SW2b formed in the low and high breakdown voltage MISFET formation regions 1A and 1B is made smaller than the width T1c of the sidewall spacer SW2c formed in the high breakdown voltage MISFET formation region 1C (that is, T1a<T1c, and T1b<T1c). Further, the width T1a of the sidewall spacer SW2a is substantially equal to the width T1b of the sidewall spacer SW2b (T1a=T1b).

In contrast, in a second embodiment, the width T1b of the sidewall spacer SW2b formed in the intermediate breakdown voltage MISFET formation region 1B is smaller than the width T1c of the sidewall spacer SW2c formed in the high as an etching mask breakdown voltage MISFET formation region 1C (T1b<T1c). Further, the width T1a of the sidewall spacer SW2a formed in the low breakdown voltage MISFET formation region 1A is smaller than the width T1b of the sidewall spacer SW2b formed in the intermediate breakdown voltage MISFET formation region 1B (T1a<T1b).

Figure 38:
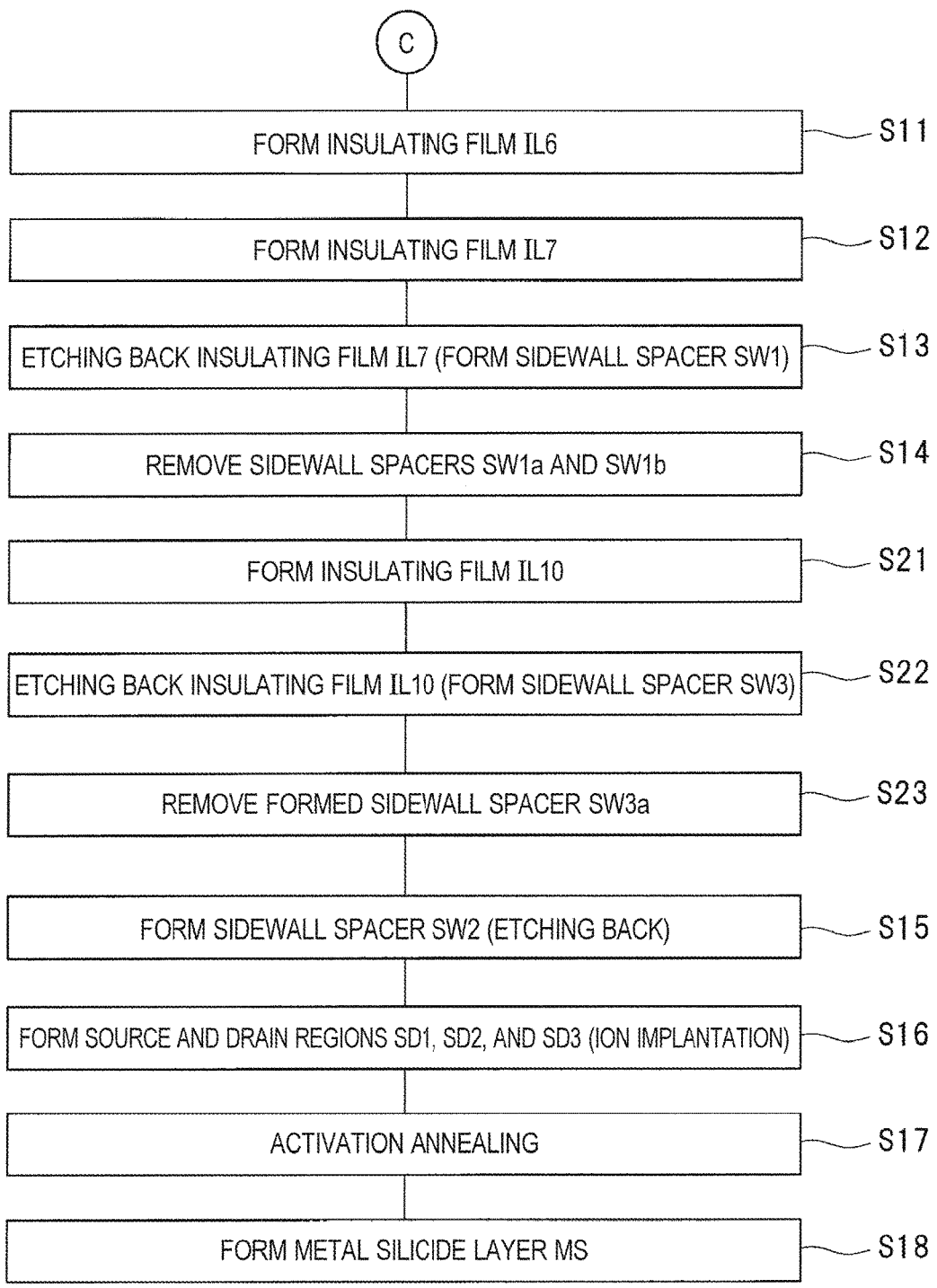
FIG. 38 is another flowchart showing manufacturing steps of the semiconductor device in another embodiment.

A manufacturing procedure of a semiconductor device in the second embodiment of the invention will be described below with reference to the accompanying drawings. FIG. 38 shows another flowchart of manufacturing steps of the semiconductor device in the second embodiment. FIGS. 39 to 45 are cross-sectional views of main parts of other manufacturing steps of the semiconductor device in the second embodiment. FIG. 38 corresponds to FIG. 2, showing the flowchart following the flowchart (steps S1 to S10) shown in FIG. 1.

The manufacturing procedure of the second embodiment differs from that of the first embodiment mainly in that steps S21, S22, and S23 shown in FIG. 38 are added after the above step S14 (removal of the sidewall spacers SW1a and SW1b) and before the above step S15 (formation of the sidewall spacer SW2 by etching back). The differences will be specifically described below.

The manufacturing procedure of the second embodiment is substantially the same as that of the first embodiment until the structure shown in FIG. 20 is obtained. Thus, the repeated description thereof will be omitted, and the steps after obtaining the structure shown in FIG. 20 will be described below.

Figure 39:
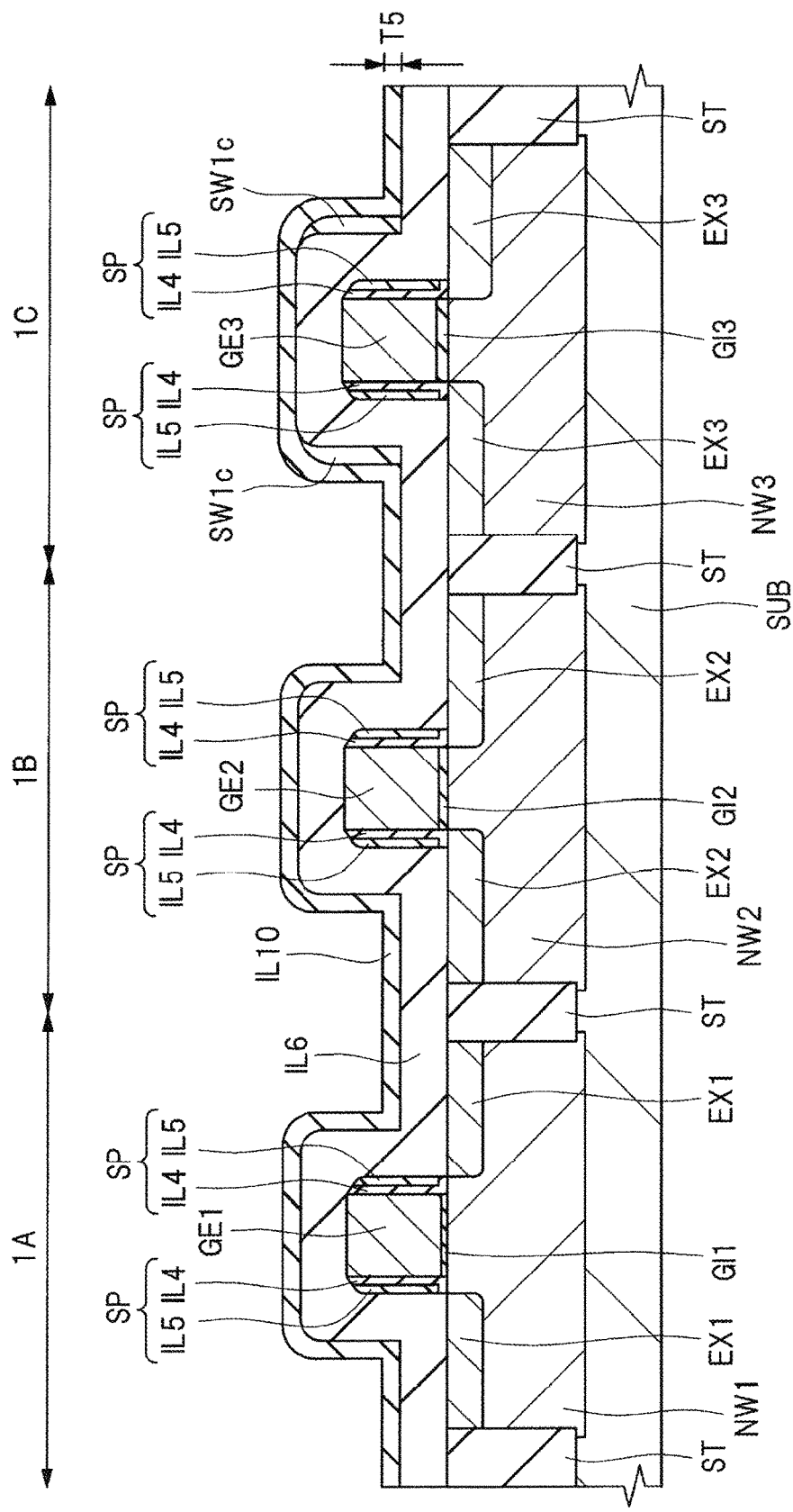
FIG. 39 is a cross-sectional view of a main part of one manufacturing step of the semiconductor device in the another embodiment.

In this embodiment, like the first embodiment, after the above step S14 is performed to obtain the structure shown in FIG. 20, as shown in FIG. 39, an insulating film IL10 is formed over the main surface of the semiconductor substrate SUB, specifically, over the insulating film IL6 to cover the sidewall spacers SW1c (in step S21 shown in FIG. 38).

The insulating film IL10 is an insulating film for controlling the width of the sidewall spacer SW2 to be formed later over the sidewalls of the gate electrodes GE1, GE2, and GE3. The insulating film IL10 is preferably a single layer of an insulating film, and made of material different from the insulating film IL6. The insulating film IL10 is preferably formed of the same material as that of the insulating film IL7. That is, when the insulating film IL7 is a silicon nitride film, the insulating film IL10 is also preferably a silicon nitride film. When the insulating film IL7 is a silicon oxide film, the insulating film IL10 is also preferably a silicon oxide film. The insulating film IL10 can be formed, for example, using the CVD method or the like. The formation thickness T5 of the insulating film IL10 formed in step S21 is preferably smaller (thinner) than the formation thickness T3 of the insulating film IL6 formed in step S11. The formation thickness T5 of the insulating film IL10 is set taking into consideration a difference between the width (T1b) of the sidewall spacer SW2b and the width (T1a) of the sidewall spacer SW2a to be formed later.

Figure 40:
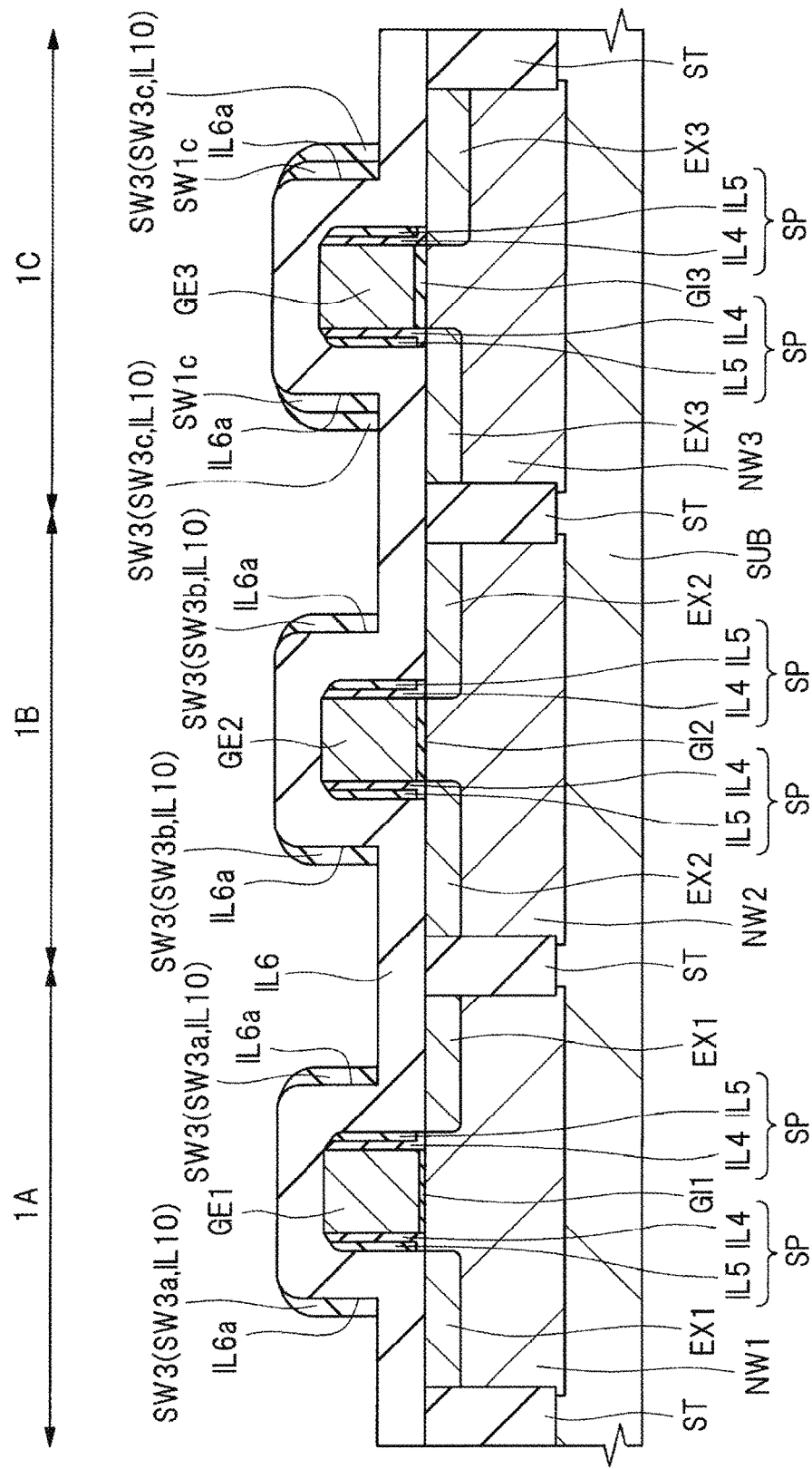
FIG. 40 is a cross-sectional view of a main part of another manufacturing step of the semiconductor device, following the step shown in FIG. 39.

Then, as shown in FIG. 40, the insulating film IL10 is subjected to etching back (etching, dry etching, anisotropic etching) by the anisotropic etching technique to thereby form sidewall spacers (sidewalls, sidewall insulating films)

SW3 as the sidewall insulating film over the side surfaces (sidewalls) IL6a of the insulating film IL6 (in step S22 shown in FIG. 38).

In step S22, a part of the insulating film IL10 located over each side surface IL6a of the insulating film IL6 is left as the sidewall spacer SW3, and the remaining part of the insulating film IL10 in the other region is removed. Thus, after the step S22, the insulating film IL10 locally remaining over each side surface IL6a of the insulating film IL6 serves as the sidewall spacer SW3, so that the insulating film IL6 except for those covered by the sidewall spacers SW3 and SW1c is exposed.

The sidewall spacer SW3 formed over the side surface IL6a of the insulating film IL6 corresponding to the sidewall of the gate electrode GE1 in the low breakdown voltage MISFET formation region 1A is hereinafter referred to as a "sidewall spacer SW3a". The sidewall spacer SW3 formed over the side surface IL6a of the insulating film IL6 corresponding to the sidewall of the gate electrode GE2 in the intermediate breakdown voltage MISFET formation region 1B is hereinafter referred to as a "sidewall spacer SW3b". The sidewall spacer SW3 formed over the side surface IL6a of the insulating film IL6 corresponding to the sidewall of the gate electrode GE3 in the high breakdown voltage MISFET formation region 1C is hereinafter referred to as a "sidewall spacer SW3c".

In the high breakdown voltage MISFET formation region 1C, the sidewall spacers SW1c remain, so that the sidewall spacers SW3c are formed over the side surfaces IL6a of the insulating films IL6 via the respective sidewall spacers SW1c. In contrast, in the low breakdown voltage MISFET formation region 1A and the intermediate breakdown voltage MISFET formation region 1B, the sidewall spacers SW1a and SW1b are removed in step S14, so that the sidewall spacers SW3a and SW3b are formed directly over the respective side surfaces IL6a of the insulating films IL6.

That is, after the process in step S22, in the high breakdown voltage MISFET formation region 1C, a lamination of the sidewall spacer SW1c and the sidewall spacer SW3c is formed over the side surface IL6a of the insulating film IL6 corresponding to each sidewall of the gate electrode GE3. In the intermediate breakdown voltage MISFET formation region 1B, the sidewall spacer SW3b is formed over the side surface IL6a of the insulating film IL6 corresponding to each sidewall of the gate electrode GE2. In the low breakdown voltage MISFET formation region 1A, the sidewall spacer SW3a is formed over the side surface IL6a of the insulating film IL6 corresponding to each sidewall of the gate electrode GE1.

The insulating film IL10 is preferably formed of the same kind of material as that of the insulating film IL7. In such a case, the sidewall spacer SW1c and the sidewall spacer SW3c are formed of the same kind of material. Thus, the sidewall spacer SW1c cannot be obviously distinguished from the sidewall spacer SW3c. The sidewall spacer including the integration of the sidewall spacer SW1c and the sidewall spacer SW3c can also be formed over the side surface IL6a of the insulating film IL6 corresponding to each sidewall of the gate electrode GE3 in the high breakdown voltage MISFET formation region 1C.

In step S22, the etching back is preferably performed under conditions (etching conditions) that make an etching rate of the insulating film IL10 larger (higher) than that of the insulating film IL6. In other words, in step S22, the etching back is preferably performed under conditions (etching conditions) that make an etching rate of the insulating film IL6 smaller (lower) than that of the insulating film IL10.

That is, in step S22, the etching back is preferably performed on the etching conditions in which the insulating film IL6 is less likely to be etched than the insulating film IL10. Thus, in step S22, the insulating film IL6 can serve as an etching stopper. In step S22, the insulating film IL6 can be suppressed or prevented from being etched.

In step S22, the etching rates of the insulating film IL6 and the insulating film IL10 need to differ from each other. Also in step S23 to be described later, the etching rate of the insulating film IL6 needs to be different from that of the insulating film IL10 (sidewall spacer SW3). Thus, the insulating film IL6 and the insulating film IL10 are formed of different materials.

Taking into consideration the etching back process of the sidewall spacers SW3b and SW3c and the sidewall spacers SW1c in step S15 to be described later, the insulating film IL7 and the insulating film IL10 are preferably formed of the same material such that the sidewall spacer SW3 and the sidewall spacer SW1c are formed of the same material. When the insulating film IL7 and the insulating film IL10 are formed of the same material, the etching conditions for the etching back process of the insulating film IL10 in step S22 can be substantially the same as those of the etching back process of the insulating film IL7 in step S13.

In step S22 and step S23 to be described later, the etching conditions are preferably adopted which can etch the insulating film IL10 and which suppresses etching of the insulating film IL6 as much as possible. Thus, the material of the insulating film IL10 is preferably selected that can have a high etching selectivity as compared to the material of the insulating film IL6. From this point, preferably, one of the insulating film IL6 and the insulating film IL10 is formed of a silicon oxide film, whereas the other of the insulating film IL6 and the insulating film IL10 is formed of a silicon nitride film.

Then, the sidewall spacers SW3 (that is, sidewall spacers SW3a) in the low breakdown voltage MISFET formation region 1A are removed, and the sidewall spacers SW3 (that is, sidewall spacers SW3b and SW3c) in the intermediate and high breakdown voltage MISFET formation regions 1B and 1C are maintained (in step S23 shown in FIG. 38).

Figure 41:
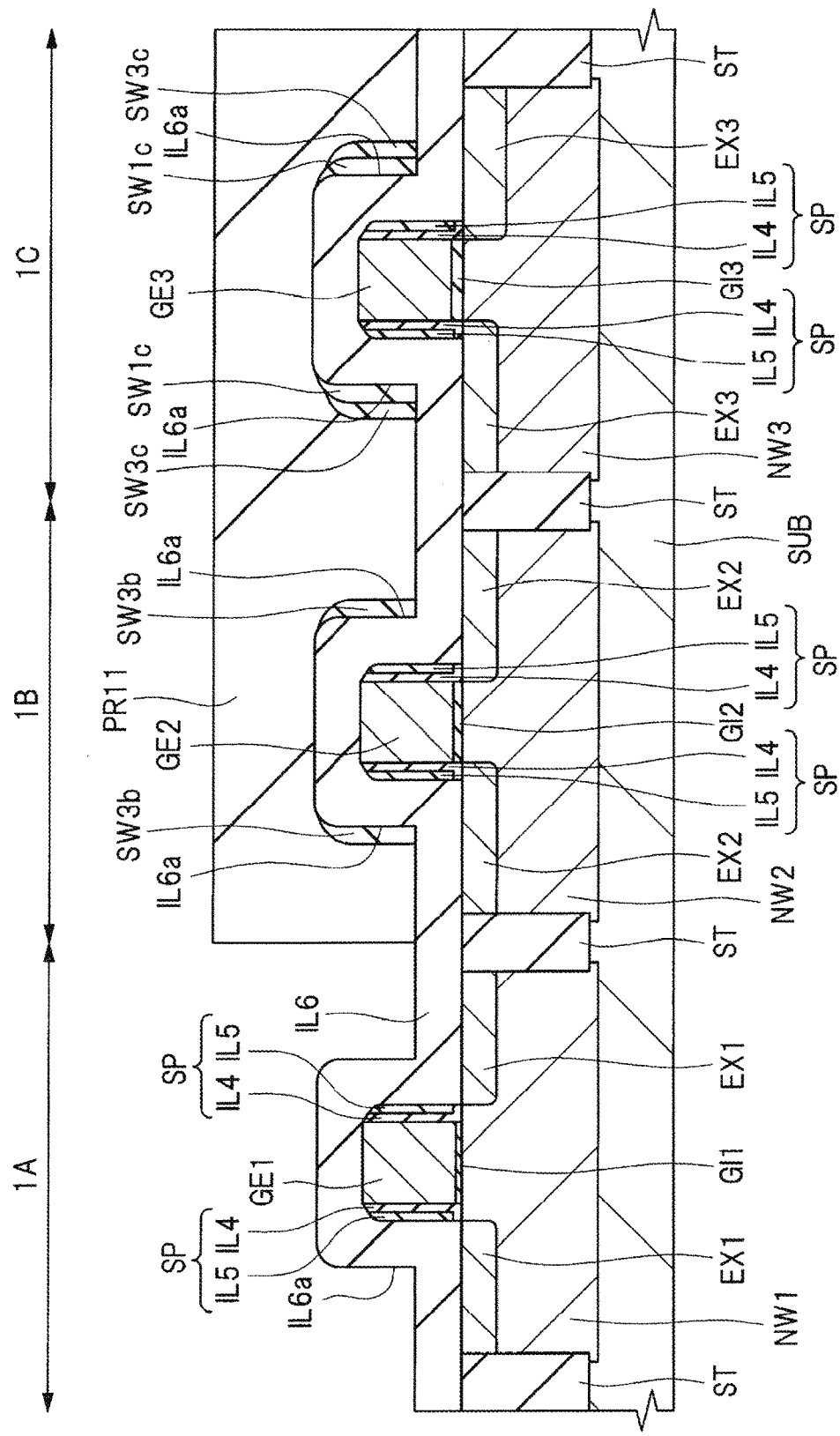
FIG. 41 is a cross-sectional view of a main part of another manufacturing step of the semiconductor device, following the step shown in FIG. 40.
Figure 42:
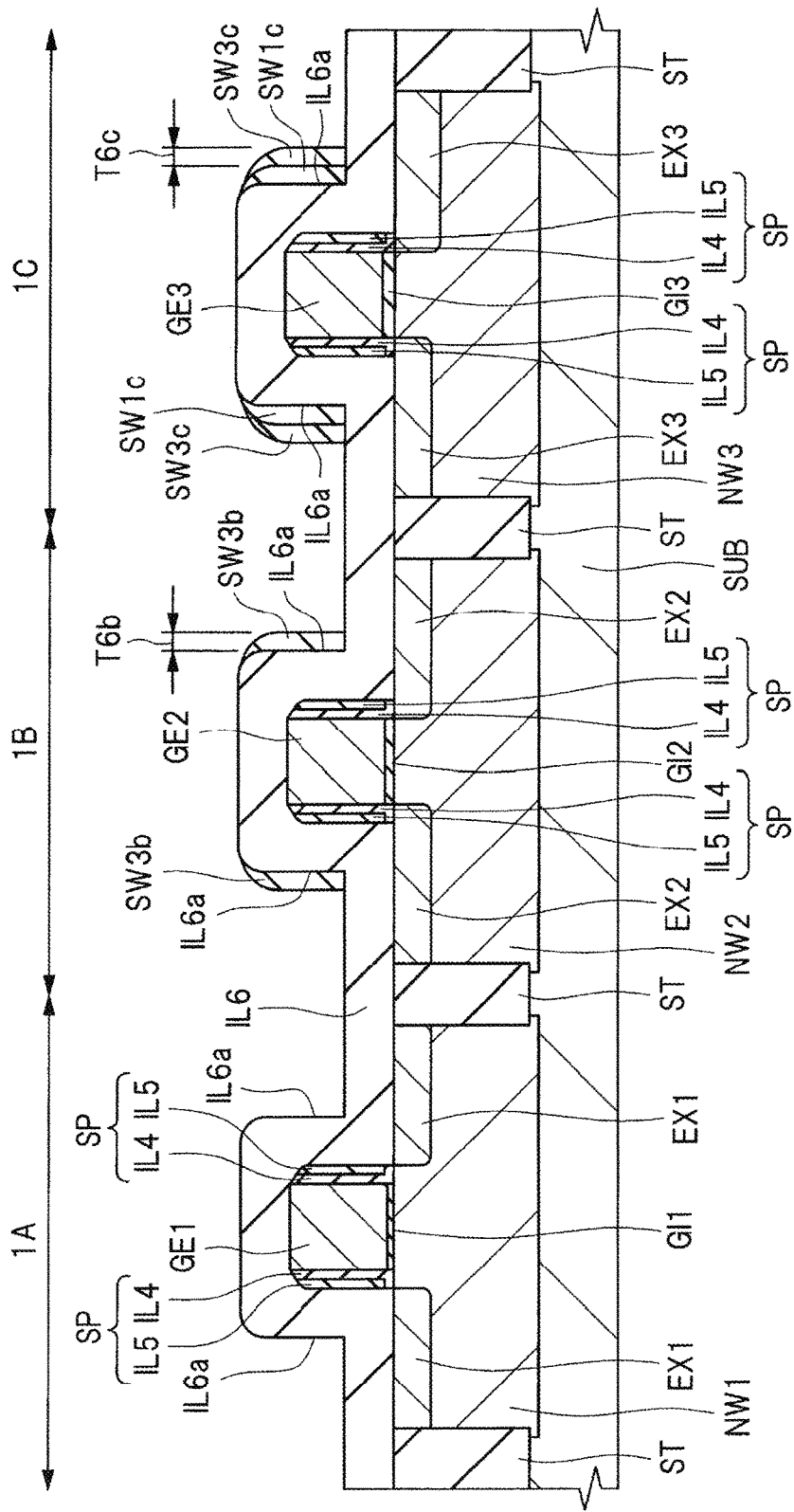
FIG. 42 is a cross-sectional view of a main part of another manufacturing step of the semiconductor device, following the step shown in FIG. 41.

The process in step S23 can be performed in the following way. That is, as shown in FIG. 41, first, a photoresist layer (mask layer) PR11 is formed over the semiconductor substrate SUB to cover the low breakdown voltage MISFET formation region 1B and the high breakdown voltage MISFET formation region 1C, and to expose the low breakdown voltage MISFET formation region 1A. Then, the sidewall spacers SW3 (that is, sidewall spacers SW3a) formed in the low breakdown voltage MISFET formation region 1A are removed by etching. Thereafter, as shown in FIG. 42, the photoresist layer PR11 is removed. In this way, the process in step S23 is performed to remove the sidewall spacers SW3a in the low breakdown voltage MISFET formation region 1A.

In the step S23, the etching is performed with the sidewall spacers SW3 (SW3a) in the low breakdown voltage MISFET formation region 1A exposed, and the sidewall spacers SW3 (SW3b, SW3c) in the intermediate and high breakdown voltage MISFET formation regions 1B and 1C not exposed (that is, covered with the photoresist layer PR11). In the etching process in step S23, the sidewall spacers SW3 (SW3a) in the low breakdown voltage MISFET formation region 1A are removed, whereas the sidewall spacers SW3

(SW3b, SW3c) in the intermediate and high breakdown voltage MISFET formation regions 1B and 1C remain without being removed.

In step S23, the etching is preferably performed under conditions (etching conditions) that make an etching rate of the sidewall spacer SW3 larger (higher) than that of the insulating film IL6. In other words, in step S23, the etching is preferably performed under conditions (etching conditions) that make an etching rate of the insulating film IL6 smaller (lower) than that of the sidewall spacer SW13. That is, in step S23, the etching is preferably performed on the etching conditions in which the insulating film IL6 is less likely to be etched than the sidewall spacer SW3. In step S23, the insulating film IL6 can be suppressed or prevented from being etched.

In step S23, the sidewall spacers SW3a are desirably removed while suppressing the etching of the insulating film IL6 as much as possible. Thus, the thickness of the insulating film IL6 in the low breakdown voltage MISFET formation region 1A can be suppressed or prevented from being reduced due to the etching in step S23. As a result, this embodiment can suppress or prevent a difference in thickness of the insulating film IL6 among the low, intermediate, and high breakdown voltage MISFET formation regions 1A, 1B, and 1C. From this point, the etching in step S23 is preferably wet etching, which can suppress the etching of the insulating film IL6 as much as possible, while appropriately removing the sidewall spacers SW3a. The application of the wet etching to the silicon oxide film and the silicon nitride film can easily achieve the high etching selectivity. More preferably, one of the insulating films IL6 and IL10 is the silicon oxide film, the other is the silicon nitride film, and the etching in step S23 is preferably the wet etching. For example, when the insulating film IL6 is the silicon nitride film, and the insulating film IL10 is the silicon oxide film, in step S23, the wet etching using hydrofluoric acid (buffered hydrofluoric acid) can be suitably used.

In step S22, anisotropic etching is necessary. Thus, dry etching is performed. Since in step S23, the sidewall spacers SW3a are removed while suppressing the etching of the exposed insulating film IL6, isotropic etching is preferable, and wet etching is more preferable.

The steps described above produce the structure shown in FIG. 42. That is, in the high breakdown voltage MISFET formation region 1C, a lamination of the sidewall spacer SW1c and the sidewall spacer SW3c is formed over the side surface IL6a of the insulating film IL6 corresponding to each sidewall of the gate electrode GE3. In the intermediate breakdown voltage MISFET formation region 1B, the sidewall spacers SW3b are formed over the side surfaces IL6a of the insulating films IL6 corresponding to the sidewalls of the gate electrode GE2. The width T6c of the sidewall spacer SW3c is substantially the same as the width T6b of the sidewall spacers SW3b (T6b=T6c). In the low breakdown voltage MISFET formation region 1A, the side surfaces IL6a of the insulating films IL6 corresponding to the sidewalls of the gate electrode GE1 are exposed (that is, with no sidewall spacer formed over the side surface IL6a).

The width T6b of the sidewall spacer SW3b corresponds to a distance (distance measured in the direction parallel to the gate length direction of the gate electrode GE2) between the side surface (side surface of the sidewall spacer SW3b) of the sidewall spacer SW3b opposed (adjacent) to the side surface IL6a of the insulating film IL6, and a side surface (side surface of the sidewall spacer SW3b) opposite to the above side surface, among the side surfaces of the sidewall spacer SW3b. The width T6c of the sidewall spacer SW3c corresponds to a distance (distance measured in the direction parallel to the gate length direction of the gate electrode GE3) between the side surface (side surface of the sidewall spacer SW3c) of the sidewall spacer SW3c opposed (adjacent) to the side surface IL6a of the insulating film IL6, and a side surface (side surface of the sidewall spacer SW3c) opposite to the above side surface, among the side surfaces of the sidewall spacer SW3c. The width of each of the sidewall spacers SW3b and SW3c can be regarded as the thickness of each of the sidewall spacers SW3b and SW3c (thickness of a part located over the sidewall IL6a of the insulating film IL6).

Figure 43:
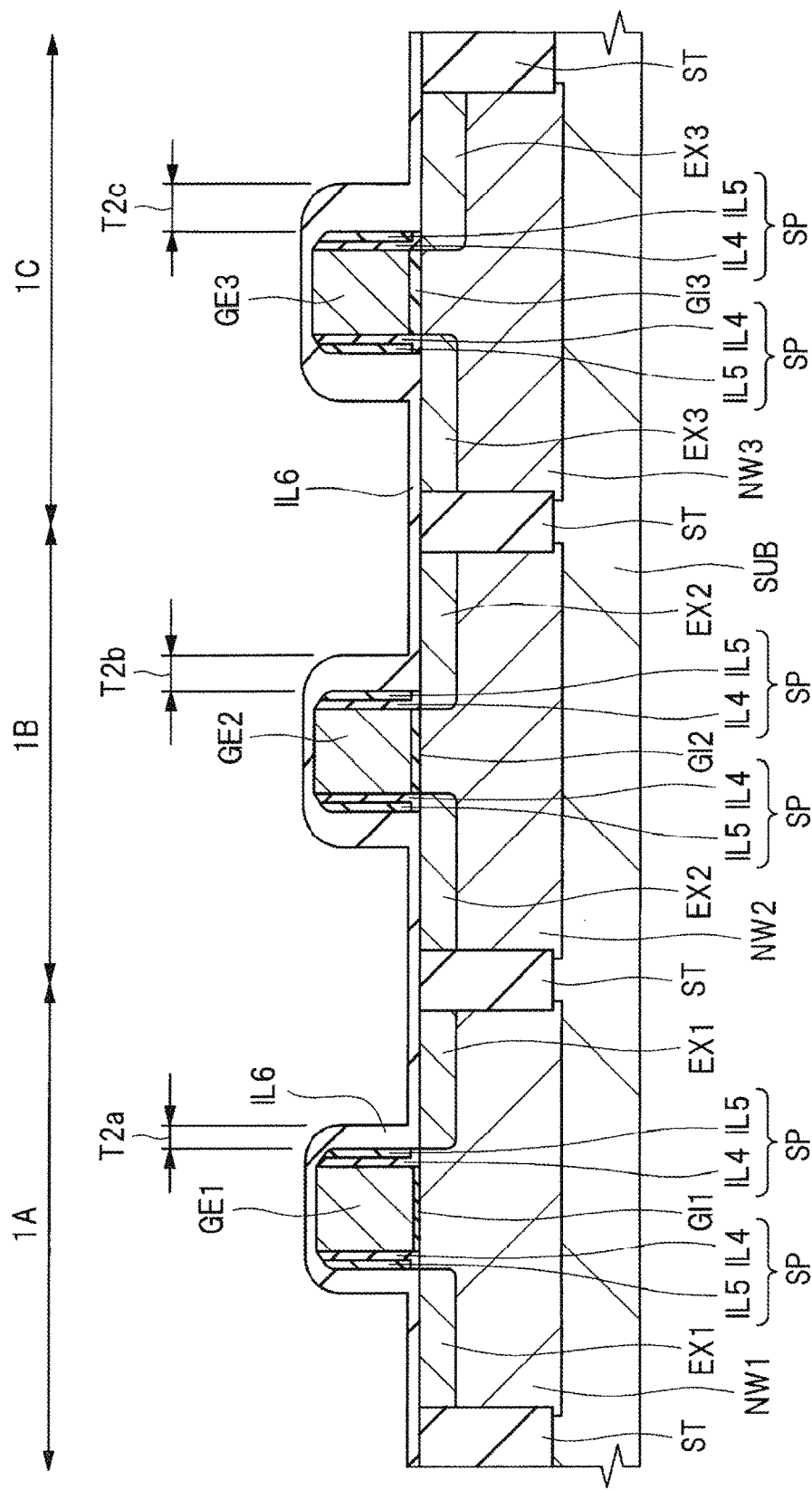
FIG. 43 is a cross-sectional view of a main part of another manufacturing step of the semiconductor device, following the step shown in FIG. 42.
Figure 44:
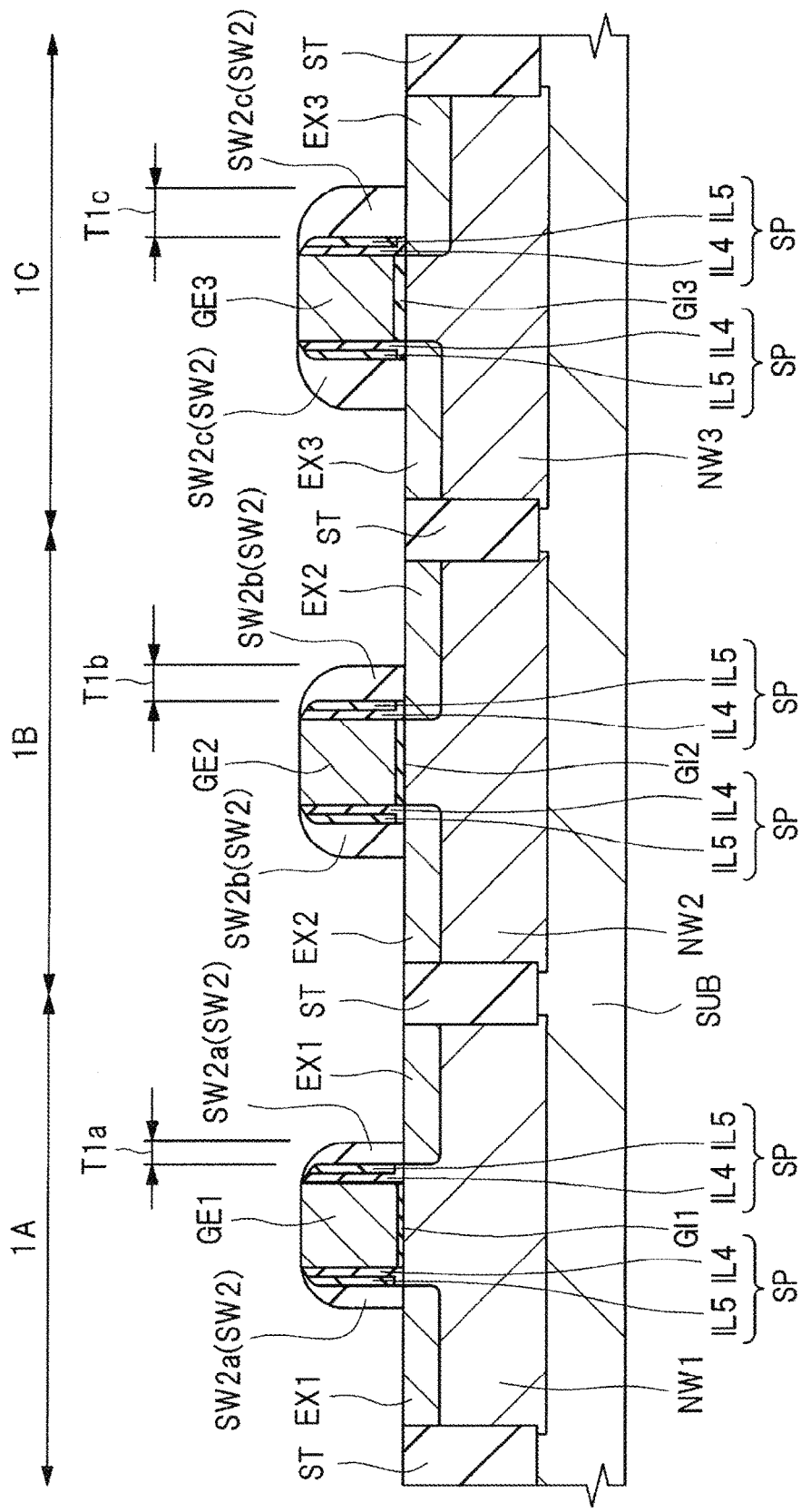
FIG. 44 is a cross-sectional view of a main part of another manufacturing step of the semiconductor device, following the step shown in FIG. 43.

The following steps are basically the same as those of the first embodiment. That is, as shown in FIGS. 43 and 44, the sidewall spacers SW3b, SW3c, and SW1c and the insulating film IL6 are subjected to etching back (etching, dry etching) to thereby form the sidewall spacer SW2 as the sidewall insulating film over each sidewall of the gate electrodes GE1, GE2, and GE3 (in step S15 shown in FIG. 38).

The etching conditions in the etching back process of step S15 are substantially the same as those of the first embodiment.

In step S15, the sidewall spacers SW3b, SW3c, and SW1c are removed, and the insulating film IL6 mains over each sidewall of the gate electrodes GE1, GE2, and GE3 to become the sidewall spacer SW2 with the insulating film IL6 in the remaining regions removed. In this way, the insulating films IL6 remaining over the sidewalls of the gate electrodes GE1, GE2, and GE3 form the sidewall spacers SW2. In step S15, the insulating films IL6 except for the parts of the insulating film IL6 remaining as the sidewall spacer SW2 over the sidewalls of the gate electrodes GE1, GE2, and GE3 are removed as a whole.

In step S15, the whole sidewall spacers SW3b, SW3c, and SW1c are preferably removed not to be left over. Thus, after the end of step S15, the sidewall spacers SW2 are formed of the insulating film IL6 remaining over the sidewalls of the gate electrodes GE1, GE2, and GE3, but the sidewall spacer SW1 is not formed (does not remain). That is, after the end of step S15, the sidewall spacer SW2 formed over each sidewall of the gate electrodes GE1, GE2, and GE3 is formed not of both the insulating film IL6 and remaining parts of the sidewall spacers SW1 and SW3, but of the single layer of the insulating film IL6.

FIG. 43 corresponds to FIG. 21 described above, and shows the halfway stage of the etching process in step S15. Specifically, FIG. 43 shows the stage directly after removal of the entire sidewall spacers SW3b, SW3c, and SW1c during the etching process in step S15. FIG. 44 corresponds to FIG. 21 described above, and shows the stage directly after the end of the etching process in step S15 continued after the stage of FIG. 43.

In the etching process of step S15, in the stage where the entire sidewall spacers SW3b, SW3c, and SW1c are removed, the insulating film IL6 preferably remains over the semiconductor substrate SUB in the form of layer as shown in FIG. 43. The reason for this is the same as that in the first embodiment. After removing the entire sidewall spacers SW3b, SW3c, and SW1c in the etching process of step S15, etching is preferably continued not to leave the insulating film IL6 in the form of layer over the semiconductor substrate SUB. That is, the insulating films IL6 except for the parts thereof serving as the sidewall spacers SW2 are removed.

When the offset spacers SP are formed over the sidewalls of the gate electrodes GE1, GE2, and GE3, the sidewall spacer SW2 is formed over each sidewall of the gate electrodes GE1, GE2, and GE3 via the offset spacer SP.

In the second embodiment, the width T1$c$ of the sidewall spacer SW2$c$ formed over the sidewall of the gate electrode GE3 is larger than the width T1$b$ of the sidewall spacer SW2$b$ formed over the sidewall of the gate electrode GE2 (T1$c$>T1$b$). The width T1$b$ of the sidewall spacer SW2$b$ formed over the sidewall of the gate electrode GE2 is larger than the width T1$a$ of the sidewall spacer SW2$a$ formed over the sidewall of the gate electrode GE1 (T1$b$>T1$a$). In other words, the width T1$a$ of the sidewall spacer SW2$a$ is smaller than the width T1$b$ of the sidewall spacer SW2$b$ (T1$a$<T1$b$), and the width T1$b$ of the sidewall spacer SW2$b$ is smaller than the width T1$c$ of the sidewall spacer SW2$c$ (that is, T1$b$<T1$c$).

As mentioned above, in the first embodiment, the width T1$a$ of the sidewall spacer SW2$a$ is substantially the same as the width T1$b$ of the sidewall spacer SW2$b$ (T1$a$=T1$b$). In the second embodiment, the width T1$a$ of the sidewall spacer SW2$a$ is smaller than the width T1$b$ of the sidewall spacer SW2$b$ (T1$a$<T1$b$).

In the second embodiment, the widths T1$a$, T1$b$, and T1$c$ of the sidewall spacers SW2$a$, SW2$b$, and SW2$c$ have the following relationship of T1$a$<T1$b$<T1$c$. The reason for this will be described below.

In the etching process of step S15, not only the anisotropic etching, but also side etching is also performed. Since in the high breakdown voltage MISFET formation region 1C, the sidewall spacers SW3$c$ and SW1$c$ are formed over the side surfaces IL6$a$ of the insulating films IL6. Until the entire sidewall spacers SW3$c$ and SW1$c$ are removed, the side surface IL6$a$ of the insulating film IL6 is not subjected to the side etching. That is, in the high breakdown voltage MISFET formation region 1C, only after the removal of the sidewall spacers SW3$c$ and SW1$c$ and exposure of the side surface IL6$a$ of the insulating film IL6, the side surface IL6$a$ of the insulating film IL6 is subjected to side etching during the entire etching time in step S15.

In the intermediate breakdown voltage MISFET formation region 1B, the sidewall spacer SW3$b$ is formed over each side surface IL6$a$ of the insulating film IL6. Until the entire sidewall spacer SW3$b$ is removed, the side surface IL6$a$ of the insulating film IL is not subjected to the side etching. That is, in the intermediate breakdown voltage MISFET formation region 1B, only after the removal of the sidewall spacer SW3$b$ and exposure of the side surface IL6$a$ of the insulating film IL6,
the side surface IL6$a$ of the insulating film IL6 is subjected to the side etching in the whole etching time in step S15.

The width T6$b$ of the sidewall spacer SW3$b$ is substantially the same as the width T6$c$ of the sidewall spacer SW3$c$. Thus, the sum of the widths of the sidewall spacer SW3$c$ and sidewall spacer SW1$c$ (thickness over the side surface IL6$a$) is more than the width of the sidewall spacer SW3$b$ (thickness over the side surface IL6$a$) by the sidewall spacer SW1$c$. The time required to remove the sidewall spacers SW3$c$ and SW1$c$ in the high breakdown voltage MISFET formation region 1C to expose the side surface IL6$a$ of the insulating film IL6 is longer than that required to remove the sidewall spacer SW3$b$ in the intermediate breakdown voltage MISFET formation region 1B and to expose the side surface IL6$a$ of the insulating film IL6 by the time required for etching the sidewall spacer SW1$c$.

In contrast, in the low breakdown voltage MISFET formation region 1A, the etching in step S15 is started without the sidewall spacers formed over the side surfaces IL6$a$ of the insulating film IL6 (with the sidewall spacer SW3$a$ already removed). Thus, in the low breakdown voltage MISFET formation region 1A, the side surfaces IL6$a$ of the insulating films IL6 are subjected to side etching during the whole time of the etching in step S15.

The time during which the side surface IL6$a$ of the insulating film IL6 is subjected to side etching in the intermediate breakdown voltage MISFET formation region 1B becomes longer than that in the high breakdown voltage MISFET formation region 1C. The time during which the side surface IL6$a$ of the insulating film IL6 is subjected to side etching in the low breakdown voltage MISFET formation region 1A becomes longer than that in the intermediate breakdown voltage MISFET formation region 1B. When the side surface IL6$a$ of the insulating film IL6 is subjected to side etching, the longer the side etching time, the larger the amount of side etching (thickness of the side-etched part) becomes, which decreases the thickness of the insulating film IL6 over the sidewall of the gate electrode.

As a result, in the stage after the end of the etching in step S15, the thickness of the insulating film IL6 remaining over the sidewalls of the gate electrode GE2 in the intermediate breakdown voltage MISFET formation region 1B becomes smaller (thinner) than that of the insulating film IL6 remaining over the sidewalls of the gate electrode GE3 in the high breakdown voltage MISFET formation region 1C. Then, in the stage after the end of the etching in step S15, the thickness of the insulating film IL6 remaining over the sidewall of the gate electrode GE1 in the low breakdown voltage MISFET formation region 1A becomes smaller (thinner) than that of the insulating film IL6 remaining over the sidewall of the gate electrode GE2 in the intermediate breakdown voltage MISFET formation region 1B. Further, the width T1$b$ of the sidewall spacer SW2$b$ is smaller than the width T1$c$ of the sidewall spacer SW2$c$, and the width T1$a$ of the sidewall spacer SW2$a$ is smaller than the width T1$b$ of the sidewall spacer SW2$c$ (T1$a$<T1$b$<T1$c$).

As mentioned above, in the second embodiment, in the high breakdown voltage MISFET formation region 1C, the sidewall spacers SW3$c$ and SW1$c$ are left over the sidewalls IL6$a$ of the insulating films IL6.
In the intermediate breakdown voltage MISFET formation region 1B, the sidewall spacer SW3$b$ is left over each sidewall IL6$a$ of the insulating film IL6. In the low breakdown voltage MISFET formation regions 1A, the etching back process in step S15 is performed with the side surface IL6$a$ of the insulating film IL6 exposed. In the high breakdown voltage MISFET formation region 1C, the sidewall spacer SW3$c$ and the sidewall spacer SW1$c$ can serve as a prevention film of side etching of the insulating film IL6. The side etching time of the insulating film IL6 in the high breakdown voltage MISFET formation region 1C can be shortened to decrease the amount of side etching of the insulating film IL6 as compared to in the low and intermediate breakdown voltage MISFET formation regions 1A and 1B. In the intermediate breakdown voltage MISFET formation region 1B, the sidewall spacer SW3$b$ can serve as a prevention film of side etching of the insulating film IL6. The side etching time of the insulating film IL6 in the intermediate breakdown voltage MISFET formation region 1B can be shortened to decrease the amount of side etching of the insulating film IL6 as compared to in the low breakdown voltage MISFET formation region 1A. Due to such a difference in amount of the side etching of the insulating film IL6 between the MISFET formation regions, the thickness of the insulating film IL6 over the sidewall of the gate electrode is thinned in the high, intermediate, and low breakdown voltage MISFET formation regions 1C, 1B, and 1A in that order, so that the widths T1a, T1b, and T1c of the sidewall spacers SW2a, SW2b, and SW2c can have the relationship of T1a<T1b<T1c.

In this way, the sidewall spacers SW2 (SW2a, SW2b, SW2c) are formed.

Figure 45:
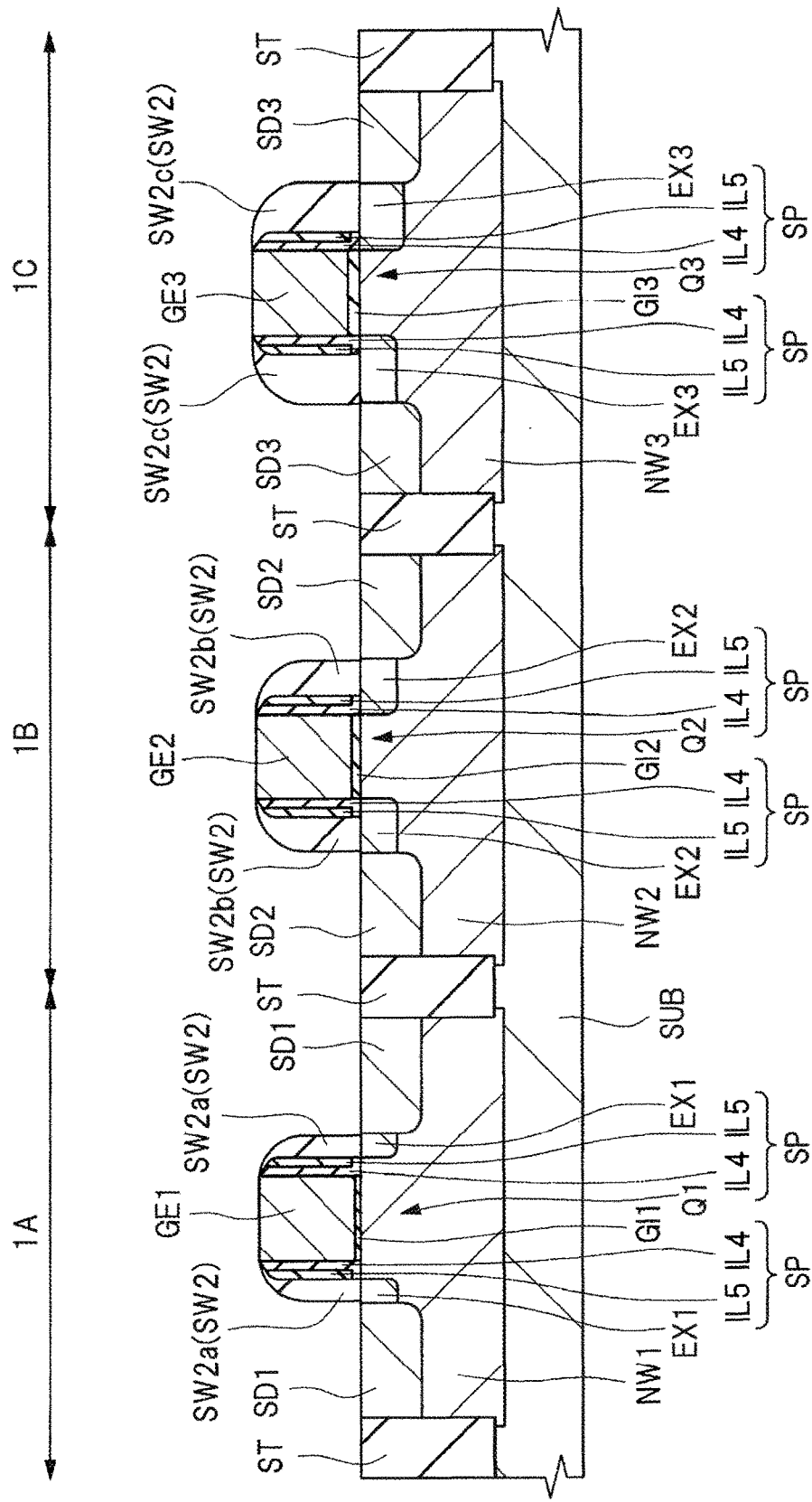
FIG. 45 is a cross-sectional view of a main part of another manufacturing step of the semiconductor device, following the step shown in FIG. 44.

Then, as shown in FIG. 45, the source and drain regions SD1, SD2, and SD3 which are n$^+$-type semiconductor regions (n-type impurity diffusion layer) are formed (in step S16 shown in FIG. 38). The process in step S16 is the same as that in the first embodiment, and the repeated description thereof will be omitted below.

The annealing process (heat treatment) is performed to activate the process in step S17. The metal silicide layer MS is formed in a silicide process in step S18. Then, the above insulating film IL8, the contact holes CT, the plugs PG, the insulating film IL9, and the wirings M1 can be formed in the same way as the first embodiment. The illustration and description thereof will be omitted.

In the way described above, the semiconductor device of the second embodiment is manufactured.

In the first embodiment, the width T1a of the sidewall spacer SW2a formed over the sidewall of the gate electrode GE1 and the width T1b of the sidewall spacer SW2b formed over the sidewall of the gate electrode GE2 are smaller than the width T1c of the sidewall spacer SW2c formed over the sidewall of the gate electrode GE3. The width T1a of the sidewall spacer SW2a formed over the sidewall of the gate electrode GE1 is substantially the same as the width T1b of the sidewall spacer SW2b formed over the sidewall of the gate electrode GE2. That is, T1a=T1b<T1c In contrast, in the second embodiment, the width T1a of the sidewall spacer SW2a formed over the sidewall of the gate electrode GE1 is smaller than the width T1b of the sidewall spacer SW2b formed over the sidewall of the gate electrode GE2. The width T1b of the sidewall spacer SW2b is smaller than the width T1c of the sidewall spacer SW2c formed over the sidewall of the gate electrode GE3. That is, T1a<T1b<T1c.

Reflecting the relationship of T1a<T1b<T1c, the distance (distance in parallel to the gate length direction) between the source/drain region SD1 and the channel formation region in the MISFETQ1 can be smaller than the distance (distance in the direction parallel to the gate length direction) between the source/drain region SD2 and the channel formation region in the MISFETQ2. The distance (distance in parallel to the gate length direction) between the source/drain region SD2 and the channel formation region in the MISFETQ2 can be smaller than the distance (distance in the direction parallel to the gate length direction) between the source/drain region SD3 and the channel formation region in the MISFETQ3.

Thus, the size (specifically, the size in the gate length direction) of the extension region EX1 having a low impurity concentration and extending between the source/drain region SD1 and the channel formation region in the MISFETQ1 can be smaller than that (specifically, the distance in the gate length direction) of the extension region EX2 having a low impurity concentration and extending between the source/drain region SD2 and the channel formation region in the MISFETQ2. Thus, the size (specifically, the size in the gate length direction) of the extension region EX2 having a low impurity concentration and extending between the source/drain region SD2 and the channel formation region in the MISFETQ2 can be smaller than that (specifically, the distance in the gate length direction) of the extension region EX3 having a low impurity concentration and extending between the source/drain region SD3 and the channel formation region in the MISFETQ3.

Thus, in the MISFETQ3, the distance between the source/drain region SD3 and the channel formation region can be increased as compared to the MISFETQ1 and Q2 to improve the breakdown voltage of the MISFETQ3. In contrast, in the MISFETQ1, the distance between the source/drain region SD1 and the channel formation region can be decreased as compared to those in the MISFETQ2 and Q3 to improve the current driving force of the MISFETQ1. In the MISFETQ2, the distance between the source/drain region SD2 and the channel formation region can be increased as compared to the MISFETQ1 to improve the breakdown voltage of the MISFETQ2. In contrast, in the MISFETQ2, the distance between the source/drain region SD2 and the channel formation region can be decreased as compared to those in the MISFETQ3 to improve the current driving force of the MISFETQ2. This embodiment can improve the total performance of the semiconductor device.

In other points, the second embodiment can also obtain substantially the same effects as those of the first embodiment.

In the second embodiment, in step S12, the insulating film IL7 is formed, and then in step S13, the insulating film IL7 is etched back to thereby form the sidewall spacers SW1a, SW1b, and SW1c. In step S21, the insulating film IL10 is formed, and then in step S22, the insulating film IL10 is etched back to thereby form the sidewall spacers SW3a, SW3b, and SW3c. Thus, in steps S13 and S22, the amount of overetching of the insulating film IL6 is substantially the same among the low, intermediate, and high breakdown voltage MISFET formation regions 1A, 1B, and 1C. Thus, directly before the process in step S15, the thickness of the insulating film IL6 is substantially the same among the low, intermediate, and high breakdown voltage MISFET formation regions 1A, 1B, and 1C. The timings of removing the insulating films IL6 except for those located over the sidewalls of the gate electrodes GE1, GE2, and GE3 in step S15 can be substantially identical to each other. Thus, the etching back process in step S15 can suppress or prevent the excessive overetching in either the low, intermediate, or high breakdown voltage MISFET formation regions 1A, 1B, or 1C to suppress or prevent the damage on the semiconductor substrate SUB. This embodiment can suppress or prevent the overetching of the semiconductor substrate SUB in either the low, intermediate, or high breakdown voltage MISFET formation regions 1A, 1B, or 1C to thereby suppress or prevent the damage on the semiconductor substrate SUB, improving the reliability of the semiconductor device manufactured.

In the second embodiment, in step S14, the sidewall spacers SW1a and SW1b are removed to leave the sidewall spacers SW1c. Then, in step S23, the sidewall spacers SW3a are removed to leave the sidewall spacers SW3b and SW3c. Then, in step S15, the sidewall spacers SW1c and the insulating films IL6 are etched back. Desirably, in the steps S14 and S23, the sidewall spacers SW1a and SW1b (in step S14), or the sidewall spacer SW3a (in step S23) may be etched and removed, while suppressing the etching of the insulating film IL6 as much as possible. This arrangement can more appropriately suppress or prevent the difference in thickness of the insulating film IL6 among the low, intermediate, and high breakdown voltage formation regions 1A, 1B, and 1C directly before the process in step S15. From this point, in step S14, the etching conditions that sets an etching selectivity of the sidewall spacers SW1a and SW1b (insulating film IL7) with respect to the insulating film IL6 to more than 1 should be preferably selected. The etching selectivity is more preferably 1.5 or more. In step S23, the etching conditions that sets an etching selectivity of the sidewall spacers SW3a (insulating film IL10) with respect to the insulating film IL6 to more than 1 should be preferably selected. The etching selectivity is more preferably 1.5 or more.

Also in the second embodiment, like the first embodiment, as shown in FIG. 43, in the stage where the entire sidewall spacers SW3b, SW3c, and SW1c are removed, the insulating film IL6 preferably remain over the semiconductor substrate SUB in the form of layer. This arrangement can surely suppress or prevent the overetching of the semiconductor substrate SUB in step S15.

Further, in the second embodiment, as shown in FIG. 43, in step S15, in the stage where the entire sidewall spacers SW3b, SW3c, and SW1c are removed, the thickness T2a of the insulating film IL6 over the sidewall of the gate electrode GE1 is preferably thinner than the thickness T2b of the insulating film IL6 over the sidewall of the gate electrode GE2 by 3 nm or more. The thickness T2b of the insulating film IL6 over the sidewall of the gate electrode GE2 is preferably thinner than the thickness T2c of the insulating film IL6 over the sidewall of the gate electrode GE3 by 3 nm or more. That is, in the stage where the entire sidewall spacers SW3b, SW3c, and SW1c are removed, the flowing relationships are preferably satisfied: T2a≤T2c−3 nm, and T2b≤T2c−3 nm. Thus, the thicknesses T1c, T1b, and T1a of the sidewall spacers SW2a, SW2b, and SW2c become smaller in that order, which can accurately ensure the difference (between the widths T1c and T1b, and the widths T1b and T1a).

In the stage where the entire sidewall spacers SW3b, SW3c, and SW1c are removed, the relationships of T1a≤T2c−3 nm and T2b≤T2c−3 nm are satisfied, so that at the end of the process in step S15, the following relationships can be satisfied about the widths T1a, T1b, and T1c of the sidewall spacers SW2a, SW2b, and SW2c: T1a≤T1b−3 nm, and T1b≤T1c−3 nm. In other words, the width T1a of the sidewall spacer SW2a is smaller than the width T1b of the sidewall spacer SW2b by 3 nm or more, and the width T1b of the sidewall spacer SW2b is smaller than the width T1c of the sidewall spacer SW2c by 3 nm or more. Thus, the widths T1c, T1b, and T1a of the sidewall spacers SW2a, SW2b, and SW2c become smaller in that order, which can accurately ensure the difference (between the widths T1c and T1b, and the widths T1b and T1a). Even under the production tolerances, this embodiment can surely maintain the relationship that the widths T1c, T1b, and T1a of the sidewall spacers SW2a, SW2b, and SW2c become smaller in that order (T1a<T1b<T1c).

The formation thickness (thickness) T4 of the insulating film IL7 formed in step S12 is preferably smaller (thinner) than the formation thickness T3 of the insulating film IL6 formed in step S11 (that is, T4<T3). Likewise, the formation thickness T5 of the insulating film IL10 formed in step S21 is preferably smaller (thinner) than the formation thickness (thickness) T3 of the insulating film IL6 formed in step S11 (that is, T5<T3). Thus, as mentioned in the first embodiment, this embodiment can suppress or prevent variations in width (T1a, T1b, T1c) of the sidewall spacers SW2a, SW2b, and SW2c.

The etching back process is preferably performed in step S15 on the etching conditions in which the formation thicknesses T4 and T5 of the insulating films IL7 and IL10 are smaller than the formation thickness T3 of the insulating film IL6 and the etching rate of the insulating film IL6 is larger (faster) than that of the sidewall spacers SW3b, SW3c, and SW1c (insulating films IL7, IL10). Thus, even when the width of each of the sidewall spacers SW3b, SW3c, and SW1c becomes small because of the thin formation thicknesses T4 and T5 of the insulating films IL7 and IL10, in step S15, the thickness of the insulating film IL6 over each sidewall of the gate electrodes GE1 and GE2 can be sufficiently reduced during the etching of the sidewall spacers SW3b, SW3c, and SW1c. This arrangement can increase a difference between the width T1c of the sidewall spacer SW2c and the width T1b of the sidewall spacer SW2b, which spacers are formed in step S15, and can also increase a difference between the width T1b of the sidewall spacer SW2b and the width T1a of the sidewall spacer SW2a.

The invention made by the inventors has been specifically described above based on the preferred embodiments, and the invention is not limited to the above embodiments. It is apparent that various modifications and changes can be made to those embodiments without departing the scope of the invention.

For example, in the first and second embodiments, the MISFETQ1 is formed in the low breakdown voltage MISFET formation region 1A, the MISFETQ2 is formed in the intermediate breakdown voltage MISFET formation region 1B, and the MISFETQ3 is formed in the high breakdown voltage MISFET formation region 1C. In the first embodiment, however, either the low breakdown voltage MISFET formation region (MISFETQ1) or the intermediate breakdown voltage MISFET formation region (MISFETQ2) can be omitted. In the second embodiment, any one of the low breakdown voltage MISFET formation region 1A (MISFETQ1), the intermediate breakdown voltage MISFET formation region 1B (MISFETQ2), and the high breakdown voltage MISFET formation region 1C (MISFETQ3) can be omitted.

For example, in the first and second embodiments, the width of the sidewall spacer SW2 formed over the sidewall of the gate electrode is set to vary depending on the MISFET having a different breakdown voltage. In order to vary the width of the sidewall spacer formed over the sidewall of the gate electrode in each of the MISFETs having the same breakdown voltage, the methods of the first or second embodiment can be employed.

Although in the first and second embodiments, the MISFETQ1, Q2, and Q3 are the p-channel MISFET, the conduction type of each of the MISFETQ1, Q2, and Q3 can be reversed to form the n-channel MISFET. The MISFETQ1, Q2, and Q3 can be of a mixture of n-channel and p-channel types. Both the p-channel MISFET and the n-channel MISFET can be formed.

What is claimed is:
1. A manufacturing method of a semiconductor device, comprising the steps of:
(a) providing a semiconductor substrate;
(b) forming a first gate electrode via a first gate insulating film and a second gate electrode via a second gate insulating film over the semiconductor substrate;
(c) forming a first insulating film over the semiconductor substrate to cover the first gate electrode and the second gate electrode, the first insulating film having first portions on upper surfaces of the first and second gate electrodes and second portions on side surfaces of the first and second gate electrodes;
(d) forming a first sidewall insulating film selectively formed on the second portions at the side surfaces of the second gate electrode;

(e) forming a second insulating film over the first insulating film and the first sidewall insulating film; and (f) after the step (e), etching back the second insulating film, the first sidewall insulating film and the first insulating film to thereby form a second sidewall insulating film having a first width comprising the first insulating film, over the side surface of the first gate electrode and a third sidewall insulating film having a second width comprising the first insulating film, over the side surface of the second gate electrode, wherein the first width is smaller than the second width.

2. The manufacturing method of a semiconductor device according to claim 1, wherein in the step (f), the etching back is performed not to leave the first sidewall insulating film and the second insulating film.

3. The manufacturing method of a semiconductor device according to claim 1, wherein in the step (f), the second insulating film, the first sidewall insulating film and the first insulating film are etched back simultaneously by dry etching.

4. The manufacturing method of a semiconductor device according to claim 1, wherein the first insulating film comprises silicon nitride, and wherein the first sidewall insulating film and the second insulating film comprise silicon oxide.

5. The manufacturing method of a semiconductor device according to claim 1, wherein one of the first sidewall insulating film and the second insulating film comprises silicon oxide, and the other comprises silicon nitride.

6. The manufacturing method of a semiconductor device according to claim 1, wherein the first sidewall insulating film and the second insulating film comprise silicon nitride.

7. The manufacturing method of a semiconductor device according to claim 1, wherein the first width is smaller than the second width by 3 nm or more.

8. The manufacturing method of a semiconductor device according to claim 1, further comprising a step of:

(g) after the step (f), forming a first semiconductor region for a source/drain of a first MISFET with the first gate electrode by ion implantation into the semiconductor substrate using the first gate electrode and the second sidewall insulating film as a mask, and forming a second semiconductor region for a source/drain of a second MISFET with the second gate electrode by ion implantation into the semiconductor substrate using the second gate electrode and the third sidewall insulating film as another mask.

9. The manufacturing method of a semiconductor device according to claim 8, further comprising a step of:

(b1) after the step (b) and before the step (c), forming a third semiconductor region in the semiconductor substrate by ion implantation into the semiconductor substrate using the first gate electrode as a mask, and forming a fourth semiconductor region by ion implantation into the semiconductor substrate using the second gate electrode as another mask, wherein the first semiconductor region and the third semiconductor region have a same conduction type, and the first semiconductor region has a higher impurity concentration than that of the third semiconductor region, and wherein the second semiconductor region and the fourth semiconductor region have a same conduction type, and the second semiconductor region has a higher impurity concentration than that of the fourth semiconductor region.

10. The manufacturing method of a semiconductor device according to claim 1, wherein the second gate insulating film is thicker than the first gate insulating film.

11. The manufacturing method of a semiconductor device according to claim 1, wherein the first width of the second sidewall insulating film corresponds to a size of the second sidewall insulating film at a lower part of the side surface of the first gate electrode in a direction parallel to a gate length direction of the first gate electrode, and wherein the second width of the third sidewall insulating film corresponds to a size of the third sidewall insulating film at a lower part of the side surface of the second gate electrode in a direction parallel to a gate length direction of the second gate electrode.

* * * * *